United States Patent
Hashizume

(10) Patent No.: US 9,831,162 B2
(45) Date of Patent: Nov. 28, 2017

(54) SEMICONDUCTOR DEVICE COMPRISING A SEMICONDUCTOR CHIP MOUNTED OVER A METAL PLATE HAVING AN INCLINED SURFACE

(71) Applicant: Renesas Electronics Corporation, Koutou-ku, Tokyo (JP)

(72) Inventor: Shoji Hashizume, Gunma (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/331,902

(22) Filed: Oct. 23, 2016

(65) Prior Publication Data
US 2017/0179011 A1 Jun. 22, 2017

(30) Foreign Application Priority Data
Dec. 21, 2015 (JP) .................................. 2015-248767

(51) Int. Cl.
*H01L 23/495* (2006.01)
*H01L 23/498* (2006.01)
*H01L 21/48* (2006.01)
*H01L 21/56* (2006.01)

(52) U.S. Cl.
CPC .... *H01L 23/49582* (2013.01); *H01L 21/4842* (2013.01); *H01L 21/565* (2013.01); *H01L 23/49548* (2013.01); *H01L 23/49555* (2013.01); *H01L 23/49805* (2013.01)

(58) Field of Classification Search
CPC ............. H01L 23/49805; H01L 21/565; H01L 23/49548; H01L 21/4842; H01L 23/49555; H01L 23/49582; H01L 33/52; H01L 33/56; H01L 2933/005; H01L 21/4846;
(Continued)

(56) References Cited

U.S. PATENT DOCUMENTS 7,410,834 B2 * 8/2008 Fukaya ................. H01L 21/565
257/E21.504
8,222,651 B2 7/2012 Kanazawa et al.
9,640,744 B2 * 5/2017 Kobayakawa ........ H01L 33/486
(Continued)

FOREIGN PATENT DOCUMENTS

JP H08-274231 A 10/1996
JP 2010-267789 A 11/2010

*Primary Examiner* — Thanh Y Tran
(74) *Attorney, Agent, or Firm* — Shapiro, Gabor and Rosenberger, PLLC

(57) ABSTRACT

An improvement is achieved in the performance of a semiconductor device. The semiconductor device includes a metal plate having an upper surface (first surface), a lower surface (second surface) opposite to the upper surface, and a plurality of side surfaces located between the upper and lower surfaces and having a semiconductor chip mounted thereover. A portion of the metal plate is exposed from a sealing body sealing the semiconductor chip. The exposed portion is covered with a metal film. The side surfaces of the metal plate include a first side surface covered with the sealing body and a side surface (second side surface) provided opposite to the first side surface and exposed from the sealing body. Between the upper and side surfaces of the metal plate, an inclined surface inclined with respect to each of the upper and side surfaces and covered with the metal film is interposed.

19 Claims, 29 Drawing Sheets

(58) Field of Classification Search
CPC ............... H01L 21/4867; H01L 23/498; H01L 23/49866; H01L 23/045
See application file for complete search history.

(56) References Cited

U.S. PATENT DOCUMENTS

2010/0140786 A1* 6/2010 Lee .................... H01L 21/56
257/693
2014/0084435 A1* 3/2014 Kimura ............ H01L 23/49548
257/676

* cited by examiner

SEMICONDUCTOR DEVICE COMPRISING A SEMICONDUCTOR CHIP MOUNTED OVER A METAL PLATE HAVING AN INCLINED SURFACE

CROSS-REFERENCE TO RELATED APPLICATIONS

The disclosure of Japanese Patent Application No. 2015-248767 filed on Dec. 21, 2015 including the specification, drawings and abstract is incorporated herein by reference in its entirety.

BACKGROUND

The present invention relates to a semiconductor device and to, e.g., a semiconductor device having a metal plate exposed at a mounting surface.

Japanese Unexamined Patent Publication No. 2010-267789 (Patent Document 1) describes a semiconductor device in which a semiconductor chip is mounted over a metal base plate and a portion of the metal base plate is exposed from a sealing body.

Also, Japanese Unexamined Patent Publication No. Hei 8(1996)-274231 (Patent Document 2) describes a semiconductor device in which the edge portion of a die pad over which a semiconductor chip is mounted is provided with a chamfered portion.

RELATED ART DOCUMENTS

Patent Documents

[Patent Document 1] Japanese Unexamined Patent Publication No. 2010-267789
[Patent Document 2] Japanese Unexamined Patent Publication No. Hei 8(1996)-274231

SUMMARY

In a semiconductor device in which a semiconductor chip mounted over a metal plate is sealed with a resin, there is a structure in which a portion of the metal plate is exposed from a sealing body. In the foregoing semiconductor device, to improve the wettability of a solder material used when the semiconductor device is mounted over a mounting substrate (mother board), e.g., a metal film covering the exposed surface of the foregoing metal plate exposed from the foregoing sealing body is formed. However, as a result of conducting study, the present inventors have found that, when a metal crystal referred to as a whisker grows over the top surface of the foregoing metal film, a problem arises in terms of the reliability of the semiconductor device.

Other problems and novel features of the present invention will become apparent from a statement in the present specification and the accompanying drawings.

A semiconductor device according to an embodiment includes a first surface, a second surface opposite to the foregoing first surface, and a plurality of side surfaces located between the first and second surfaces and includes a metal plate over which a semiconductor chip is mounted. A portion of the foregoing metal plate is exposed from a sealing body sealing the semiconductor chip. The exposed portion is covered with a metal film. The plurality of side surfaces of the foregoing metal plate include a first side surface covered with the foregoing sealing body and a second side surface provided opposite to the foregoing first side surface and exposed from the foregoing sealing body. Between the foregoing first surface and the foregoing second side surface of the foregoing metal plate, a first inclined surface which is inclined with respect to each of the foregoing first and second side surfaces and covered with the foregoing metal film is interposed.

According to the foregoing embodiment, the performance of the semiconductor device can be improved.

Figure 1:
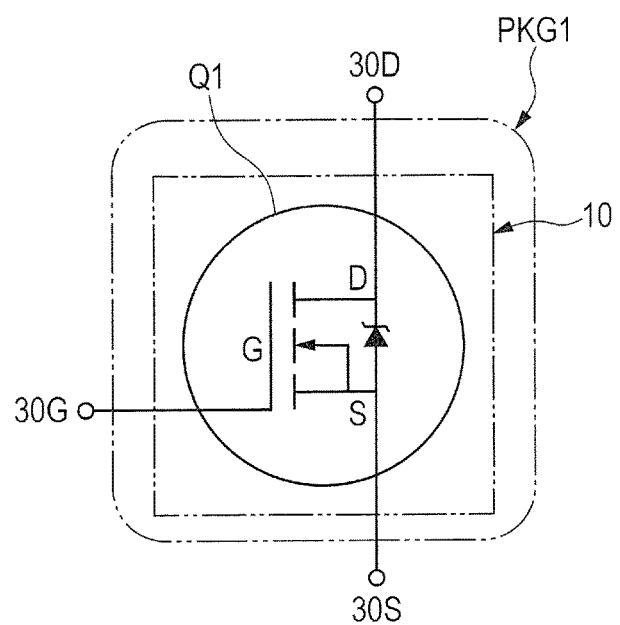
FIG. 1 is an illustrative view schematically showing an example of a circuit included in a semiconductor device in an embodiment.

DETAILED DESCRIPTION (Explanation of Description Form, Basic Terminology, and Use thereof in Present Invention)

In the present invention, if necessary for the sake of convenience, the embodiment will be described by being divided into a plurality of sections or the like. However, they are by no means independent of or distinct from each other unless particularly explicitly described otherwise, and one of the individual parts of a single example is details, modifications, and so forth of part or the whole of the others irrespective the order in which they are described. In principle, a repetitive description of like parts will be omitted. Also, each component in the embodiment is not indispensable unless particularly explicitly described otherwise, unless the component is theoretically limited to a specific number, or unless it is obvious from the context that the component is indispensable.

Likewise, even when such wording as "X comprised of A" is used in association with a material, a composition, or the like in the description of the embodiment or the like, it is not intended to exclude a material, a composition, or the like which contains an element other than A unless particularly explicitly described otherwise or unless it is obvious from the context that it excludes such a material, a composition, or the like. For example, when a component is mentioned, the wording means "X containing A as a main component" or the like. It will be appreciated that, even when a "silicon member" or the like is mentioned, it is not limited to pure silicon, and a member containing a SiGe (silicon germanium) alloy, another multi-element alloy containing silicon as a main component, another additive, or the like is also included. Additionally, even when a gold plating, a Cu layer, a nickel plating, or the like is mentioned, it is assumed to include not only a pure gold plating, a pure Cu layer, a pure nickel plating, or the like, but also a member containing gold, Cu, nickel, or the like as a main component unless it is particularly explicitly described otherwise.

Further, when a specific numerical value or numerical amount is mentioned, it may be either more or less than the specific numerical value unless particularly explicitly described otherwise, unless the numerical value or numerical amount is theoretically limited to the number, or unless it is obvious from the context that the numeral value or numerical amount is limited to the number.

In the individual drawings for the embodiment, the same or like parts are designated by the same or similar symbols or reference numerals, and the description thereof will not be repeated in principle.

In the accompanying drawings, hatching or the like may be omitted even in a cross section when hatching or the like results in complicated illustration or when the distinction between a portion to be hatched and a vacant space is distinct. In relation thereto, even when a hole is two-dimensionally closed, the background outline thereof may be omitted when it is obvious from the description or the like that the hole is two-dimensionally closed, and so forth. On the other hand, even though not shown in a cross section, a portion other than a vacant space may be hatched with lines or dots to clearly show that the hatched portion is not a vacant space or clearly show the boundary of a region.

In the following description, when a solder, a solder substance, a solder material, or a solder component is mentioned, it refers to, e.g., a Sn—Pb solder containing lead (Pb) or a so-called lead-free solder which does not substantially contain Pb. Examples of the lead-free solder include a pure lead (Sn) solder, a lead-bismuth (Sn—Bi) solder, a tin-copper-silver (Sn—Cu—Ag) solder, a tin-copper (Sn—Cu) solder, and the like. The lead-free solder used herein means a solder having a lead (Pb) content of not more than 0.1 wt %. The content is determined as a standard in Restriction of Hazardous Substances (RoHs) Directive.

Embodiment 1

In the present embodiment, as an example of a semiconductor device having a metal plate exposed at a mounting surface, a semiconductor device referred to as a power device or a power semiconductor device which is incorporated into a power control circuit such as a power supply circuit will be described. The semiconductor device described below is incorporated into a power conversion circuit to function as a switching element.

<Example of Circuit Configuration>

Figure 2:
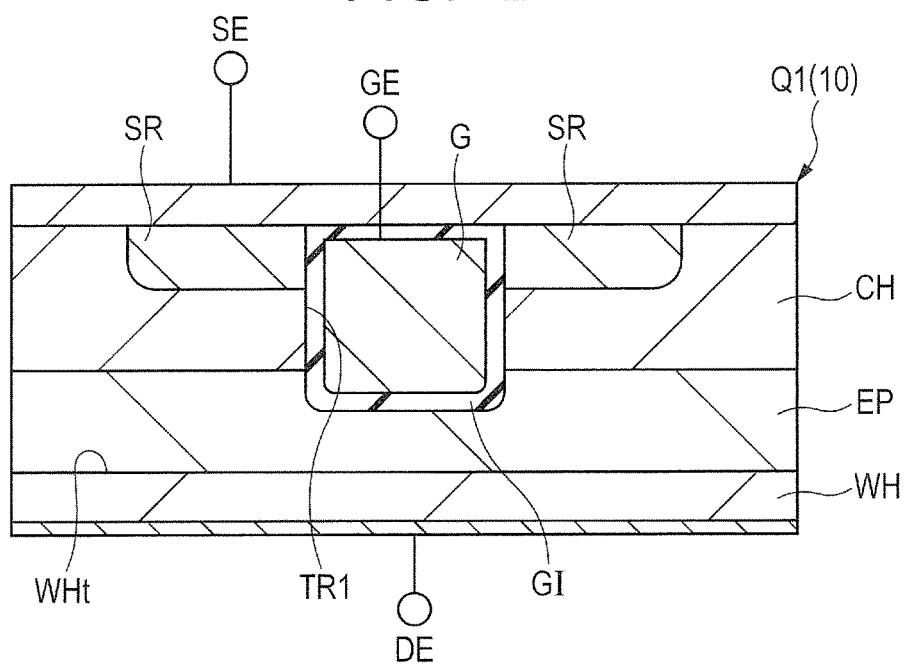
FIG. 2 is a main-portion cross-sectional view showing an example of the element structure of the field effect transistor shown in FIG. 1.

FIG. 1 is an illustrative view schematically showing an example of the circuit included in the semiconductor device in the present embodiment. FIG. 2 is a main-portion cross-sectional view showing an example of the element structure of the field effect transistor shown in FIG. 1.

Power control semiconductor devices referred to as power semiconductor devices include one having a semiconductor element such as, e.g., a diode, a thyristor, or a transistor. A semiconductor device PKG1 in the present embodiment has a semiconductor chip 10 formed with a transistor Q1, as shown in FIG. 1. In the example shown in FIGS. 1 and 2, the transistor Q1 formed in the semiconductor chip 10 is a field effect transistor, specifically MOSFET (Metal Oxide Semiconductor Field Effect Transistor). In a power semiconductor device, a transistor is used as, e.g., a switching element. A MOSFET used in a power semiconductor device is referred to as a power MOSFET.

The MOSFET mentioned above is shown as a term broadly representing a field effect transistor having a structure in which a gate electrode made of a conductive material is placed over a gate insulating film. Accordingly, even when a MOSFET is mentioned, it is not intended to exclude a gate insulating film other than an oxide film. Also, even when a MOSFET is mentioned, it is not intended to exclude a gate electrode material other than a metal such as, e.g., polysilicon.

Also, the transistor Q1 shown in FIG. 1 is formed of, e.g., an n-channel field effect transistor as shown in FIG. 2. FIG. 2 is a main-portion cross-sectional view showing an example of the element structure of the field effect transistor shown in FIG. 1.

In the example shown in FIG. 2, an n⁻-type epitaxial layer EP is formed over a main surface WHt of a semiconductor substrate WH made of, e.g., n-type monocrystalline silicon. The semiconductor substrate WH and the epitaxial layer EP are included in the drain region (region equivalent to a drain D shown in FIG. 1) of the MOSFET. The drain region is electrically coupled to a drain electrode DE formed over the back surface of the semiconductor chip 10.

Over the epitaxial layer EP, a channel formation region CH as a p⁺-type semiconductor region is formed. Over the channel formation region CH, a source region (region equivalent to a source S shown in FIG. 1) SR as an n⁺-type semiconductor region is formed. The source region SR is electrically coupled to a source electrode pad SE formed over the main surface of the semiconductor chip 10 via a lead-out wire. In the semiconductor region stacked over the semiconductor substrate WH, a trench (opening or groove) TR1 is formed to extend from the upper surface of the source region SR through the channel formation region CH and reach the interior of the epitaxial layer EP.

Over the inner wall of the trench TR1, a gate insulating film G1 is formed. Over the gate insulating film GI, a gate electrode G is formed in stacked relation so as to be embedded in the trench TR1. The gate electrode G is electrically coupled to a gate electrode pad GE of the semiconductor chip 10 via a lead-out wire.

In the transistor Q1, the drain region and the source region SR are arranged in a thickness direction with the channel formation region CH being interposed therebetween so that a channel (hereinafter referred to as a vertical channel structure) is formed in the thickness direction. In this case, the area occupied by the element in plan view can be reduced compared to that in a field effect transistor having a channel formed along the main surface WHt. Accordingly, the two-dimensional size of the semiconductor chip 10 can be reduced.

Also, in the case of the vertical channel structure described above, the width of the channel per unit area can be increased in plan view. This can reduce the ON resistance. Note that FIG. 2 is a view showing the element structure of the field effect transistor. In the semiconductor chip 10 shown in FIG. 1, a plurality of (a large number of) the transistors Q1 each having, e.g., an element structure as shown in FIG. 2 are coupled in parallel to each other. This allows a power MOSFET in which a large current of, e.g., more than 1 ampere flows to be configured.

As described above, in the case of configuring the MOSFET by coupling the plurality of transistors Q1 each having the vertical channel structure in parallel to each other, the electric properties (primarily the voltage resistance property, ON resistance property, and capacitance property) of the MOSFET vary in accordance with the two-dimensional size of the semiconductor chip 10. For example, when the two-dimensional area of the semiconductor chip 10 is increased, the number of the cells (i.e., the number of the elements) of the parallel-coupled transistors Q1 increases to reduce the ON resistance and increase the capacitance.

Note that, in FIGS. 1 and 2, as an example of the switching element included in the power semiconductor device, the MOSFET is shown. However, various modifications can be applied thereto. For example, instead of the MOSFET, an Insulated Gate Bipolar Transistor (IGBT) can also be included.

<Semiconductor Device>

Figure 3:
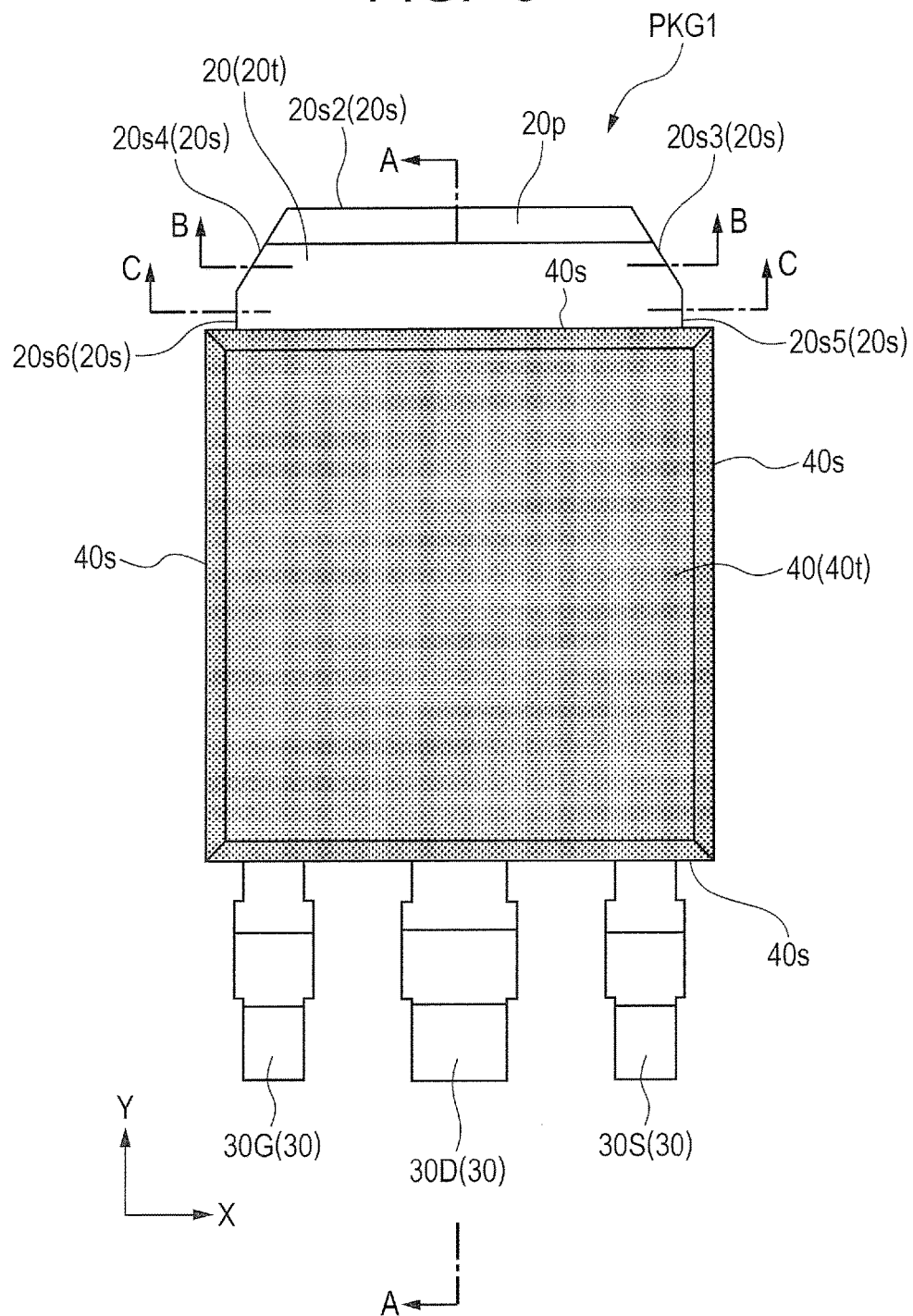
FIG. 3 is a top view of the semiconductor device shown in FIG. 1.
Figure 4:
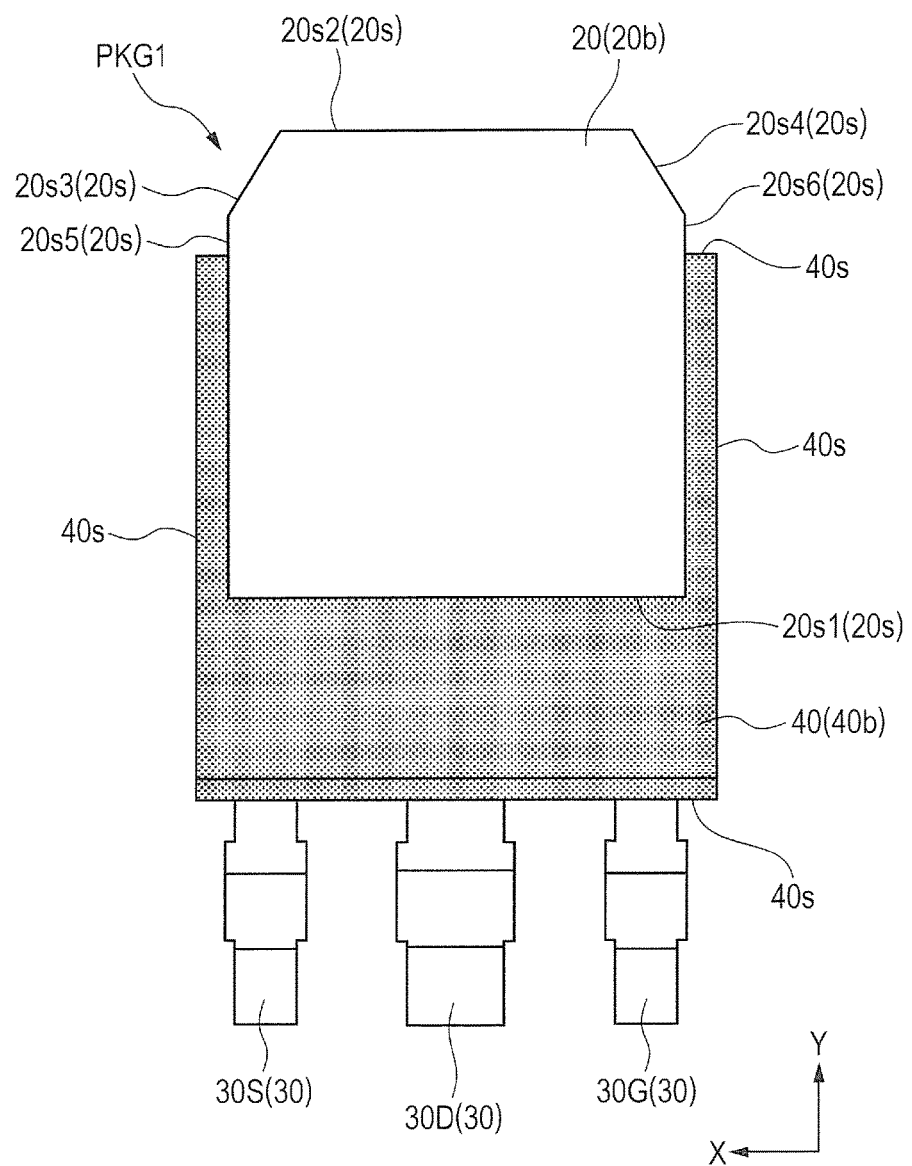
FIG. 4 is a bottom view of the semiconductor device shown in FIG. 3.
Figure 5:
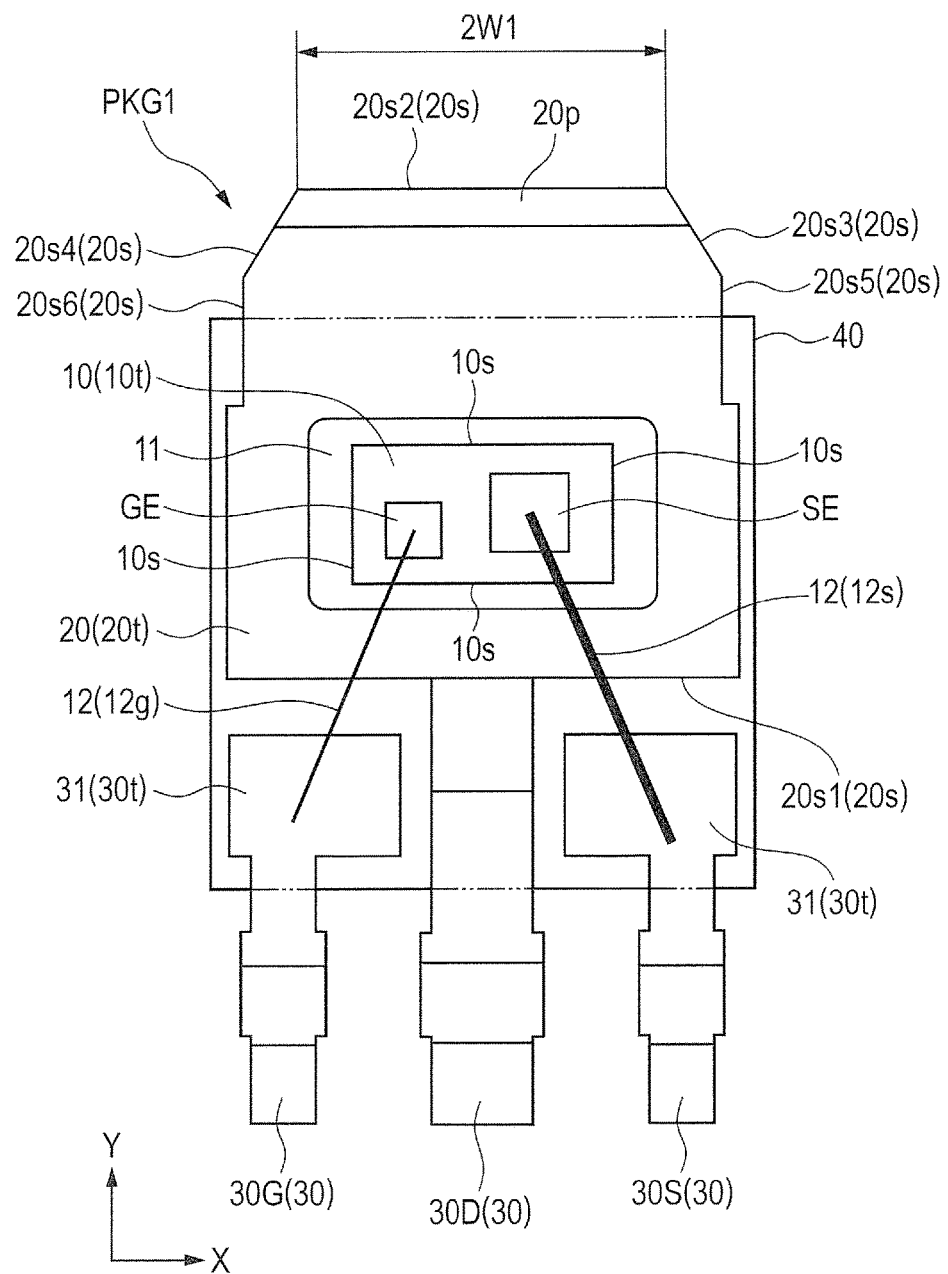
FIG. 5 is a perspective plan view showing the inner structure of the semiconductor device in a state where the sealing body shown in FIG. 3 is removed.
Figure 6:
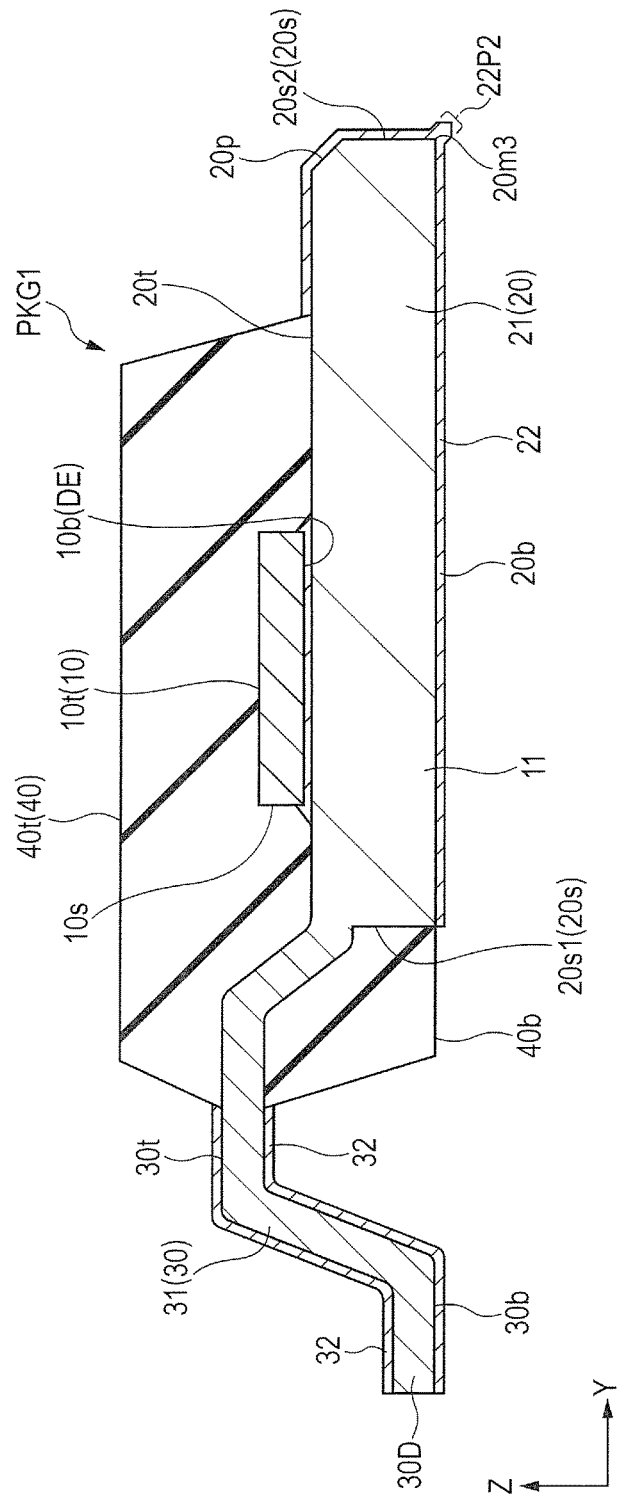
FIG. 6 is a cross-sectional view along the line A-A in FIG. 3.

Next, a description will be given of the package structure of the semiconductor device PKG1 shown in FIG. 1. FIG. 3 is a top view of the semiconductor device shown in FIG. 1. FIG. 4 is a bottom view of the semiconductor device shown in FIG. 3. FIG. 5 is a perspective plan view showing the inner structure of the semiconductor device in a state from which the sealing body shown in FIG. 3 has been removed. FIG. 6 is a cross-sectional view along the line A-A in FIG. 3.

The semiconductor device PKG1 in the present embodiment includes the semiconductor chip 10 (see FIGS. 5 and 6), a metal plate (die pad, chip mounting portion, or a heat dissipation plate) 20 (see FIGS. 4 to 6) over which the semiconductor chip 10 is mounted, and a plurality of leads (terminal) 30 as external terminals. The semiconductor chip 10, an upper surface 20t of the metal plate 20, and upper surfaces 30t of the plurality of leads are collectively sealed in a sealing body (resin body) 40.

In the present embodiment, as shown in FIG. 5, the plurality of leads 30 are arranged in juxtaposition with the metal plate 20 along a Y-direction and arranged in juxtaposition with each other along an X-direction orthogonal to the Y-direction. Also, in the example shown in FIG. 5, a lead for source (source lead or source terminal) 30S, a lead for drain (drain lead or drain terminal) 30D, and a lead for gate (gate lead or gate terminal) 30G are arranged successively in juxtaposition with each other along the X-direction in plan view.

As shown in FIG. 6, the semiconductor chip 10 has a top surface (surface) 10t and a back surface (surface) 10b located opposite to the top surface 10t. As shown in FIG. 5, the top surface 10t (or the back surface 10b shown in FIG. 6) of the semiconductor chip 10 has a quadrilateral shape in plan view and has four side surfaces 10s along the peripheral edge portion thereof. In the example shown in FIG. 5, the semiconductor chip 10 has a rectangular shape in plan view and has long sides located along the X-direction.

Also, as shown in FIG. 5, over the top surface 10t of the semiconductor chip 10, the source electrode pad SE electrically coupled to the source S shown in FIG. 1 and the gate electrode pad GE electrically coupled to the gate electrode G shown in FIG. 1 are formed. On the other hand, as shown in FIG. 6, over the back surface 10b of the semiconductor chip 10, the drain electrode DE electrically coupled to the drain D shown in FIG. 1 is formed. In the example shown in FIG. 6, the entire back surface 10b of the semiconductor chip 10 serves as the drain electrode DE.

As shown in FIG. 2, when the semiconductor chip 10 is provided with the vertical channel structure, by reducing the thickness of the semiconductor chip 10 (reducing the distance between the top surface 10t and the back surface 10b each shown in FIG. 6), the ON resistance can be reduced. On the other hand, in terms of increasing the heat capacitance of the metal plate 20 or increasing the cross-sectional area of a conduction path in which a current flows, the thickness of the metal plate 20 is preferably larger. Accordingly, in the example shown in FIG. 6, the thickness of the metal plate 20 is larger than the thickness of the semiconductor chip 10. For example, in the example shown in FIG. 6, the thickness of the metal plate 20 is not less than 400 μm.

Also, as shown in FIGS. 5 and 6, the semiconductor device PKG1 has the metal plate (die pad, chip mounting portion, or heat dissipation plate) 20 over which the semiconductor chip 10 is mounted. As shown in FIG. 6, the metal plate 20 has the upper surface (chip mounting surface or first main surface) 20t over which the semiconductor chip 10 is mounted via a die bonding material 11 and a lower surface (mounting surface or second main surface) 20b opposite to the upper surface 20t. As shown in FIG. 4, the lower surface 20b of the metal plate 20 has a plurality of side surfaces 20s along the peripheral edge portion thereof which are continued to the lower surface 20b.

Also, in the example of the present embodiment, as shown in FIG. 5, the plurality of side surfaces 20s include a side surface 20s1 which is provided to face the plurality of leads 30 in plan view and sealed in the sealing body 40. The plurality of side surfaces 20s also include a side surface 20s2 provided opposite to the side surface 20s1, exposed from the sealing body 40, and covered with a metal film 22 (see FIG. 6). The plurality of side surfaces 20s also include a side surface 20s3 continued to one end portion of the side surface 20s2 and exposed from the sealing body 40. The plurality of side surfaces 20s also include a side surface 20s4 continued to the other end portion of the side surface 20s2 and exposed from the sealing body 40. The plurality of side surfaces 20s also include a side surface 20s5 continued to the end portion of the side surface 20s3 and exposed from the sealing body 40. The plurality of side surfaces 20s also include a side surface 20s6 continued to the side surface 20s4 and exposed from the sealing body 40.

The metal plate 20 is formed integrally with the lead 30D as the drain terminal. The lead 30D is an external terminal electrically coupled to the drain D shown in FIG. 1. As also shown in FIG. 6, the drain electrode DE formed over the back surface 10b of the semiconductor chip 10 is electrically coupled to the metal plate 20 via the die bonding material 11 made of a conductive material. In the example shown in FIG. 5, the two-dimensional size (area of the top surface 10t) of the semiconductor chip 10 is smaller than the two-dimensional size (area of the upper surface 20t) of the metal plate 20.

As shown in FIGS. 4 and 6, the lower surface 20b of the metal plate 20 is exposed from the sealing body 40 at a lower surface 40b of the sealing body 40. In the example shown in FIG. 4, the area of the lower surface 20b of the metal plate 20 is equal to or larger than the area of the lower surface 40b of the sealing body 40. As also shown in FIG. 3, a portion of the metal plate 20 outwardly protrudes from one of a plurality of side surfaces 40s of the sealing body 40 in plan view when viewed from the upper surface 20t of the metal plate 20. As also shown in FIGS. 3 and 6, a portion of the upper surface 20t of the metal plate 20 and some (at least the side surface 20s2) of the plurality of side surfaces 20s of the metal plate 20 are exposed from the sealing body 40. By increasing the two-dimensional size of the metal plate 20 and exposing a portion of the metal plate 20 from the sealing body 40 as in the present embodiment, it is possible to improve the heat dissipation efficiency of the heat generated in the semiconductor chip 10.

Also, since the lower surface 20b of the metal plate 20 coupled to the lead 30D as the external terminal is exposed from the sealing body 40, the cross-sectional area of the conduction path in which a current flows can be increased. This allows a reduction in impedance in the conduction path. In particular, when the lead 30D serves as the external terminal corresponding to the output node of the circuit of the semiconductor device PKG1, the lower surface 20b of the metal plate 20 which is exposed from the sealing body 40 is preferable in that, by reducing the impedance component of the conduction path coupled to the lead 30D, a power loss in output line can directly be reduced.

The metal plate 20 has a base material 21 made of the same metal material as that of the plurality of leads 30, e.g., copper (Cu) or an alloy material containing copper (Cu) as a main component. Each of the plurality of leads 30 has a base material 31 made of the same metal material as that of the metal plate 20, e.g., copper (Cu) or an alloy material containing copper (Cu) as a main component.

In the example shown in FIG. 6, the thickness of the metal plate 20 (distance from one of the upper and lower surfaces 20t and 20b to the other thereof) is larger than the thickness of each of the leads 30 (distance from one of the upper and lower surfaces 30t and 30b to the other thereof). When the thickness of the metal plate 20 is large as in the present embodiment, the heat capacitance of the metal plate 20 is increased. As a result, the heat dissipation property of the semiconductor device PKG1 improves due to the metal plate 20.

Of the metal plate 20, the portion (exposed portion) exposed from the sealing body 40 is covered with the metal film 22. Likewise, of the leads 30, the portions (exposed portions) exposed from the sealing body 40 are respectively covered with metal films 32. The metal films 22 and 32 are intended to improve the wettability of a solder material 53 (see FIG. 7 described later) used as a coupling material when the semiconductor device PKG1 is mounted over a mounting substrate 50 (see FIG. 7 described later). The metal films 22 and 32 are, e.g., plating metal films formed by an electrolytic plating method. The metal films 22 and 32 are made of, e.g., a solder material containing tin (Sn).

The die bonding material (adhesive material) 11 shown in FIGS. 5 and 6 are a conductive member (die bonding material) for fixing the semiconductor chip 10 onto the metal plate 20 and electrically coupling the semiconductor chip 10 to the metal plate 20. As the die bonding material 11, e.g., a solder material may also be used. Alternatively, the die bonding material 11 may also be a conductive resin adhesive material containing a plurality of silver (Ag) grains (Ag filler) referred to as a so-called a silver (Ag) paste. Note that a metal film (the illustration thereof is omitted) having adhesion to the die bonding material 11 higher than that of copper (Cu) or a copper alloy as the base material of the metal plate 20 may also be formed over a portion of the upper surface 20t of the metal plate 20. This can improve the adhesion strength between the die bonding material 11 and the metal plate 20.

As also shown in FIG. 5, the source electrode pad SE of the semiconductor chip 10 and the lead 30S are electrically coupled to each other via a wire (conductive member or metal wire) 12 (specifically, a wire 12s). Likewise, the gate electrode pad GE of the semiconductor chip 10 and the lead 30G are electrically coupled to each other via the wire 12 (specifically, a wire 12g). The wires 12 are conductive members coupling the electrode pads over the top surface 10t of the semiconductor chip 10 to the leads 30 and contain a metal such as, e.g., aluminum (Al), copper (Cu), silver (Ag), or gold (Au) as a main component.

As shown in FIG. 5, one end of the wire 12s is bonded to the source electrode pad SE of the semiconductor chip 10. On the other hand, the other end of the wire 12s opposite to the foregoing one end is bonded to the upper surface of the coupling portion formed in a portion of the lead 30S. One end of the wire 12g is bonded to the gate electrode pad GE of the semiconductor chip 10. On the other hand, the other end of the wire 12g opposite to the foregoing one end is bonded to the upper surface of the coupling portion formed in a portion of the lead 30G.

In the example shown in FIG. 5, the semiconductor chip 10 has a rectangular shape in plan view, while the plurality of wires 12 are placed so as to cross the long sides of the semiconductor chip 10.

In the power semiconductor device, in a wiring path coupled to the source electrode pad SE, a current larger than a current in a wiring path coupled to the gate electrode pad GE flows. Accordingly, in the example shown in FIG. 5, the thickness of the wire 12s is larger than that of the wire 12g. Note that the shapes and number of the wires 12 are not limited to those in the form shown in FIG. 5, but have various modifications. For example, the thickness of the wire 12g may also be the same as that of the wire 12s. Alternatively, for example, the source electrode pad SE and the lead 30S may also be electrically coupled to each other via a plurality of the wires 12s.

The semiconductor chip 10, the plurality of leads 30, and the plurality of wires 12 are sealed in the sealing body 40. The sealing body 40 is a resin body sealing the semiconductor chip 10 and the wires 12s and 12g and has an upper surface 40t (see FIGS. 3 and 6) and the lower surface (mounting surface) 40b (see FIGS. 4, 6, and 7) located opposite to the upper surface 40t. As shown in FIGS. 3 and 4, each of the upper surface 40t (see FIG. 3) and the lower surface 40b (see FIG. 4) of the sealing body 40 has the plurality of side surfaces 40s along the peripheral edge portion thereof.

The sealing body 40 is formed mainly of, e.g., a thermosetting resin such as, e.g., an epoxy-based resin. To improve the properties (e.g., expansion property under the influence of heat) of the sealing body 40, filler particles such as, e.g., silica (silicon dioxide $SiO_2$) particles may also be mixed in the resin material.

<Mounting of Semiconductor Device>

Figure 7:
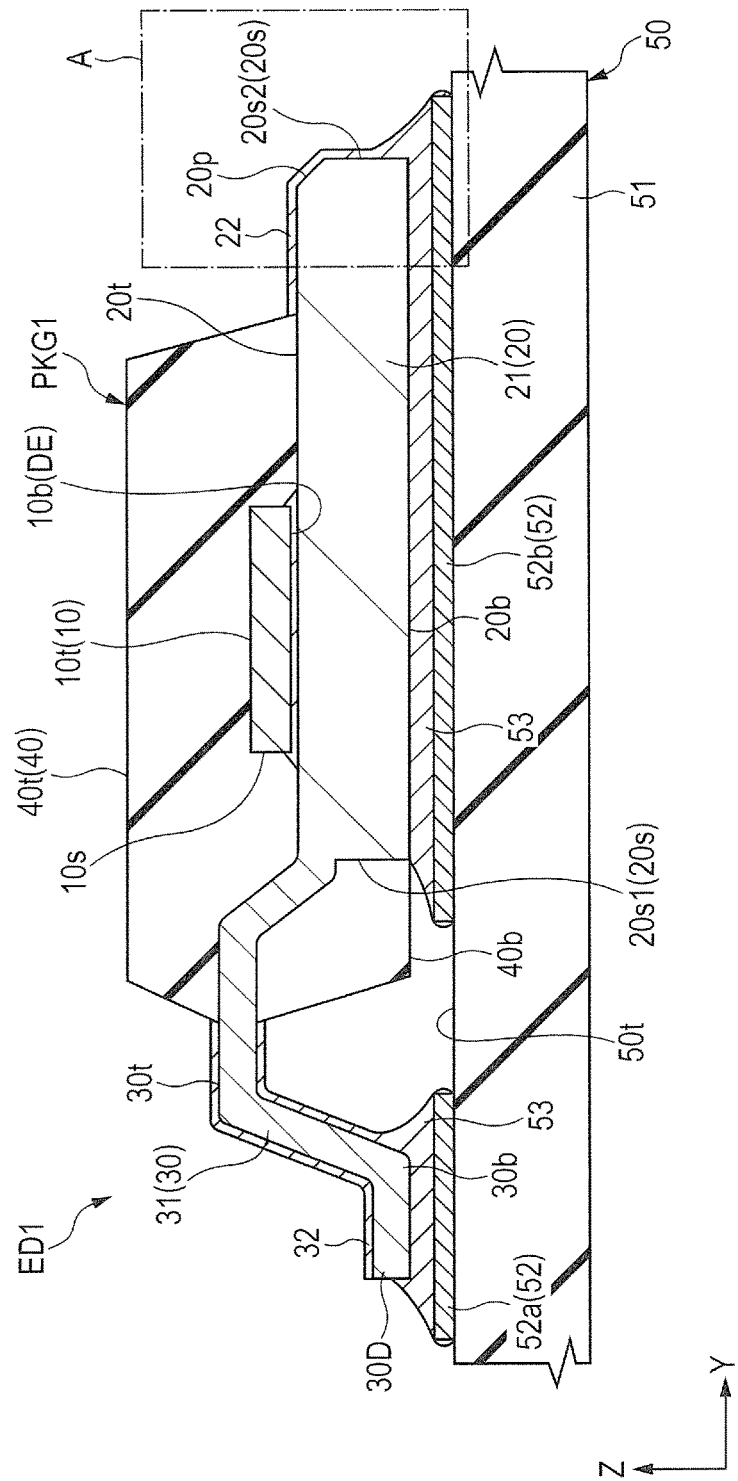
FIG. 7 is an enlarged cross-sectional view of the periphery of the portion of an electronic device having the semiconductor device shown in FIGS. 3 to 6 mounted therein where the semiconductor device is mounted.
Figure 8:
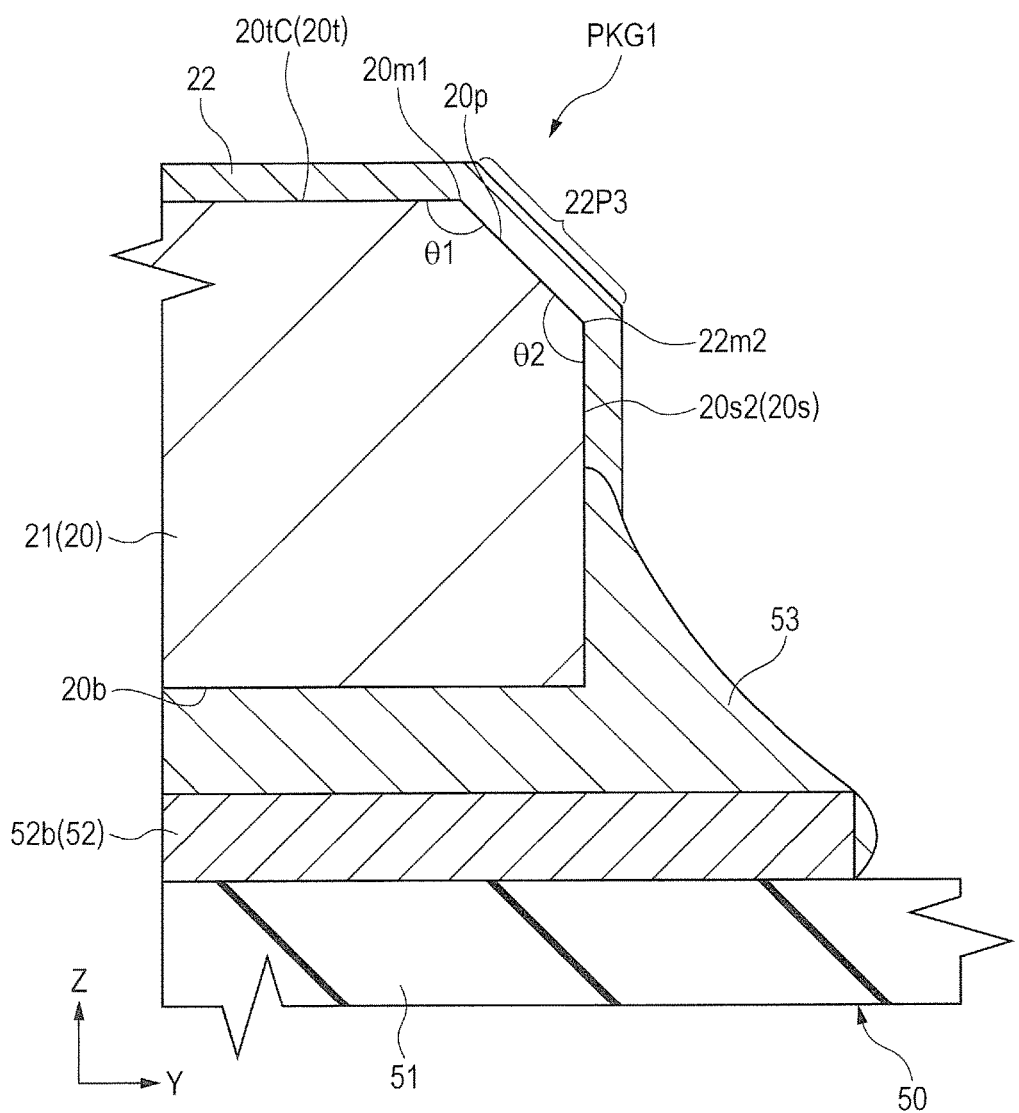
FIG. 8 is an enlarged cross-sectional view of the portion A shown in FIG. 7.
Figure 9:
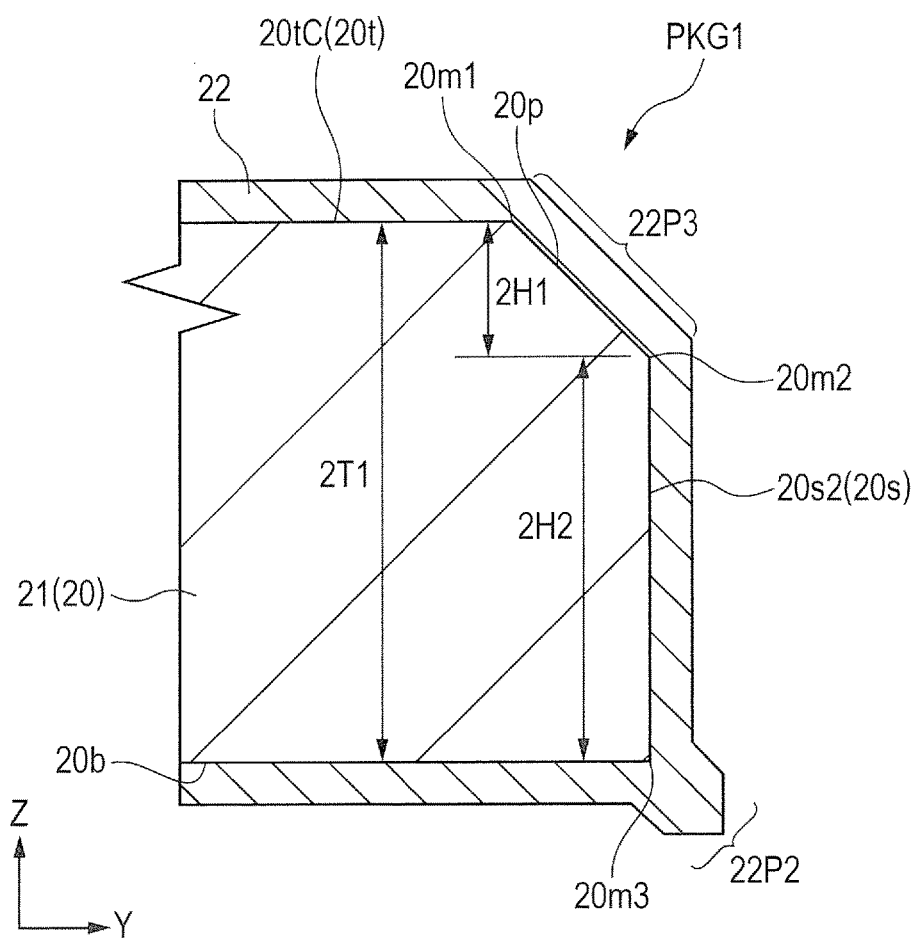
FIG. 9 is an enlarged cross-sectional view showing a state before the portion of the metal plate which is shown in FIG. 8 is mounted over a mounting substrate.
Figure 33:
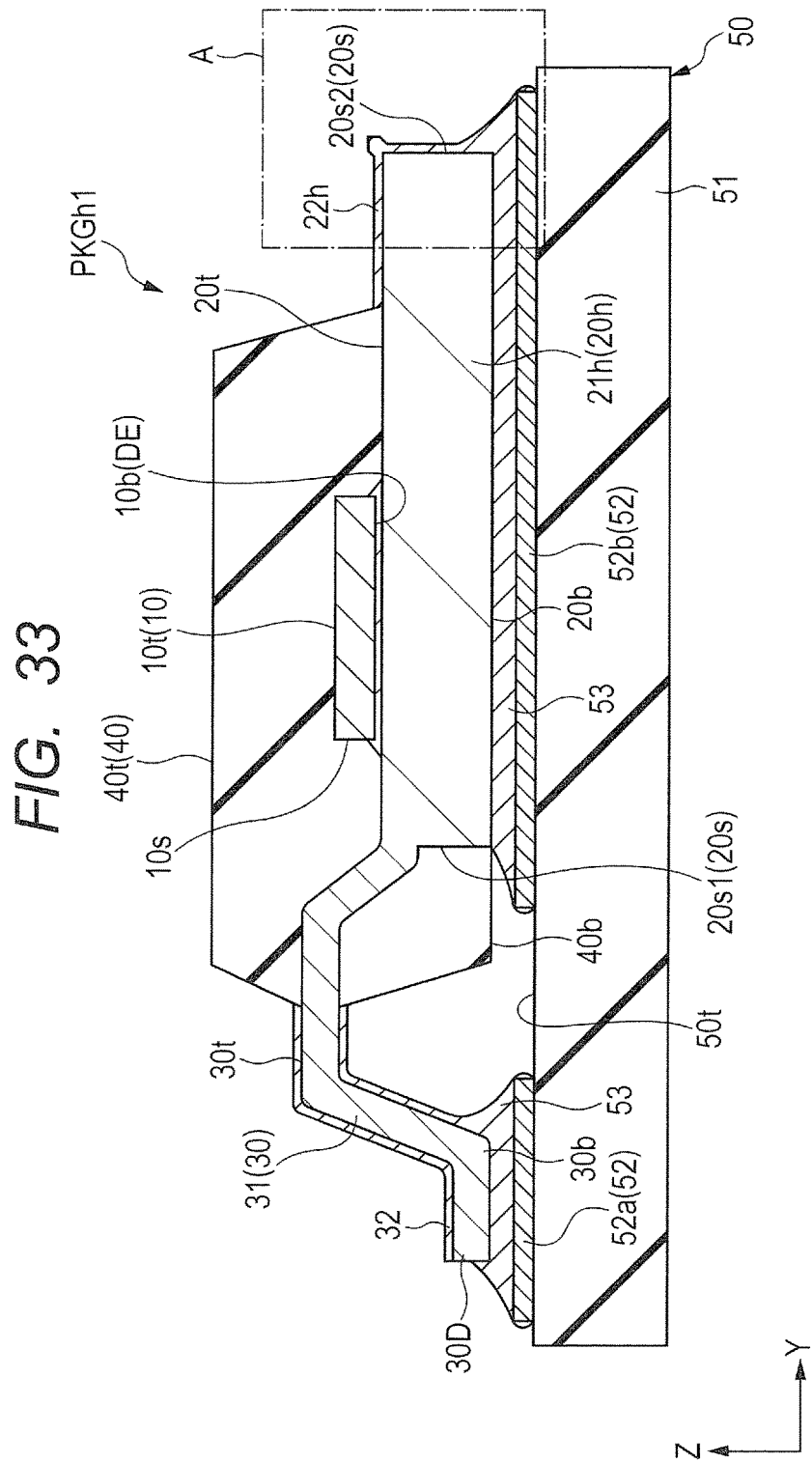
FIG. 33 is an enlarged cross-sectional view showing a state where a semiconductor device is mounted over a mounting substrate in a studied example, which is provided for comparison with FIG. 7.
Figure 34:
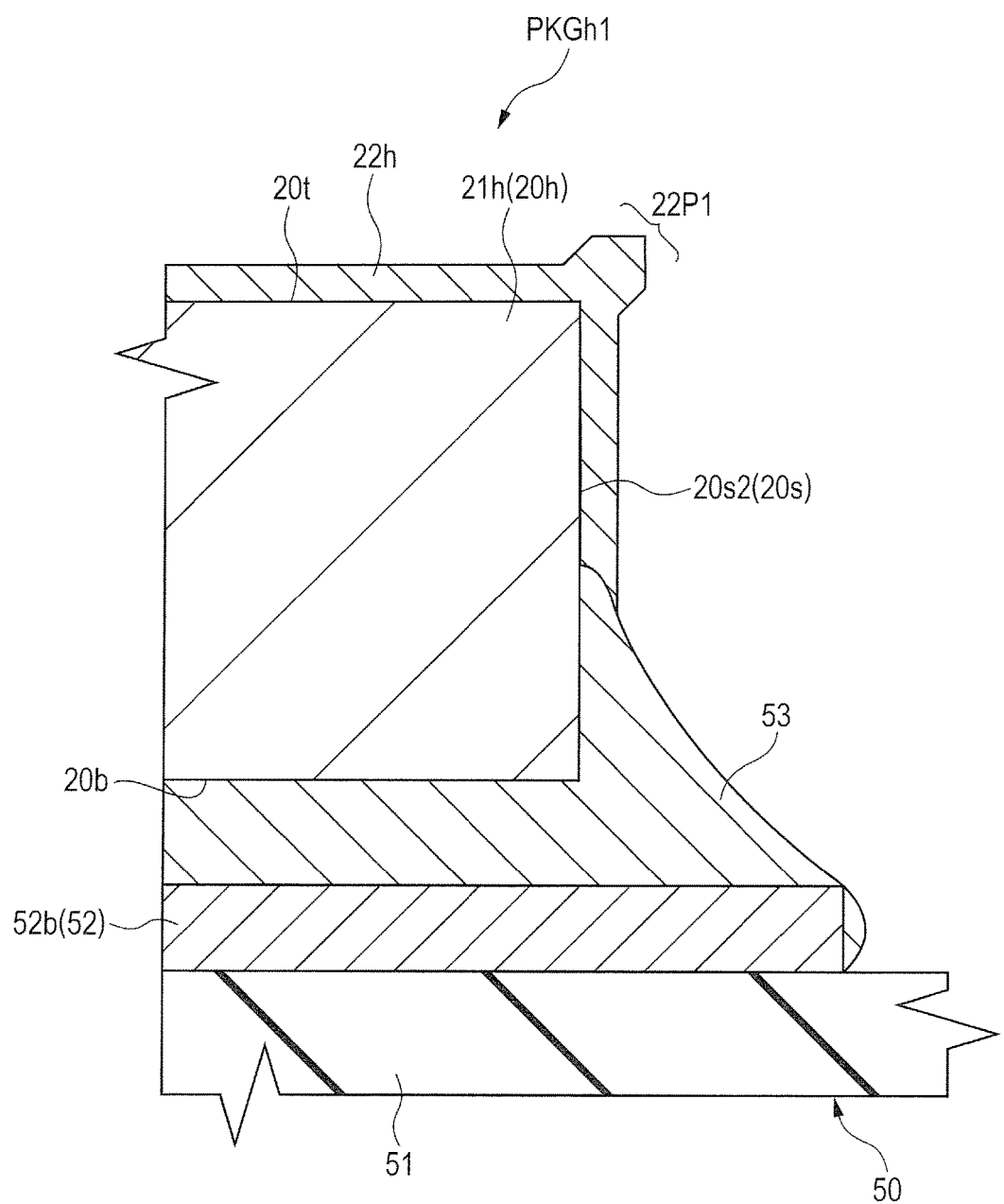
FIG. 34 is an enlarged cross-sectional view of the portion A in FIG. 33.

Next, a description will be given of an electronic device in which the semiconductor device PKG1 shown in FIGS. 3 to 6 is mounted over a mounting substrate. FIG. 7 is an enlarged cross-sectional view of the periphery of the portion of the electronic device having the semiconductor device shown in FIGS. 3 to 6 mounted therein where the semiconductor device is mounted. FIG. 8 is an enlarged cross-sectional view of the portion A shown in FIG. 7. FIG. 9 is an enlarged cross-sectional view showing a state before the portion of the metal plate which is shown in FIG. 8 is mounted over the mounting substrate. FIG. 33 is an enlarged cross-sectional view showing a state where a semiconductor device is mounted over a mounting substrate in a studied example, which is provided for comparison with FIG. 7. FIG. 34 is an enlarged cross-sectional view of the portion A in FIG. 33.

An electronic device ED1 shown in FIG. 7 has a mounting substrate (mother board or wiring substrate) 50 and the semiconductor device PKG1 mounted over an upper surface (surface or electronic component mounting surface) 50t of the mounting substrate 50.

The mounting substrate 50 has an insulating substrate 51 and a plurality of terminals (lands) 52 arranged over the upper surface 50t of the insulating substrate 51. In the example shown in FIG. 7, the plurality of terminals 50 of the mounting substrate 50 include a plurality of terminals (lead-coupled terminals) 52a to be coupled to the plurality of respective leads 30 (see FIG. 3) and a terminal (metal-plate-coupled terminal) 52b to be coupled to the metal plate 20. Each of the plurality of terminals 52 is made of, e.g., copper (Cu) or an alloy material containing, e.g., copper (Cu) as a main component.

The plurality of terminals 52 are coupled to the respective terminals of the semiconductor device PKG1 via the solder material 53. Specifically, the terminals 52a are coupled to the respective leads 30 of the semiconductor device PKG1 via the solder material 53. On the other hand, the terminal 52b is coupled to the metal plate 20 of the semiconductor device PKG1 via the solder material 53.

For example, the step of mounting the semiconductor device PKG1 over the mounting substrate 50 is performed as follows. First, the mounting substrate 50 shown in FIG. 7 is provided. A paste-like solder material (the illustration thereof is omitted) is applied to each of the plurality of terminals 52 (solder material application step). The paste-like solder material is a solder material referred to as a solder cream and containing a flux component which activates the surface of the solder material and a solder component.

Next, the semiconductor device PKG1 is placed over the mounting substrate 50 (semiconductor device placement step). At this time, as shown in FIG. 7, the semiconductor device PKG1 is placed over the mounting substrate 50 such that portions of the lower surfaces 30b of the leads 30 face the respective terminals 52a and the lower surface 20b of the metal plate 20 faces the terminal 52b.

As described above, the portions (exposed portions) of the leads 30 of the semiconductor device PKG1 which are exposed from the sealing body 40 are covered with the metal films 32. Also, the portion (exposed portion) of the metal plate 20 which is exposed from the sealing body 40 is covered with the metal film 22. Accordingly, in the semiconductor device placement step, the portions of the metal films 32 covering the leads 30 and the portion of the metal film 22 covering the metal plate 20 are brought into close contact with the paste-like solder material described above.

Next, with the semiconductor device PKG1 being placed over the mounting substrate 50, the mounting substrate 50 is heated (reflow step). In this step, the paste-like solder material applied onto the mounting substrate 50 is melted so that the flux component is lost. Each of the metal films 32 and 22 is also melted. The respective top surfaces of the metal films 32 and 22 come into contact with the flux component described above to be activated. The melted solder component wet-spreads along the base material 31 of each of the leads 30 and the base material 21 of the metal plate 20. The solder component that has wet-spread is integrated with the respective portions of the metal films 32 and 22 to form the solder material 53 shown in FIG. 7.

As a result of conducting study, the present inventors have found that, in the structure of a semiconductor device PKGh1 shown in FIG. 33, a long thin metal crystal shaped like and referred to as a whisker grows from a portion of a metal plate 20h. It has been found that, even in the case where, e.g., no whisker has been formed in the semiconductor device PKGh1, when a temperature cycle load or a load such as repeated exposure to a high-humidity environment is applied to the semiconductor device PKGh1 after mounted over the mounting substrate 50, a whisker grows.

As described above, a whisker is a long thin whisker-shaped metal crystal. Accordingly, when the whisker that has grown from the portion of the metal plate 20h is broken and falls to the place around the semiconductor device PKGh1, the whisker may form a conductive foreign substance. Therefore, in terms of improving the reliability of the semiconductor device PKGh1, whisker formation is preferably suppressed.

The metal crystal shaped like and referred to as a whisker is known as a monocrystalline body which grows, when a plating film made of tin (Sn) containing no impurity is formed, outwardly from a portion of the plating film as a starting point. However, as a result of the study, the present inventors have found that, depending on the environmental conditions under which the semiconductor device PKGh1 is stored or used, even when the plating film is made of an alloy material obtained by adding, e.g., bismuth (Bi) or the like to tin, a whisker may be formed.

As a result of conducting study, the present inventors have found that, when the thickness of a metal film 22h as a plating film covering the metal plate 20h is uneven, a whisker is likely to grow from the portion of the metal film 22h which has a relatively large thickness as a starting point. Specifically, as shown in FIG. 34, the metal plate 20h of the semiconductor device PKGh1 has a portion 22P1 having a relatively large thickness compared to the thickness of the surrounding portion which is formed at the boundary portion thereof between the side surface 20s2 and the upper surface 20t. It has also be found the whisker has grown from the portion 22P1 as a starting point. The length of the whisker is larger as the thickness of the metal film 22h is larger.

It can be considered that the portion 22P1 having the relatively large thickness, such as the portion 22P1 shown in FIG. 34, is formed for the following reason. That is, when the metal film 22h is formed around the metal plate 20h by an electrolytic plating method, depending on the shape of the metal plate 20h, a current density may be locally concentrated on a portion of the metal plate 20h. It can be considered that, at the portion of the metal plate 20h where the current density is concentrated, the thickness of the plating film is larger than at the other portion thereof.

The present inventors have studied a method which reduces the thickness of the entire plating film and thus reduces the thickness of the portion 22P1 shown in FIG. 34 as a method of suppressing whisker formation. However, in this case, the thickness of the portion of the metal film 22h which is other than the portion 22P1 is reduced. This degrades the wettability of the solder material to the metal film 22h. Accordingly, in terms of improving the reliability of the mounting strength, it is difficult to use the method which reduces the thickness of the metal film 22h.

From the foregoing findings, it can be considered that, as a method of suppressing the growth of a whisker, it is effective to reduce variations in the thickness of the metal film 22 covering the metal plate 20 shown in FIG. 6. To implement a method of reducing variations in the thickness of the metal film 22, the present inventors have also studied the structure of the metal plate 20 which can inhibit, when electrolytic plating is performed, the current density from being concentrated. However, as described above, the metal film 22 has the function of improving the wettability of the solder when the semiconductor device PKG1 is mounted over the mounting substrate 50. Accordingly, in terms of improving the mounting reliability of the semiconductor device PKG1, it is preferable not to impair the wettability of the solder which is provided by the metal film 22.

First, of the metal film 22h covering the base material 21h of the metal plate 20h shown in FIG. 34, the portion having a relatively large thickness compared to the thickness of the surrounding portion, such as the portion 22P1, is present around the portion of the metal film 22h where the side surface 20s2 and the upper surface 20t cross each other and around the portion of the metal film 22h where the side surface 20s and the lower surface 20b cross each other. Note that, as shown in FIGS. 6 and 9, the metal film 22 covering the portion of the metal plate 20 included in the semiconductor device PKG1 in the present embodiment which is exposed from the sealing body 40 is also formed with a portion 22P2 having a relatively large thickness compared to the thickness of the other portion thereof. Since each of FIGS. 33 and 34 shows the state after the semiconductor device PKGh1 is mounted over the mounting substrate 50, the portion 22P2 shown in FIG. 6 is not shown in FIGS. 33 and 34. However, in the case of the semiconductor device PKGh1 also, the portion 22P2 shown in FIG. 6 is formed. Around the portion of the metal film 22h shown FIG. 33 where the side surface 20s1 and the lower surface 20b cross each other, a portion having a larger thickness such as the portion 22P1 shown in FIG. 34 or the portion 22P2 shown in FIG. 6 was not recognized.

Note that, as shown in FIG. 7, the portion 22P2 shown in FIGS. 6 and 9 is already a portion of the solder material 53 when the semiconductor device PKG is mounted over the mounting substrate 50. Consequently, even when the portion 22P2 is formed, there is no possibility of whisker growth due to the portion 22P2. Also, even if a portion having a larger thickness, such as the portion 22P1 shown in FIG. 34 or the portion 22P2 shown in FIG. 6, is formed around the portion of the metal film 22h shown in FIG. 33 where the side surface 20s1 and the lower surface 20b cross each other, the portion having the larger thickness similarly becomes a part of the solder material 53 shown in FIG. 33. As a result, even when a portion having a larger thickness is formed around the portion of the metal film 22h shown in FIG. 33 where the side surface 20s1 and the lower surface 20b cross each other, the portion does not cause whisker formation.

In the metal film 32 covering the portion of the base material 31 of each of the leads 30 shown in FIG. 33 which is exposed from the sealing body 40, a portion having a larger thickness, such as the portion 22P1 shown in FIG. 34 or the portion 22P2 shown in FIG. 6, was not recognized.

From the foregoing description, it has been seen that the portion of the metal film 22h which particularly needs an approach to reduce variations in the thickness of the plating film as the cause of whisker growth is the periphery of the portion of the metal film 22h shown in FIG. 34 where the side surface 20s2 and the upper surface 20t cross each other.

Next, a description will be given of an approach to inhibit a locally thicker portion from being formed in the metal film 22h. The following is one of conceivable reasons for the formation of the portion 22P1 shown in FIG. 34 and whisker growth from the portion 22P1 as a starting point. That is, in the case of using a so-called electrolytic plating method when the metal film 22h is formed, in the portion of the metal plate 20h where the current density of a current flowing during the deposition of the metal film 22h locally increases, the deposition speed of the metal film 22h is higher than in the other portion thereof. Consequently, around the portion of the metal plate 20h where the current density is locally higher, the thickness of the metal film 22h increases.

Also, in the case of the metal plate 20h, the current density particularly tends to be higher in the portion of the metal plate 20h where the side surface 20s2 and the upper surface 20t cross each other and in the portion of the metal plate 20h where the side surface 20s2 and the lower surface 20b cross each other. In the case of forming the metal film 22h by a so-called electrolytic plating method in a plating step described later, a current flows in the metal plate 20h shown in FIG. 33. At this time, the current (or electrons) flows from one of the side surfaces 20s1 and 20s2 to the other thereof. In those of the plurality of side surfaces of the metal plate 20 which are along the direction of flow of the current (or electrons), the current density tends to be relatively low. On the other hand, in those of the plurality of side surfaces of the metal plate 20 which cross the direction of flow of the current (or electrons), the current density tends to be relatively high. Accordingly, in the side surfaces 20s1 and 20s2 among the plurality of side surfaces of the metal plate 20, the current density tends to be higher. In the distribution of the current density in the side surface 20s2, the current density tends to be higher in the peripheral edge portion of the side surface 20s2. When the angle formed between another surface continued to the side surface 20s2 and the side surface 20s2 is not more than 90 degrees, the current density particularly tends to be higher.

In addition, as the area of the side surface 20s2 is larger, the degree to which the distribution of the current density varies is higher. The area of the side surface 20s2 increases in proportion to the thickness of the metal plate 20h. Accordingly, as the thickness of the metal plate 20h is increased so as to improve the heat dissipation property provided by the metal plate 20h, the degree to which the current density varies in the plating step increases.

Note that, of the side surfaces 20s1 and 20s2, the side surface 20s1 is covered with the sealing body 40 so that, if the current density increases in the plating step, no particular problem arises. If the thickness of the metal film 22h around the portion of the lower surface 20b which crosses the side surface 20s1 locally increases, the thicker portion is already a part of the solder material 53 after the semiconductor device PKGh1 is mounted over the mounting substrate 50, as shown in FIG. 33. As a result, even when the thickness of a portion of the metal film 22h locally increases over the mounting surface of the semiconductor device PKGh1, the thicker portion does not cause whisker growth.

On the other hand, the side surface 20s2 is exposed from the sealing body 40 shown in FIG. 33 and covered with the metal film 22h. Since the portion 22P1 is less likely to be integrated with the solder material 53 shown in FIG. 34, the portion 22P1 remains in most cases even after the semiconductor device PKGh1 is mounted over the mounting substrate 50. Accordingly, it can be considered that the portion 22P1 oftentimes serves as a starting point from which a whisker grows.

On the basis of the result of the study shown above, the present inventors have examined a configuration which suppresses the concentration of the current density in a place where the current density tends to be locally higher and found the configuration in the present embodiment. That is, as shown in FIG. 8, the upper surface 20t of the metal plate 20 included in the semiconductor device PKG1 in the present embodiment has an exposed portion 20tC exposed from the sealing body 40 (see FIG. 6) and covered with the metal film 22. Between the exposed portion 20tC and the side surface 20s2, an inclined surface 20p which is inclined with respect to each of the upper surface 20t and the side surface 20s2 and covered with the metal film 22 is interposed.

The inclined surface 20p is a coining surface (pressed surface) formed by press working which presses, e.g., the portion of the side surface 20s2 of the metal plate 20 which is closer to the upper surface 20t and is provided so as to extend in the extending direction (X-direction in FIG. 3) of the side surface 20s2, as shown in FIG. 3. A working method which thus removes the side where the two surfaces of a certain member cross each other is referred to as chamfering. Also, a method which performs chamfer working to interpose the inclined surface 20P between two surfaces (the side surface 20s2 and the upper surface 20t in the example shown in FIG. 8) is referred to as "C-chamfering". On the other hand, as will be described later, a method which performs chamfer working to interpose a curved surface protruding toward the outside of a member between two surfaces is referred to as "R-chamfering". In the present embodiment, the inclined surface 20p as a C-chamfer is formed using a method which crushes the side where two surfaces cross each other to plastically deform the member for C chamfering.

The inclined surface 20 is inclined with respect to each of the upper surface 20t and the side surface 20s2. An angle θ1 formed between the upper surface 20t and the inclined surface 20p and an angle θ2 formed between the side surface 20s2 and the inclined surface 20p are obtuse angles larger than 90 degrees. In the example shown in FIG. 8, the respective values of the angles θ1 and θ2 are equal to each other and 135 degrees.

As shown in FIG. 8, when each of the angles θ1 and θ2 is an obtuse angle larger than 90 degrees, around each of a side 20m1 where the upper surface 20t and the inclined surface 20p cross each other and a side 20m2 where the side surface 20s2 and the inclined surface 20p cross each other, the degree to which the current density is concentrated can be reduced. Accordingly, the thickness of a portion (first thickness portion) 22P3 of the metal film 22 which covers the inclined surface 20p of the base material 21 of the metal plate 20 is about the same as the thickness of the surrounding metal film 22. For example, the thickness of the portion 22P3 of the metal film 22 is about the same as the thickness of the portion thereof which covers the upper surface 20t. Also, the thickness of the portion 22P3 of the metal film 22 is about the same as the thickness of the portion thereof which covers the side surface 20s2.

As described above, in the example shown in FIG. 8, the respective values of the angles θ1 and θ2 are equal to each other and 135 degrees. However, as long as each of the angles θ1 and θ2 is obtuse, the respective values of the angles θ1 and θ2 may also be different from each other. As shown in FIG. 8, when the side surface 20s2 and the upper surface 20t extend along respective directions (which are a Z-direction and the Y-direction in FIG. 8) orthogonal to each other, the sum of the angles θ1 and θ2 is 270 degrees. For example, when the angle θ1 is 95 degrees, the angle θ2 is 175 degrees. However, when either one of the angles θ1 and θ2 has a value close to 90 degrees, the current density is likely to be concentrated on the angle close to 90 degrees. Accordingly, each of the angles θ1 and θ2 is preferably 105 to 165 degrees. Also, each of the angles θ1 and θ2 is more preferably 120 to 150 degrees. When each of the angles θ1 and θ2 is 135 degrees as shown in FIG. 8, the angles θ1 and θ2 can be maximized under the condition that the sum of the angles θ1 and θ2 is 270 degrees.

Also, as shown in FIG. 9, the side surface 20S of the metal plate 20 included in the semiconductor device PKG1 in the present embodiment is continued to the lower surface 20b covered with the metal film 22. In other words, the side surface 20s2 and the lower surface 20b of the metal plate 20 cross each other. The angle formed between the side surface 20s2 and the lower surface 20b is, e.g., 90 degrees. Consequently, around a side 20m3 where the side surface 20s2 and the lower surface 20b cross each other, the current density tends to be locally higher in the plating step described later. As a result, the thickness of the portion 22P2 of the metal film 22 which covers the side 20m3 is larger than the thickness of the other portion thereof. Accordingly, in the present embodiment, the thickness of the portion 22P3 covering the inclined surface 20p is smaller than the thickness of the portion 22P2 covering the side 20m3.

In a modification of the present embodiment, an inclined surface equivalent to the inclined surface 20p may also be interposed between the side surface 20s2 and the lower surface 20b. In this case, it is possible to inhibit a portion having a relatively large thickness, such as the portion 22P2 shown in FIG. 9, from being formed. However, as described above, even when, e.g., the portion 22P2 is formed, the portion 22P2 is less likely to be a factor which causes whisker formation. In the case of forming the inclined surface 20p by press working, it is necessary to press the metal plate 20 under a high pressure. Accordingly, in the case of forming the inclined surface 20p between each of the upper surface 20t and the lower surface 20b and the side surface 20s2 of the metal plate 20, the level of difficulty of press working is high. Therefore, in terms of relatively easily forming the inclined surface 20p, as shown in FIGS. 6 to 9, the side surface 20s2 of the metal plate 20 is preferably continued to the lower surface 20b covered with the metal film 22.

Also, as in the present embodiment, in the case of providing the inclined surface 20p in terms of suppressing the concentration of the current density in the plating step, the inclined surface 20p preferably has a dimension of not less than a given dimension. For example, a height (level difference) 2H1 of the inclined surface 20p is preferably larger than 10% of a thickness (plate thickness) 2T1 of the base material 21 of the metal plate 20 shown in FIG. 9. Specifically, the height 2H1 between a side 20m1 where the inclined surface 20p and the upper surface 20t cross each other and the side 20m2 where the inclined surface 20p and the side surface 20s2 cross each other in a direction (Z-direction in FIG. 9) extending from one of the upper and lower surfaces 20t and 20b of the metal plate 20 toward the other thereof is preferably larger than 10% of the thickness 2T1 as the distance between the upper and lower surfaces 20t and 20b apart from each other. When the thickness of the base material 21 of the metal plate 20 shown in FIG. 9 is, e.g., 1 mm, the height 2H1 of the inclined surface 20p in the thickness direction (Z-direction) is preferably larger than 0.1 mm. Also, when the thickness of the base material 21 of the metal plate 20 shown in FIG. 9 is 500 µm, the height 2H1 of the inclined surface 20p in the thickness direction (Z-direction) is preferably larger than 50 µm. When the height 2H1 is larger than 10% of the thickness 2T1, the effect of reducing the likelihood of the formation of the portion 22P1 shown in FIG. 34 in the plating step can be recognized.

The height 2H1 between the side 20m1 where the inclined surface 20p and the upper surface 20t cross each other and the side 20m2 where the inclined surface 20p and the side surface 20s2 cross each other in a direction (Z-direction in FIG. 9) extending from one of the upper and lower surfaces 20t and 20b of the metal plate 20 toward the other thereof is more preferably not less than ¼ (not less than 25%) of the thickness 2T1 as the distance between the upper and lower surfaces 20t and 20b apart from each other. When the thickness of the base material 21 of the metal plate 20 shown in FIG. 9 is, e.g., 1 mm, the height 2H1 of the inclined surface 20p in the thickness direction (Z-direction) is preferably not less than 0.25 mm. Also, when the thickness of the base material 21 of the metal plate 20 shown in FIG. 9 is 500 µm, the height 2H1 of the inclined surface 20p in the thickness direction (Z-direction) is preferably not less than 125 µm. When the thickness 2H1 is not less than ¼ of the thickness 2T1, the thickness of the portion 22P1 shown in FIG. 34 in the plating step can significantly be reduced. Accordingly, it is possible to stably suppress the whisker growth described above.

Note that the magnitude of the dimension of the inclined surface 20p is shown above as the ratio thereof to the thickness of the metal plate 20 for the following reason. That is, the degree to which the current density varies in the plating step in the vicinity of the side surface 20s2 increases or decreases depending on the area of the side surface 20s2 which is proportional to the height (level difference) between the sides 20m2 and 20m3 shown in FIG. 9. Also, as shown in FIG. 5, a width 2W1 of the side surface 20s2 in the X-direction is sufficiently larger than (e.g., not less than ten times) the height 2H2 shown in FIG. 9 in plan view. Accordingly, when the thickness 2T1 shown in FIG. 9 is large, the area of the side surface 20s2 increases in proportion thereto and therefore the height 2H1 of the inclined surface 20p provided to suppress the concentration of the current density needs to be larger. Conversely, when the thickness 2T1 shown in FIG. 9 is small, the area of the side surface 20s2 decreases in proportion thereto. As a result, even when the height 2H1 of the inclined surface 20p provided to suppress the concentration of the current density is small, the effect of suppressing the concentration of the current density can be obtained.

When the height 2H1 of the inclined surface 20p is in a range of not less than ¼ of the thickness 2T1 of the base material 21 of the metal plate 20, the effect of suppressing whisker formation shows no significant change. To be exact, when the height 2H1 extremely increases and the height 2H2 of the side surface 20s2 decreases, the current density is more likely to be concentrated. However, in this case, the current density is more likely to be concentrated on the vicinity of the lower surface 20b. Even when the thickness of the metal film 22 increases in the vicinity of the lower surface 20b, as shown in FIG. 7, the thicker portion of the metal film 22 is already a part of the solder material 53 when the semiconductor device PKG1 is mounted over the mounting substrate 50. Accordingly, in terms of inhibiting the growth of a whisker, the effect shows no big difference when the height 2H1 of the inclined surface 20p is in a range of not less than ¼ of the thickness 2T1 of the base material 21 of the metal plate 20.

On the other hand, when consideration is given to the efficiency of the operation of shaping the inclined surface 20p, as the height 2H1 of the inclined surface 20p is reduced, a load on press working can be reduced. Accordingly, when consideration is given also to the efficiency of the operation of shaping the inclined surface 20p, the height 2H1 of the inclined surface 20p is more preferably ¼ of the thickness 2T1 of the base material 21 of the metal plate 20.

Figure 10:
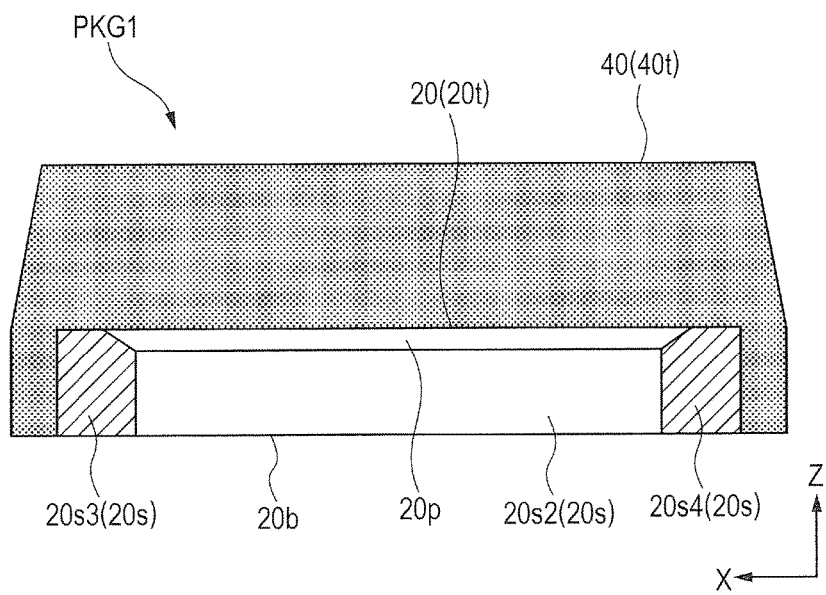
FIG. 10 is a side view obtained by viewing the semiconductor device shown in FIG. 3 from the inclined surface of the metal plate.
Figure 11:
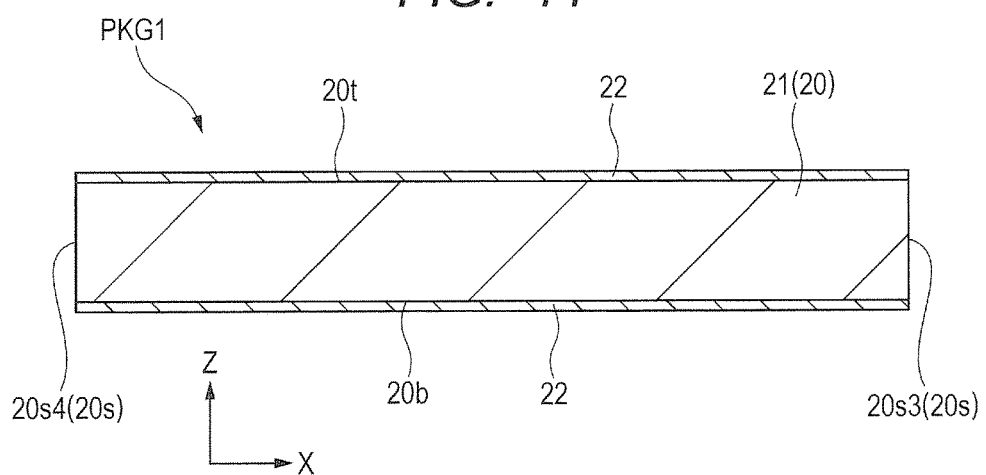
FIG. 11 is a cross-sectional view along the line B-B in FIG. 3.
Figure 12:
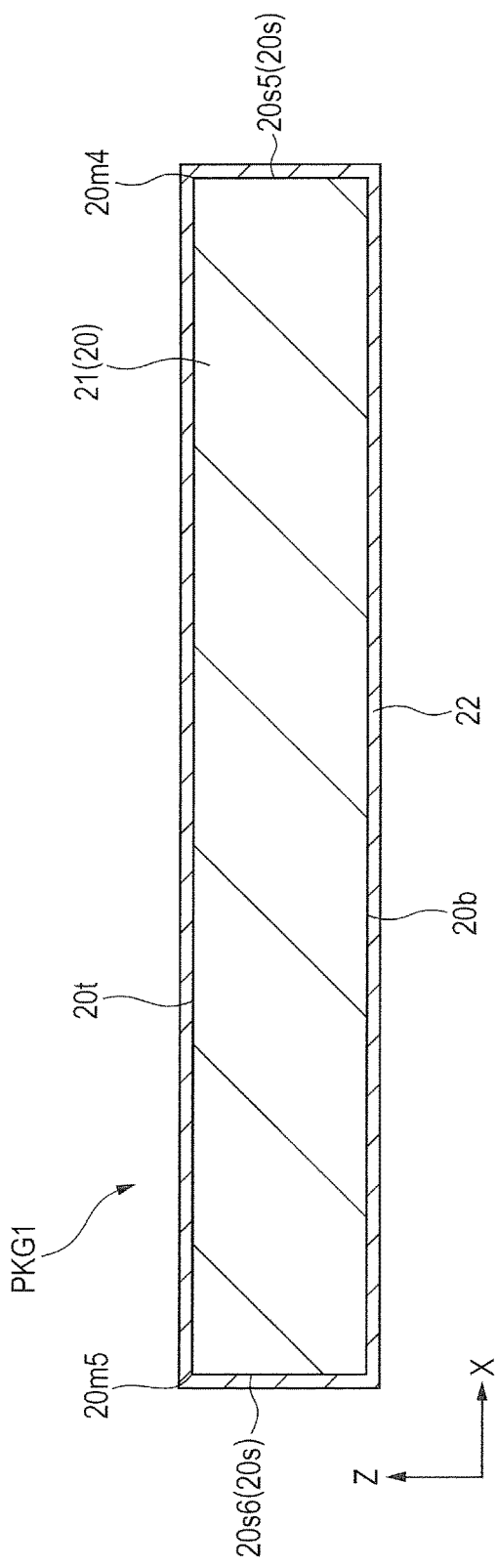
FIG. 12 is a cross-sectional view along the line C-C in FIG. 3.

Of the metal plate 20 included in the semiconductor device PKG1 in the present embodiment, the portion exposed from the sealing body 40 shown in FIG. 3 has a portion uncovered with the metal film 22 (see FIG. 6). FIG. 10 is a side view obtained by viewing the semiconductor device shown in FIG. 3 from the inclined surface of the metal plate. FIG. 11 is a cross-sectional view along the line B-B in FIG. 3. FIG. 12 is a cross-sectional view along the line C-C in FIG. 3. Note that FIG. 10 is a side view but, to clearly show the positions of the side surfaces 20s3 and 20s4 exposed from the metal film 22 (see FIG. 11), the side surfaces 20s3 and 20s4 are hatched.

As shown in FIG. 10, the plurality of side surfaces 20s of the metal plate 20 include the side surface 20s3 continued to one end portion of each of the side surface 20s2 and the inclined surface 20p and the side surface 204 continued to the other end portion of each of the side surface 20s2 and the inclined surface 20p. Each of the side surfaces 20s3 and 20s4 is continued to the upper surface 20t of the metal plate 20 and exposed from the sealing body 40 and the metal film 22 (see FIG. 11).

The side surfaces 20s3 and 20s4 shown in FIGS. 10 and 11 are cut surfaces formed by cutting a portion of the metal plate 20 in a tie bar cut step after the plating step described later. Accordingly, the side surfaces 20s3 and 20s4 are not covered with the metal film 22.

Note that a major part of each of the side surfaces 20s3 and 20s4 is exposed from the metal film 22. However, depending on a working method in forming the side surfaces 20s3 and 20s4, the metal film 22 drawn from another surface may be deposited over a portion of each of the side surfaces 20s3 and 20s4 during cutting.

As shown in FIG. 11, at the side surfaces 20s3 and 20s4 exposed from the metal film 22, the whisker described above is not formed. Therefore, between each of the side surfaces 20s3 and 20s4 and the upper surface 20t, an inclined surface equivalent to the inclined surface 20p shown in FIG. 10 need not be interposed. Consequently, as shown in FIG. 11, each of the side surfaces 20s3 and 20s4 is continued to the upper surface 20t of the metal plate 20. In other words, the side surface 20s3 and the upper surface 20t cross each other and the side surface 20s4 and the upper surface 20t cross each other. In the case where an inclined surface equivalent to the inclined surface 20p shown in FIG. 10 is thus not interposed between each of the side surfaces 20s3 and 20s4 and the upper surface 20t, the efficiency of the working operation can be increased when the metal plate 20 is worked to be formed with the inclined surface 20p.

As shown in FIG. 3, the plurality of side surfaces 20s of the metal plate 20 include the side surface 20s5 continued to the end portion of the side surface 20s3 and having a portion exposed from the sealing body 40 and a side surface 20s6 continued to the end portion of the side surface 20s4 and having a portion exposed from the sealing body 40. Also, as shown in FIG. 4, each of the side surfaces 20s5 and 20s6 is disposed between the side surfaces 20s1 and 20s2 in plan view. Also, as shown in FIG. 12, each of the side surfaces 20s5 and 20s6 is covered with the metal film 22.

As shown in FIG. 12, the side surface 20s5 is continued to the upper surface 20t and the side surface 20s6 is continued to the upper surface 20t. In other words, the side surface 20s5 and the upper surface 20t cross each other and the side surface 20s6 and the upper surface 20t cross each other. In the example shown in FIG. 12, the side surface 20s5 and the upper surface 20t are orthogonal to each other and the side surface 20s6 and the upper surface 20t are orthogonal to each other. In this case, it can be considered that, on each of the vicinity of a side 20m4 where the side surface 20s5 and the upper surface 20t cross each other and the vicinity of a side 20m5 where the side surface 20s6 and the upper surface 20t cross each other, the current density may be concentrated in the plating step.

However, as described above, the place at which the concentration of the current density is likely to occur is the peripheral edge portion of the side surface 20s2 (see FIG. 9) where the direction in which the current flows suddenly changes. As a result, the current density is more likely to be concentrated on the vicinity of each of the sides 20m4 and 20m5 shown in FIG. 12 than on the vicinity of the side 20m3 shown in FIG. 9. Accordingly, even when the sides 20m4 and 20m5 are covered with the metal film 22, variations are less likely to occur in the thickness of the metal film 22. Therefore, in the example shown in FIG. 12, an inclined surface equivalent to the inclined surface 20p shown in FIG. 9 is interposed neither between the side surface 20s5 and the upper surface 20t nor between the side surface 20s6 and the upper surface 20t.

In the case where an inclined surface equivalent to the inclined surface 20p shown in FIG. 9 is thus interposed neither between the side surface 20s5 and the upper surface 20t nor between the side surface 20s6 and the upper surface 20t, when the inclined surface 20p is formed by working the metal plate 20, the efficiency of the working operation can be increased.

However, on the vicinity of each of the sides 20m4 and 20m5 shown in FIG. 12, the current density may be more highly concentrated than on, e.g., the middle region between the sides 20m4 and 20m5. Accordingly, in a modification of the present embodiment, respective inclined surfaces equivalent to the inclined surface 20p shown in FIG. 9 may also be interposed between the side surface 20s5 and the upper surface 20t and between the side surface 20s6 and the upper surface 20t in the same manner as in a semiconductor device PKG3 shown in FIGS. 29 to 31 and described later.

<Method of Manufacturing Semiconductor Device>

Figure 13:
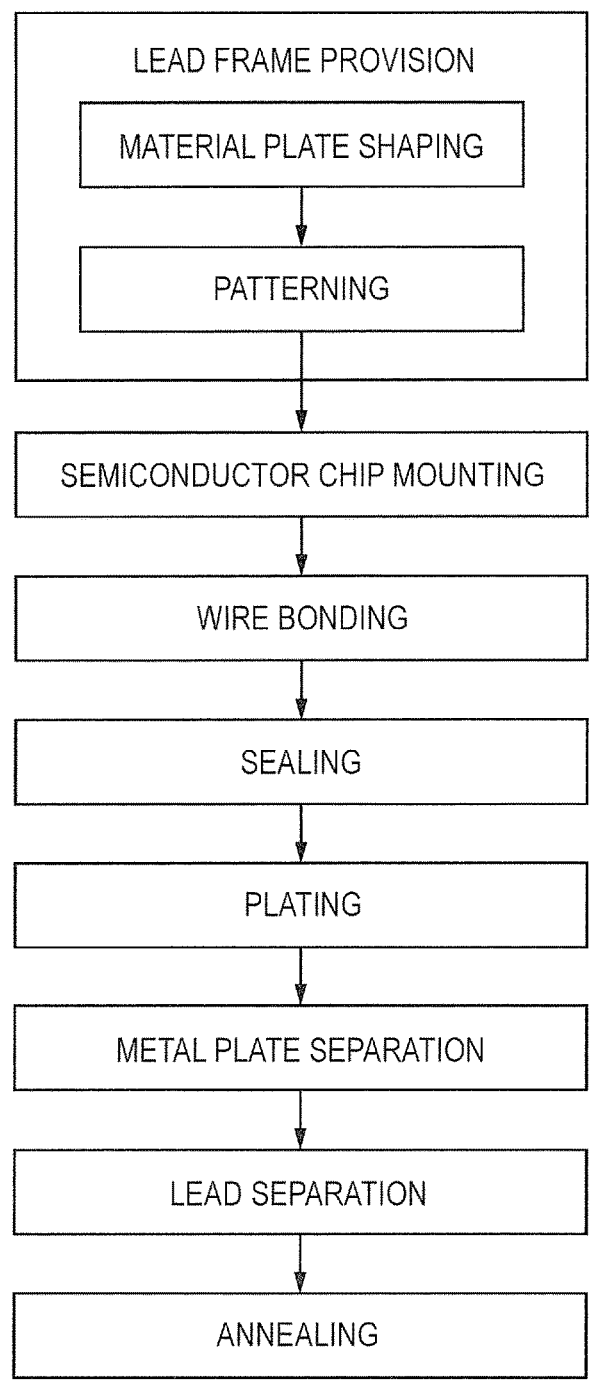
FIG. 13 is an illustrative view showing the outline of the manufacturing process of the semiconductor device described using FIGS. 1 to 12.

Next, a description will be given of the manufacturing process of the semiconductor device PKG1 described using FIGS. 1 to 12. The semiconductor device PKG1 is manufactured along the flow shown in FIG. 13. FIG. 13 is an illustrative view showing the outline of the manufacturing process of the semiconductor device described using FIGS. 1 to 12.

<Lead Frame Provision Step>

Figure 14:
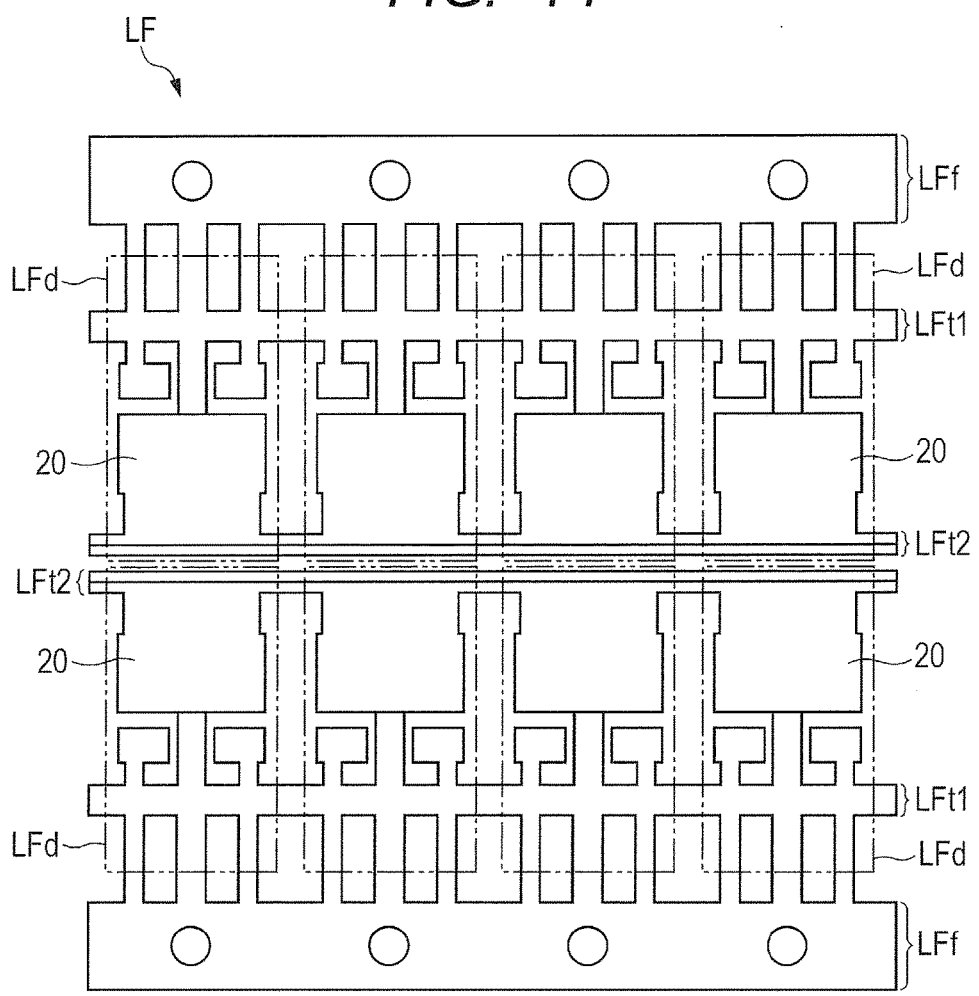
FIG. 14 is an enlarged plan view showing a portion of a lead frame provided in the lead frame provision step shown in FIG. 13.
Figure 15:
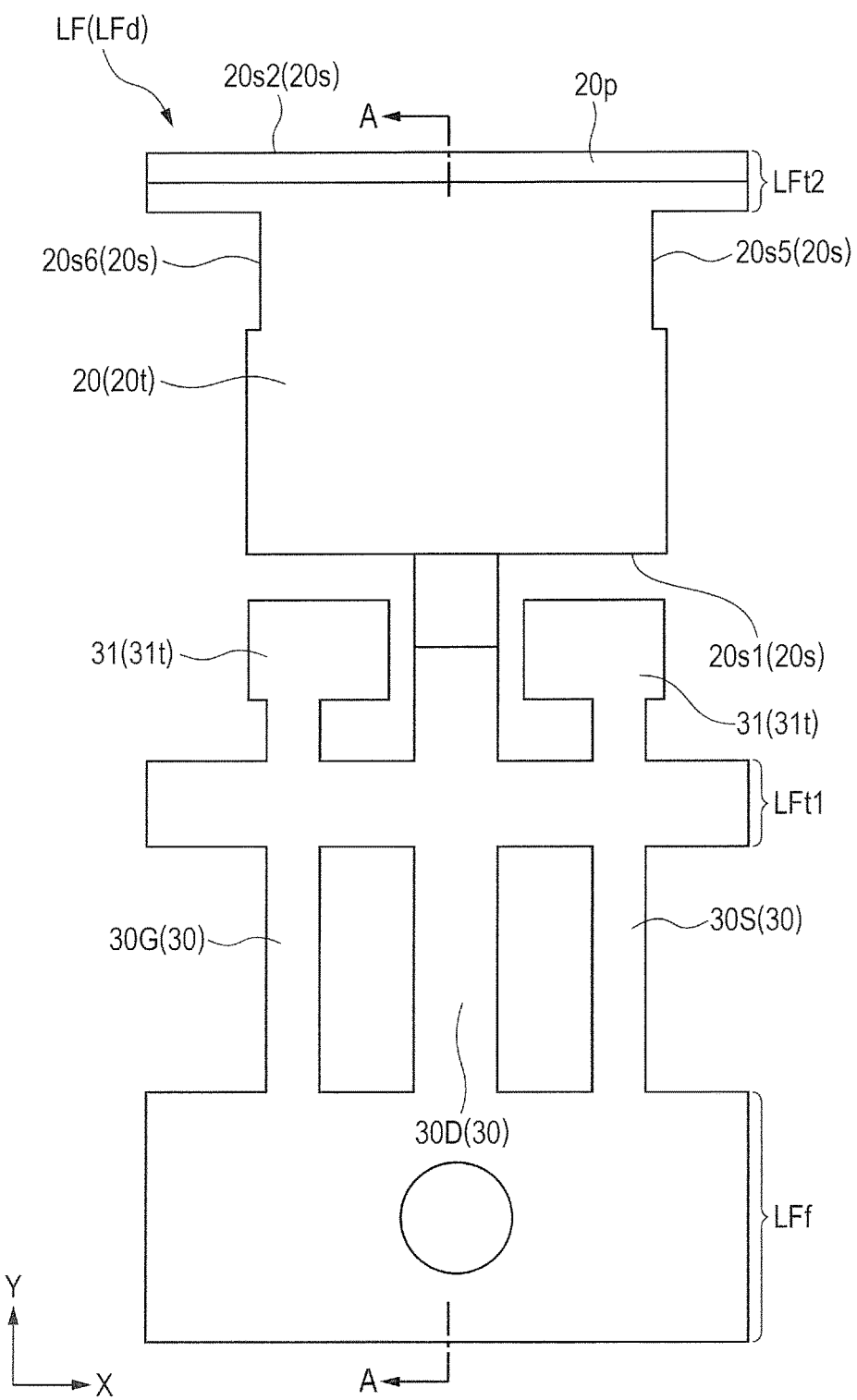
FIG. 15 is an enlarged plan view of each one of the device formation portions shown in FIG. 14.
Figure 16:
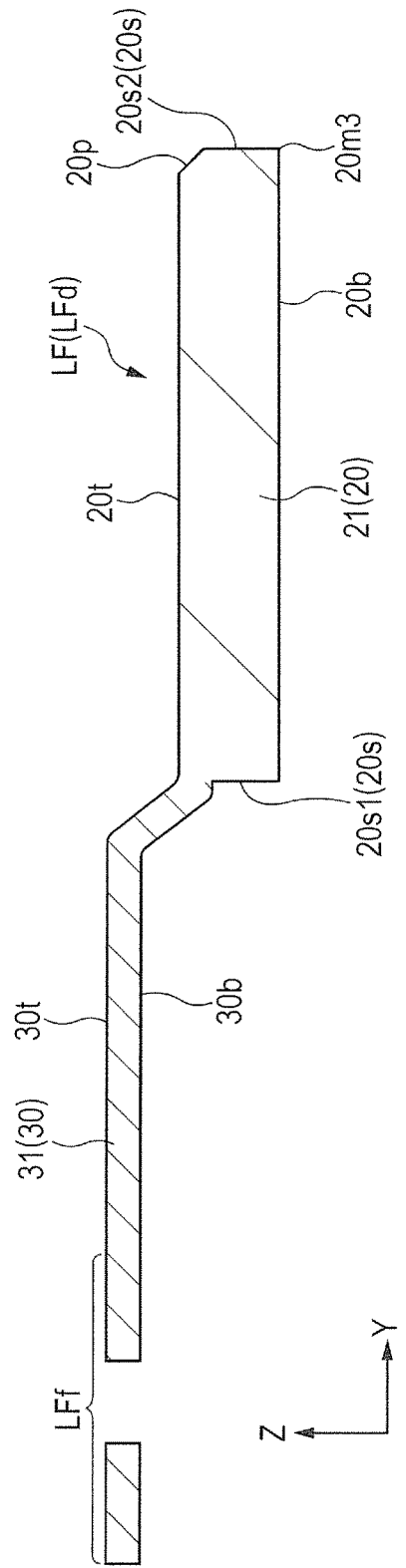
FIG. 16 is an enlarged cross-sectional view along the line A-A in FIG. 15.
Figure 17:
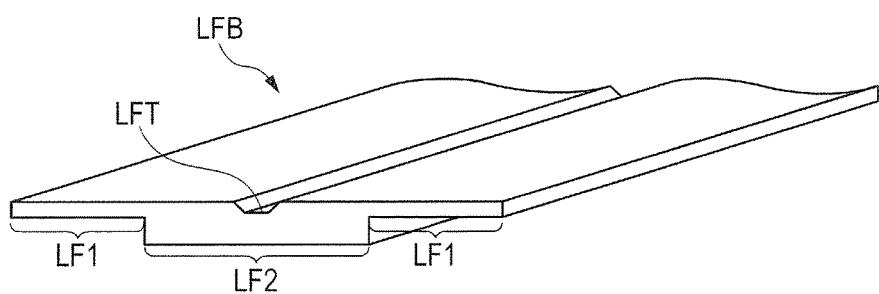
FIG. 17 is an enlarged perspective view showing an example of the shape of a material plate shaped in the material plate shaping step shown in FIG. 13.
Figure 18:
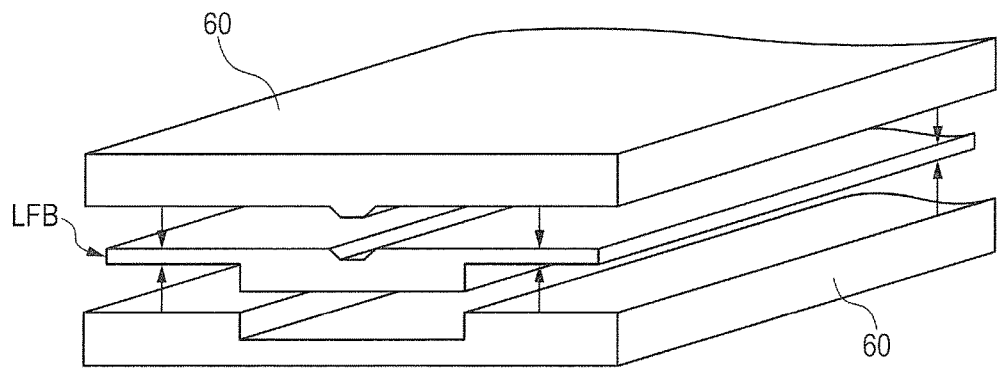
FIG. 18 is an enlarged perspective view showing an example of a state where the groove formed in the material plate shown in FIG. 17 is formed by press working.
Figure 19:
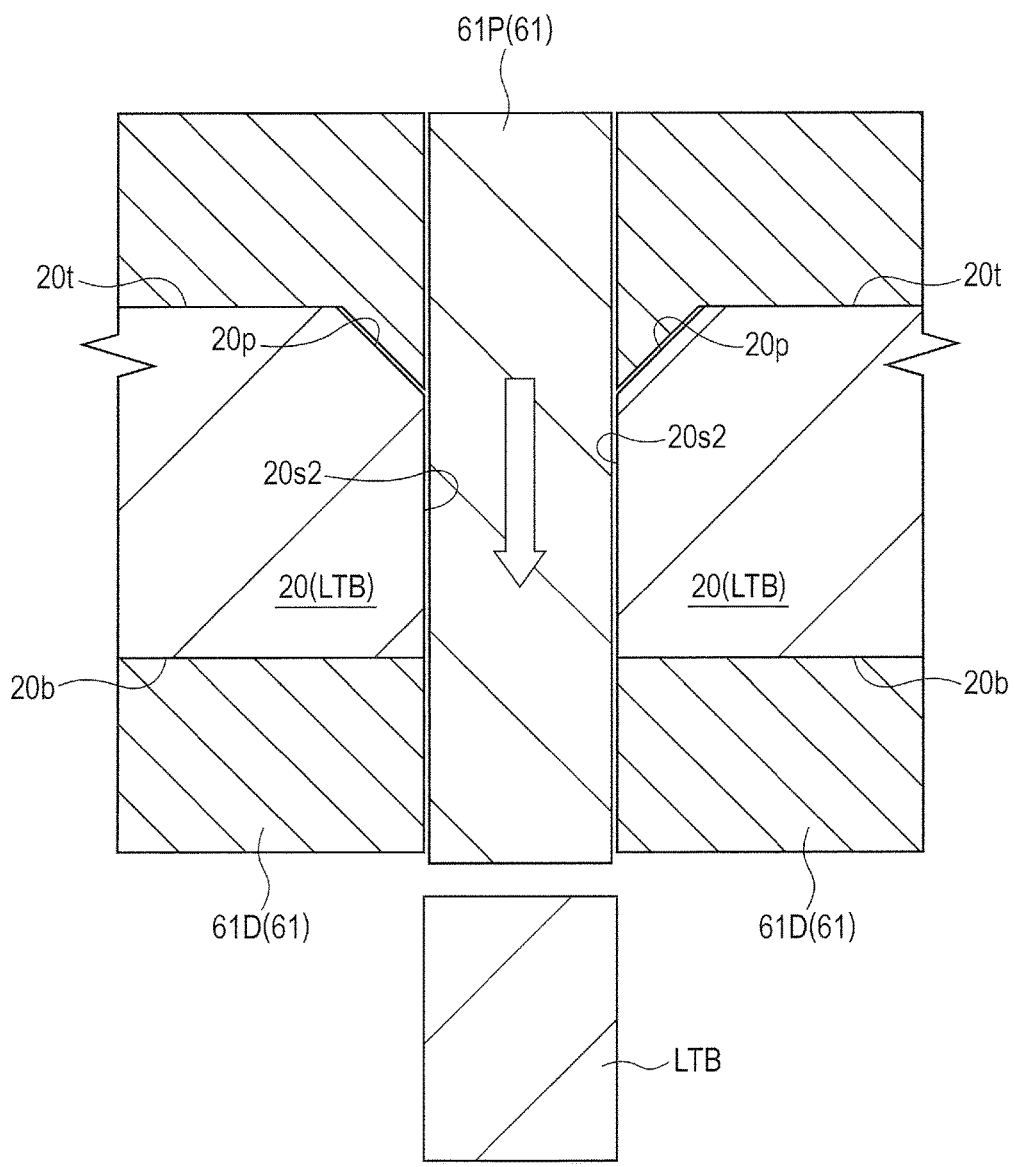
FIG. 19 is an enlarged cross-sectional view showing a state where a portion of the material plate is removed by press working in the patterning step shown in FIG. 13.

First, in the lead frame provision step shown in FIG. 13, a lead frame LF shown in FIGS. 14 to 16 is provided. FIG. 14 is an enlarged plan view showing a portion of the lead frame provided in the lead frame provision step shown in FIG. 13. FIG. 15 is an enlarged plan view of one of the device formation portions shown in FIG. 14. FIG. 16 is an enlarged cross-sectional view along the line A-A in FIG. 15. FIG. 17 is an enlarged perspective view showing an example of the shape of a material plate shaped in the material plate shaping step shown in FIG. 13. FIG. 18 is an enlarged perspective view showing an example of a state where a groove is formed in the material plate shown in FIG. 17 by press working. FIG. 19 is an enlarged cross-sectional view showing a state where a portion of the material plate is removed by press working in the patterning step shown in FIG. 13.

As shown in FIG. 14, the lead frame LF provided in this step includes a plurality of device formation portions LFd coupled to a frame portion LFf. FIG. 14 shows the eight device formation portions LFd. Each of the device formation portions LFd corresponds to the one semiconductor device PKG1 shown in FIG. 5. The lead frame LF is a so-called multi-piece base material in which the plurality of device formation portions LFd are arranged in rows and columns. By thus using the lead frame LF including the plurality of device formation portions LFd, a plurality of the semiconductor devices PKG1 (see FIG. 3) can simultaneously be manufactured to allow an improvement in manufacturing efficiency. FIG. 14 shows an example in which the plurality of device formation portions LFd are arranged in two rows along the X-direction. However, the number of the rows in which the device formation portions LFd are arranged has various modifications. The number of the rows in which the device formation portions LFd are arranged may be, e.g., one or three or more. However, in terms of the ease of shaping of a material plate (see FIG. 17) LFB, the device formation portions LFd are preferably arranged in two rows, as shown in FIG. 14.

The lead frame LF is made of a metal material containing, e.g., copper (Cu) as a main component. The thickness of the portion of the metal plate 20 is, e.g., about 400 µm to 2 mm, while the thickness of the other portion thereof is, e.g., about 125 µm to 400 µm.

Each of the plurality of device formation portions LFd is coupled to the frame portion LFf. The frame portion LFf is a supporting portion which supports each of the members formed in the device formation portions LFd till the lead separation step shown in FIG. 13.

Also, as shown in FIGS. 15 and 16, in the device formation portion LFd, the metal plate 20 and the plurality of leads 30 which have been described using FIGS. 3 to 12 are formed. The metal plate 20 is connected to the frame portion LFf via one of the plurality of leads 30 and supported by the frame portion LFf. Also, each of the plurality of leads 30 is connected to and supported by the frame portion LFf and supported by the frame portion LFf.

The plurality of leads 30 are connected to each other via a tie bar LFt1. In the example shown in FIGS. 14 and 15, a plurality of the metal plates 20 are connected to each other via a tie bar LFt2. As shown in FIG. 15, the tie bar LFt2 is disposed over the end portion of the device formation portion LFd which is opposite to the plurality of leads 30 and includes the side surface $20s2$ opposite to the side surface $20s1$ facing the plurality of leads 30. The tie bar LFt2 is also formed with the inclined surface $20p$.

For example, the lead frame LF shown in FIGS. 14 to 16 are manufactured as follows. That is, in the material plate shaping step shown in FIG. 13, a metal material is shaped as shown in FIG. 17 to form the material plate LFB having a plurality of portions having different thicknesses. The material plate LFB has portions LF1 each having a relatively small thickness and a portion LF2 having a thickness smaller than those of the portions LF1. The thickness of each of the portions LF1 corresponds to the thickness of the base material 31 of each of the leads 30 shown in FIG. 6. Also, the thickness of the portion LF2 corresponds to the thickness of the base material 21 of the metal plate 20 shown in FIG. 6. However, at the stage at which the material plate shaping step has been completed, the thickness of each of the portions LF1 and the thickness of the base material 31 of each of the leads 30 need not be equal to each other, while the thickness of the portion LF2 and the thickness of the base material 21 of the metal plate 20 need not be equal to each other.

As a method of forming the portions LF1 and LF2 of the material plate LFB, e.g., roll working, press working, or both of roll working and press working for a metal material can be used.

Also, in the example shown in FIG. 17, in the portion LF2 of the material plate LFB, a groove LFT is formed. The groove LFT is a portion corresponding to the inclined surface $20p$ of the metal plate 20 shown in FIG. 9 and is formed by, e.g., press working using die plates 60, as shown in FIG. 18. In the example shown in FIG. 18, the groove LFT of the material plate LFB is formed by placing the material plate LFB between the die plates 60 disposed to face the material plate LFB and causing the material plate LFB to be held and pressed between the die plates 60.

Next, in the patterning step shown in FIG. 13, the material plate LFB shown in FIG. 17 is subjected to a patterning process to form the lead frame LF shown in FIG. 14. In the patterning step, the material plate LFB is patterned by removing a portion of the material plate LFB such that such portions as the metal plate 20, the plurality of leads 30, the frame portions LFf, and the tie bar LFt2 each shown in FIG. 15 have predetermined shapes. A method of removing a portion of the material plate LFB may be, e.g., press working, etching, or a combination thereof. In the case of performing patterning by etching, the side surface $20s2$ shown in FIG. 9 is likely to have a curved surface. Accordingly, the patterning process for the portion LF2 corresponding to the metal plate 20 shown in FIG. 9 is preferably press working using a die. In the case of forming the entire lead frame LF by press working, the metal plate 20 and the portions other than the metal plate 20 can also be formed simultaneously. The inclined surface $20p$ of the metal plate 20 shown in FIG. 9 is formed by press working in the material plate shaping step or the patterning step shown in FIG. 13.

As can be seen from the comparison between FIGS. 17 and 14, in the example of the patterning step shown in the present embodiment, a portion of the groove LFT shown in FIG. 17 is removed along the extending direction of the groove LFT to divide the material plate LFB into two rows. At this time, in the case of removing a portion of the groove LFT (see FIG. 17) by press working using a die 61 including a punch 61P and a die 61D as illustrated in, e.g., FIG. 19, a small curved surface may be formed along the peripheral edge portion of the side surface $20s2$ due to the clearance between the punch 61P and the die 61D. For example, in the case of pressing the punch 61P from the upper surface $20t$ of the metal plate 20 against the lower surface $20b$ thereof, a small curved surface may be formed at the boundary between the side surface $20s2$ and the inclined surface $20p$. Conversely, in the case of pressing the punch 61P from the lower surface $20b$ of the metal plate 20 against the upper surface $20t$ thereof, a small curved surface may be formed at the boundary between the lower surface $20b$ and the side surface $20s2$.

However, according to the study by the present inventors, the radius of curvature of the curved surface thus formed due to the clearance during the press working is about several micrometers to several tens of micrometers, which is less than 5% of the thickness of the metal plate 20. Accordingly, it has been found that the effect of suppressing the concentration of the current density in the plating step cannot substantially be expected at the curved surface formed due to the clearance during the press working.

In the example shown in FIG. 19, the punch 61P moves from the upper surface $20t$ of the metal plate 20 toward the lower surface $20b$ thereof. In this case, a stress when a portion of the material plate LFB is cut is applied to the lower surface $20b$ so that the inclined surface $20p$ is less likely to be deformed under the influence of the press working. However, in a modification, the punch 61P may also move from the lower surface $20b$ of the metal plate 20 toward the upper surface $20t$ thereof.

Note that, after the material plate shaping step or the patterning step shown in FIG. 13, it may also be possible to partially or entirely plate the material plate LFB (see FIG. 17) and form, e.g., a nickel (Ni) plating film, a copper (Cu) plating film, or a silver (Ag) plating film, though not shown in FIG. 13. By forming such a plating film, the strength of the coupling between the die bonding material 11 and the metal plate 20 shown in FIG. 6 or the strength of the coupling between the wires 12 and the leads 30 shown in FIG. 5 can be improved.

<Semiconductor Chip Mounting Step>

Figure 20:
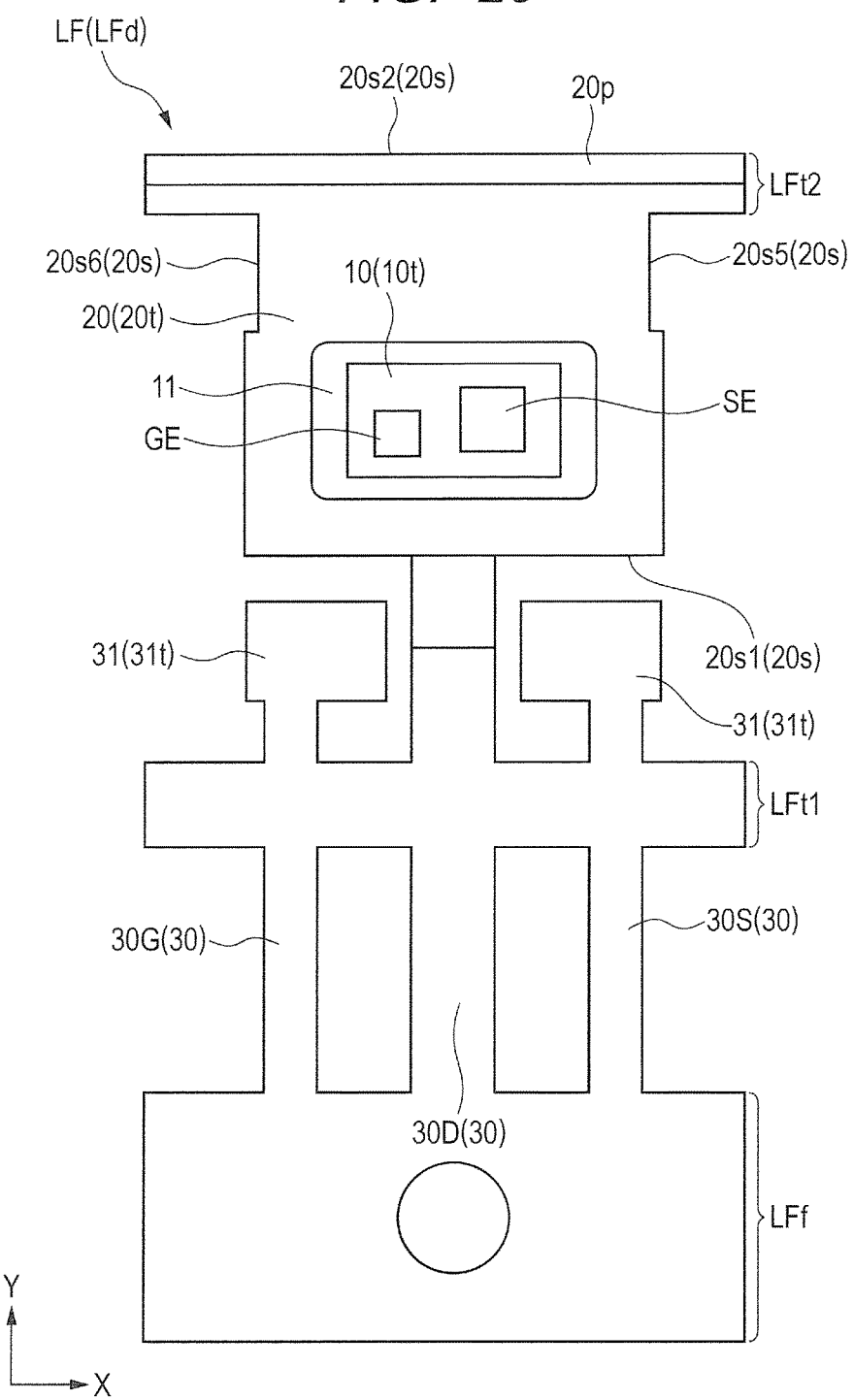
FIG. 20 is an enlarged plan view showing a state where a semiconductor chip is mounted over the die pad shown in FIG. 15.

Next, in the semiconductor chip mounting step shown in FIG. 13, as shown in FIG. 20, the semiconductor chip 10 is mounted over the metal plate 20 of the lead frame LF. FIG. 20 is an enlarged plan view showing a state where the semiconductor chip is mounted over the die pad shown in FIG. 15.

In this step, the semiconductor chip 10 is mounted over the upper surface 20t of the metal plate 20 formed integrally with the lead 30D as the drain terminal via the die bonding material 11. As shown in FIG. 6 already described, the semiconductor chip 10 is bonded and fixed such that the back surface 10b formed with the drain electrode DE faces the upper surface 20t of the metal plate 20 as the chip mounting surface via the die bonding material 11. As a result, the source electrode pad SE and the gate electrode pad GE of the semiconductor chip 10 are exposed, as shown in FIG. 20. On the other hand, as shown in FIG. 6, the drain electrode DE of the semiconductor chip 10 is electrically coupled to the metal plate 20 via the die bonding material 11 as the conductive coupling material.

In this step, after the die bonding material 11 is applied onto the upper surface 20t of the metal plate 20, the semiconductor chip 10 is placed over the die bonding material 11. Then, by curing the die bonding material, the semiconductor chip 10 is fixed to the metal plate 20.

As the die bonding material 11, e.g., a solder material may also be used. Alternatively, the die bonding material 11 may also be a conductive resin adhesive material referred to as a so-called silver (Ag) paste including a plurality of silver (Ag) grains (Ag filler). When the die bonding material 11 is a solder material, as a method of curing the die bonding material, a reflow process is performed. Alternatively, when the die bonding material 11 is the conductive resin adhesive material, the thermosetting resin component included in the die bonding material 11 is heated to be cured.

Note that a metal film (the illustration thereof is omitted) having higher adhesion to the die bonding material 11 than that of copper (Cu) or a copper alloy as the base material of the metal plate 20 may also be formed over a portion of the upper surface 20t of the metal plate 20, though the illustration thereof is omitted. This can improve the adhesion strength between the die bonding material 11 and the metal plate 20.

<Wire Bonding Step>

Figure 21:
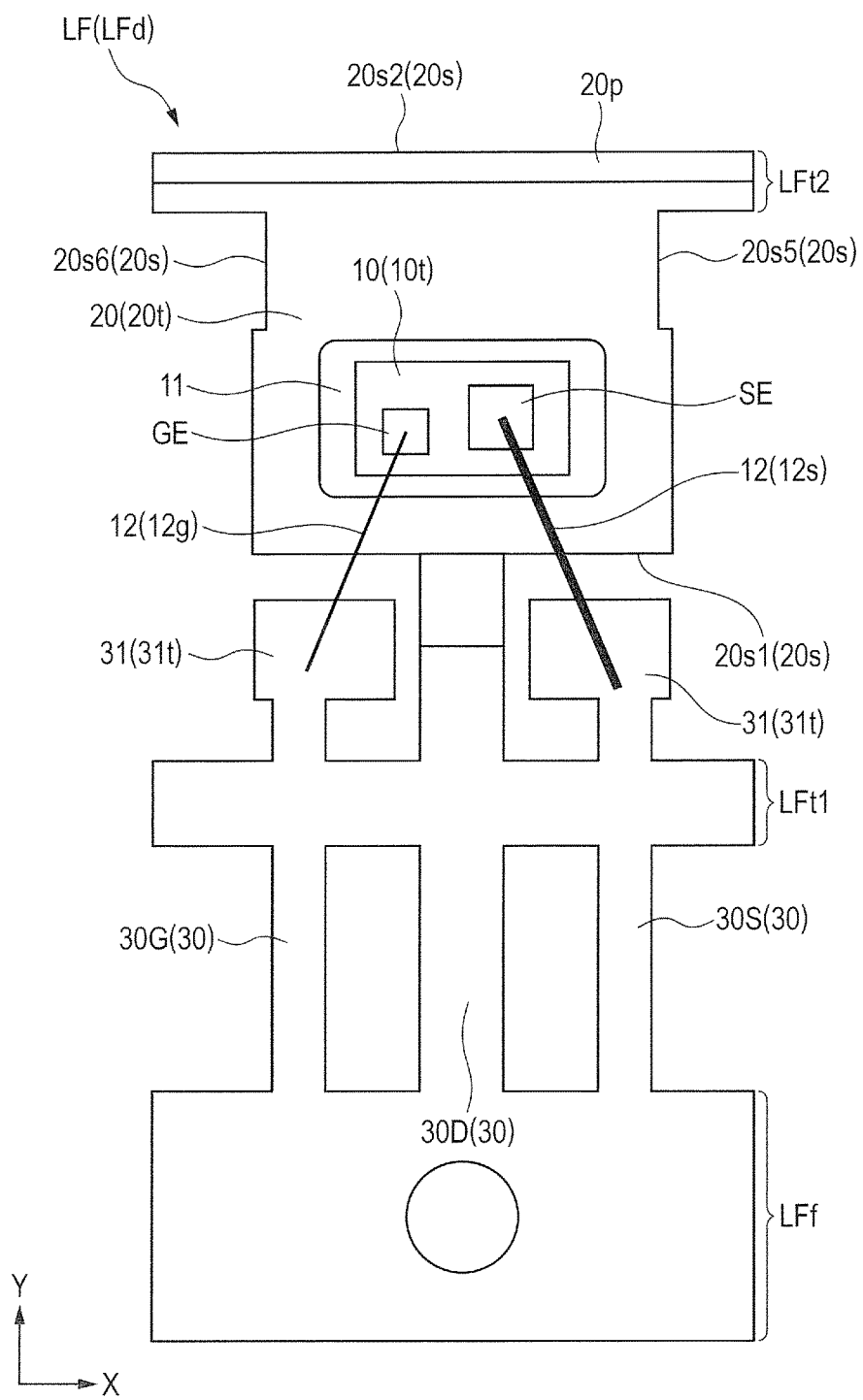
FIG. 21 is an enlarged plan view showing a state where the semiconductor chip shown in FIG. 20 is electrically coupled to a gate lead and a source lead via metal wires.

In the wire boding step shown in FIG. 13, as shown in FIG. 21, the plurality of electrode pads of the semiconductor chip 10 are electrically coupled respectively to the plurality of leads 30 via the wires (metal wires) 12. FIG. 21 is an enlarged plan view showing a state where the semiconductor chip shown in FIG. 20 is electrically coupled to the gate lead via the metal wire.

In this step, the gate electrode pad GE of the semiconductor chip 10 is electrically coupled to the lead 30G via the wire 12g. Also, in this step, the source electrode pad SE of the semiconductor chip 10 is electrically coupled to the lead 30S via the wire 12s. As a method of coupling the wires 12, various modifications can be used. For example, using a wire bonding tool not shown, each of the wires 12 is thermally compressed with an ultrasonic wave being applied to the respective coupled portions of the wire 12 and the electrode pad or the lead 30.

In the example shown in FIG. 21, the diameter of the wire 12s is larger than the diameter of the wire 12g. This can increase the cross-sectional area of the wiring path coupled to the source electrode pad SE. However, the respective thicknesses of the plurality of wires 12 may also be the same. Alternatively, the source electrode pad SE of the semiconductor chip 10 may also be electrically coupled to the lead 30S via a plurality of the wires 12s.

<Sealing Step>

Figure 22:
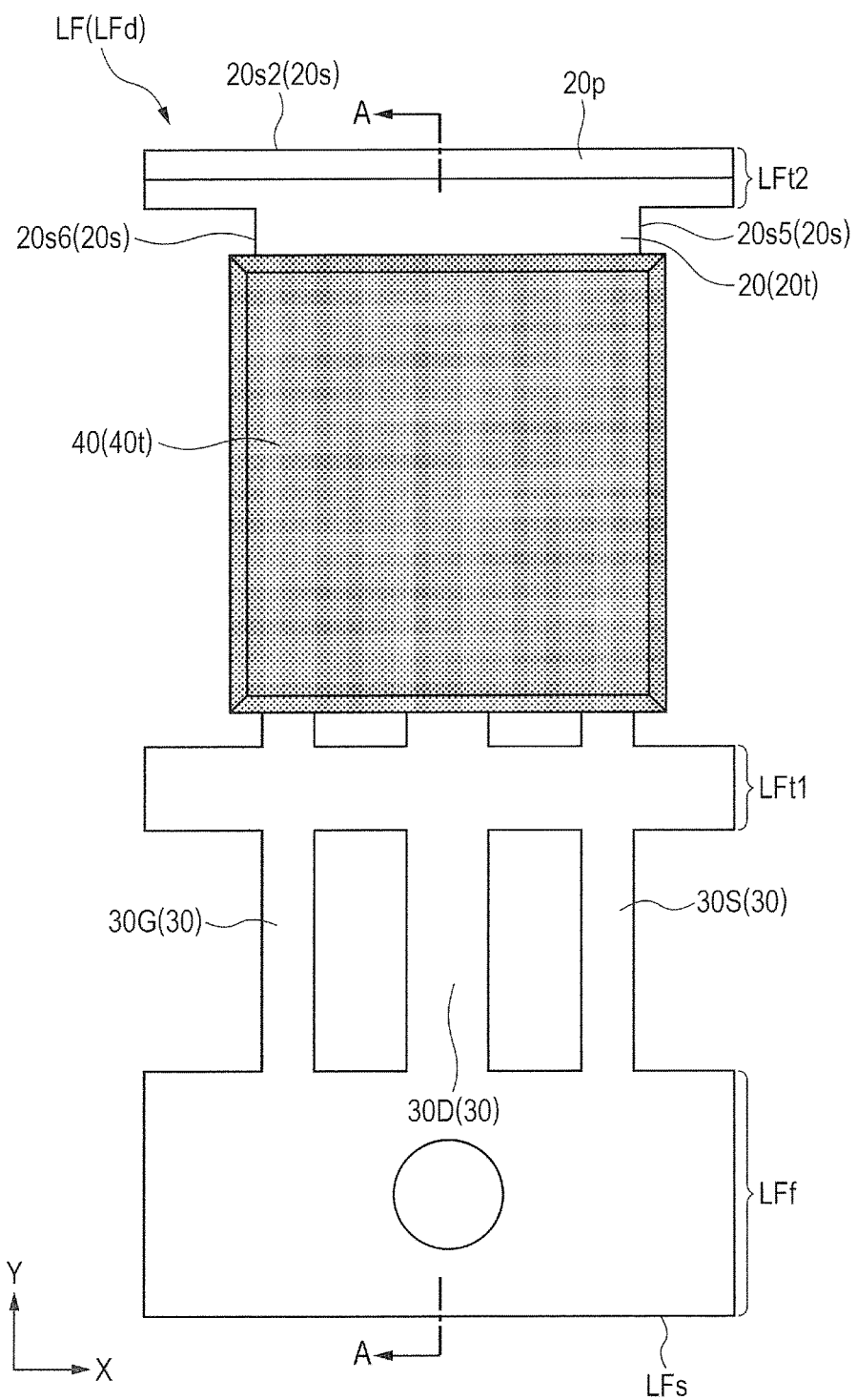
FIG. 22 is an enlarged plan view showing a state where a sealing body sealing the semiconductor chip and the wires shown in FIG. 21 is formed.
Figure 23:
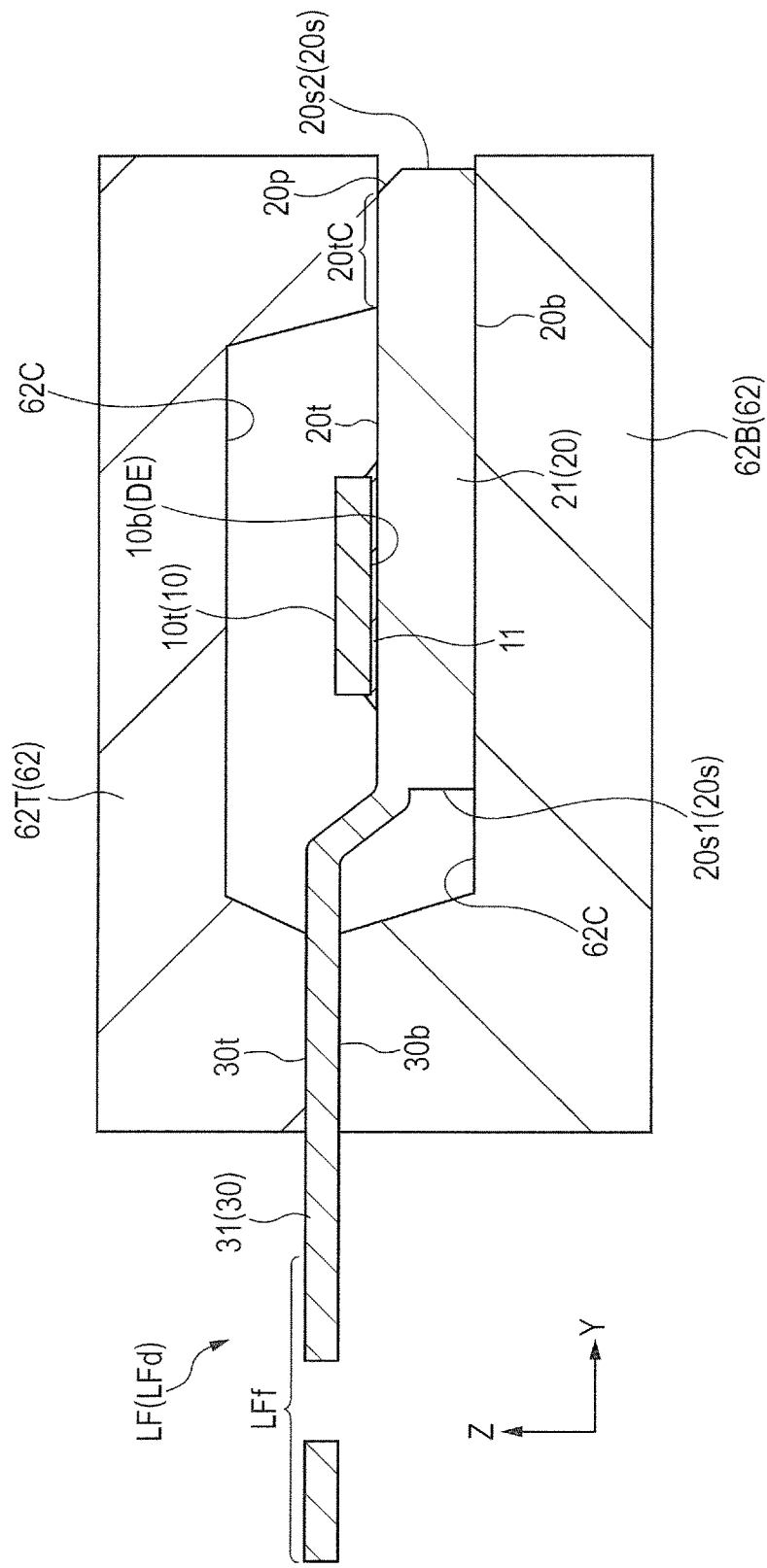
FIG. 23 is an enlarged cross-sectional view showing a state where a lead frame is placed in a mold in a cross section along the line A-A in FIG. 22.

Next, in the sealing step shown in FIG. 13, the semiconductor chip 10, a portion of the metal plate 20, respective portions of the plurality of leads 30, and the plurality of wires 12 which are shown in FIG. 21 are sealed with an insulating resin to form the sealing body 40 shown in FIG. 22. FIG. 22 is an enlarged plan view showing a state where the sealing body sealing the semiconductor chip and the wires which are shown in FIG. 21 is formed. FIG. 23 is an enlarged cross-sectional view showing a state where the lead frame is placed in a mold in a cross section along the line A-A in FIG. 22.

In this step, as shown in FIG. 23, e.g., the sealing body 40 is formed by a so-called transfer mold method using a mold 62 including a top plate (first plate) 62T and a bottom plate (second plate) 62B.

In the example shown in FIG. 23, the lead frame LF is placed such that the metal plate 20 and the respective portions of the plurality of leads 30 in the device formation portion LFD are located in a cavity 62C formed between the top and bottom plates 62T and 62B. Then, the lead frame LF is clamped by (held between) the top and bottom plates 62T and 62B. When a softened (plasticized) thermosetting resin (insulating resin) is pressed into the cavity 62C of the mold 62 in this state, the insulating resin is supplied into the space formed by the cavity 62C and the bottom plate 62B and molded into the shape of the cavity 62C.

At this time, as shown in FIG. 23, a portion (exposed portion 20tC) of the upper surface 20t of the metal plate 20 which is continued to the inclined surface 20p is pressed by the top plate 62T. In the example shown in FIG. 23, the portion (exposed portion 20tC) of the upper surface 20t of the metal plate 20 which is continued to the inclined surface 20p is in close contact with the top plate 62T. On the other hand, the lower surface 20b of the metal plate 20 is pressed by the bottom plate 62B. In the example shown in FIG. 23, the entire lower surface 20b of the metal plate 20 is in close contact with the bottom plate 62B. As a result, as shown in FIG. 23, after this step, a portion of the metal plate 20 including the inclined surface 20p and the side surface 20s2 is exposed from the sealing body 40.

The sealing body 40 is formed mainly of the insulating resin but, by mixing filler particles such as, e.g., silica (silicon dioxide $SiO_2$) particles in the thermosetting resin, the function (e.g., resistance to warping deformation) of the sealing body 40 can be improved.

<Plating Step>

Figure 24:
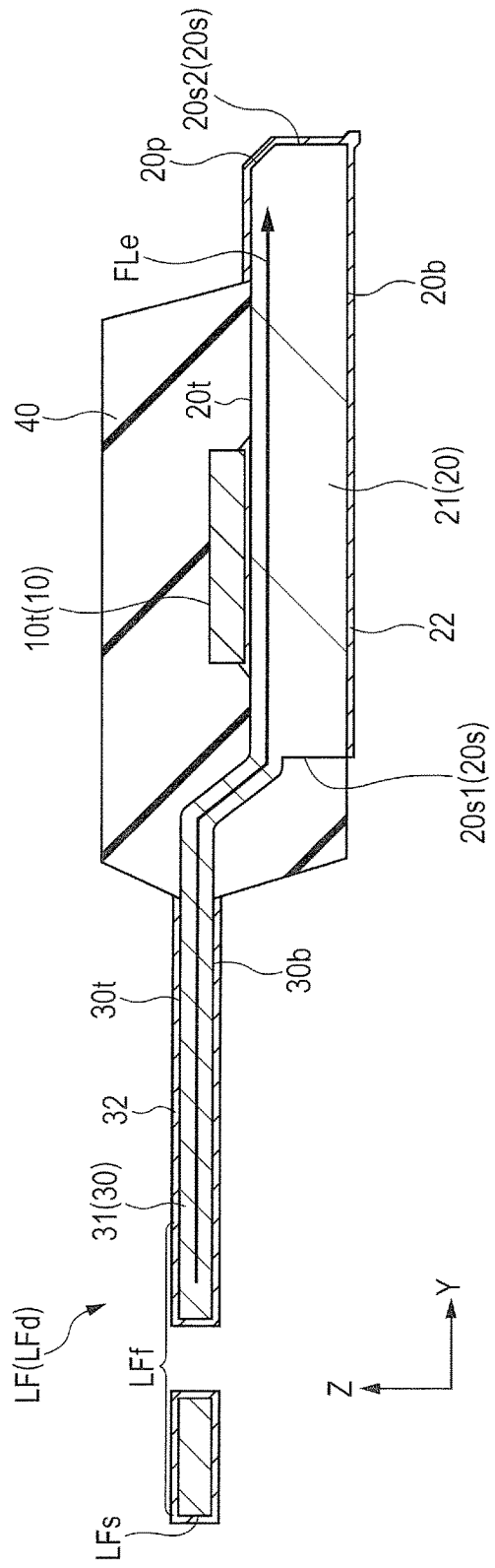
FIG. 24 is an enlarged cross-sectional view showing a state where a metal film (plating film) is formed over the surface of the lead frame shown in FIG. 22 which is exposed from the sealing body.
Figure 25:
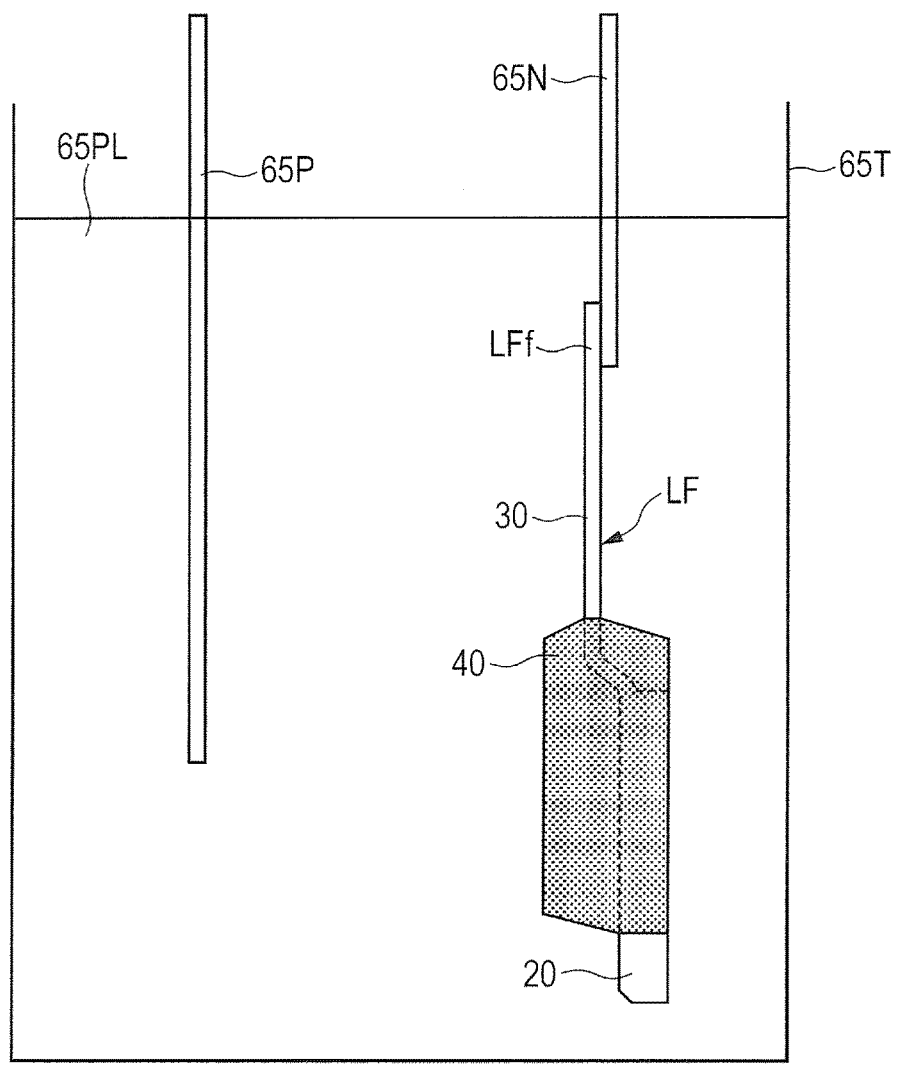
FIG. 25 is an illustrative view showing the outline of a plating step using an electrolytic plating method.

Next, in the plating step shown in FIG. 13, as shown in FIG. 24, the lead frame LF is immersed in a plating solution not shown to allow the metal film 22 to be formed over the top surface of the metal portion exposed from the sealing body 40. FIG. 24 is an enlarged cross-sectional view showing a state where a metal film (plating film) is formed over the surface of the lead frame shown in FIG. 22 which is exposed from the sealing body. FIG. 25 is an illustrative view showing the outline of the plating step in accordance with an electrolytic plating method. Note that, in FIG. 24, an example of the direction in which electrons flow in the plating step is schematically shown by the arrow. The direction in which a current flows in the plating step is opposite to the direction in which electrons flow.

In this step, the metal films 22 and 32 (see FIG. 24) made of, e.g., a solder are formed over the top surface of the metal member exposed from the resin by an electrolytic plating method. In the electrolytic plating method, as shown in FIG. 25, the lead frame LF as a target object to be plated is placed in a plating tank 65T containing a plating solution 65PL. At this time, the target object is coupled to a cathode 65N in the plating tank 65T. For instance, in the example shown in FIG. 25, the frame portion LFf of the lead frame LF is electrically coupled to the cathode 65N. Then, for example, a dc voltage is applied between the cathode 65N and an anode 65P similarly placed in the plating tank 65T to form the metal films 22 and 32 (see FIG. 24) over the exposed surfaces of the metal members coupled to the frame portion LFf of the lead frame LF. That is, in the present embodiment, the metal films 22 and 32 are formed by a so-called electrolytic plating method.

Note that, in the plating step, before the lead frame LF is immersed in the plating solution 65PL shown in FIG. 25, chemical polishing may also be performed as pretreatment on the respective top surfaces of the metal plate 20 and the leads 30 shown in FIG. 24. By performing the pretreatment before the lead frame LF is immersed in the plating solution 65PL, it is possible to remove, e.g., an oxide film over the top surface of the lead frame LF exposed from the sealing body 40 (see FIG. 24) or minute burrs.

The metal films 22 and 32 in the present embodiment are made of a so-called lead-free solder which does not substantially contain lead (Pb). Examples of the lead-free solder include a pure tin (Sn) solder, a tin-bismuth (Sn—Bi) solder, and a tin-copper-silver (Sn—Cu—Ag) solder. Accordingly, the plating solution 65PL used in this plating step is an electrolytic plating solution containing a metal salt such as, e.g., $Sn^{2+}$ or $Bi^{3+}$. Note that the following description will be given of a Sn-Bi alloyed metal plating as an example of a lead-free solder plating. However, it is possible to replace the plating solution 65PL with an electrolytic plating solution in which bismuth (Bi) is replaced with a metal such as copper (Cu) or silver (Ag) or which also contains copper (Cu) or silver (Ag) in addition to bismuth (Bi).

In the present embodiment, the plating step is performed in a state where the metal plate 20 is electrically coupled to the frame portion LFf via the leads 30. When a voltage is applied between the anode 65P and the cathode 65N which are shown in FIG. 25 in a state where the lead frame LF is immersed in the plating solution 65PL, conduction is provided between the leads 30 and the metal plate 20, which are coupled to the cathode 65N, and the anode 65P through the plating solution 65PL. At this time, $Sn^{2+}$ and $Bi^{3+}$ in the plating solution 65PL precipitate in a predetermined proportion at the respective surfaces of the leads 30 and the metal plate 20 which are exposed from the sealing body 40 to form the metal films 22 and 32 shown in FIG. 24. The respective thicknesses of the metal films 22 and 32 can be varied in accordance with the specifications of products. For example, films having thicknesses of about 7 μm to 15 μm are deposited as the metal films 22 and 32.

As shown in FIG. 25, in the case of forming the metal films 22 and 32 (see FIG. 24) by an electrolytic plating method, a current flows in the leads 30 of the lead frame LF and in the metal plate 20. For instance, in the example shown in FIG. 24, a direction FLe in which electrons flow in the plating step extends from the side surface 20s1 toward the side surface 20s2 in the metal plate 20. In other words, in the example shown in FIG. 24, a current flows from the side surface 20s2 of the metal plate 20 toward the side surface 20s1 thereof. In the case of using the electrolytic plating method, the speeds at which the metal films 22 and 32 precipitate differ depending on the current density. Specifically, the metal films 22 and 32 tend to have larger thicknesses around the portion where the current density is high.

The current density tends to be relatively low in those of the plurality of side surfaces of the metal plate 20 which are along the direction in which a current (or electrons) flows. On the other hand, the current density tends to be relatively high in those of the plurality of side surfaces of the metal plate 20 which cross the direction in which a current (or electrons) flows. Accordingly, in the side surfaces 20s1 and 20s2 among the plurality of side surfaces of the metal plate 20, the current density particularly tends to be higher.

When the distribution of the current density in the side surface 20s2 is examined, the current density tends to be higher in the peripheral edge portion of the side surface 20s2. Also, in the part of the portion of the metal plate 20 which is exposed from the sealing body 40 which has an angle of not more than 90 degrees, the current density tends to be higher. For example, as has been described using FIG. 34, in the case where the side surface 20s2 is continued to the upper surface 20t and the angle formed between the side surface 20s2 and the upper surface 20t is not more than 90 degrees, the current density particularly tends to be higher in the vicinity of the side where the side surface 20s2 and the upper surface 20t cross each other. As a result, in the vicinity of the side where the side surface 20s2 and the upper surface 20t cross each other, a portion 22P1 having a relatively large thickness is formed in the metal film 22h.

On the other hand, in the present embodiment, as has been described using FIGS. 8 and 9, the inclined surface 20p interposed between the side surface 20s2 and the upper surface 20t is formed before the plating step. Consequently, each of the angles θ1 and θ2 shown in FIG. 8 is an obtuse angle larger than 90 degrees. As a result, in the present embodiment, it is possible to inhibit a locally thicker portion, such as the portion 22P1 shown in FIG. 34, from being formed in the plating step. Note that, in the case in the present embodiment, the side surface 20s2 and the lower surface 20b which are shown in FIG. 24 cross each other at an angle of, e.g., not more than 90 degrees. Accordingly, as has been described using FIG. 9, the current density tends to be locally higher around the side 20m3 where the side surface 20s2 and the lower surface 20b cross each other in the plating step. As a result, the portion 22P2 of the metal film 22 which covers the side 20m3 is thicker than the other portion thereof.

Figure 26:
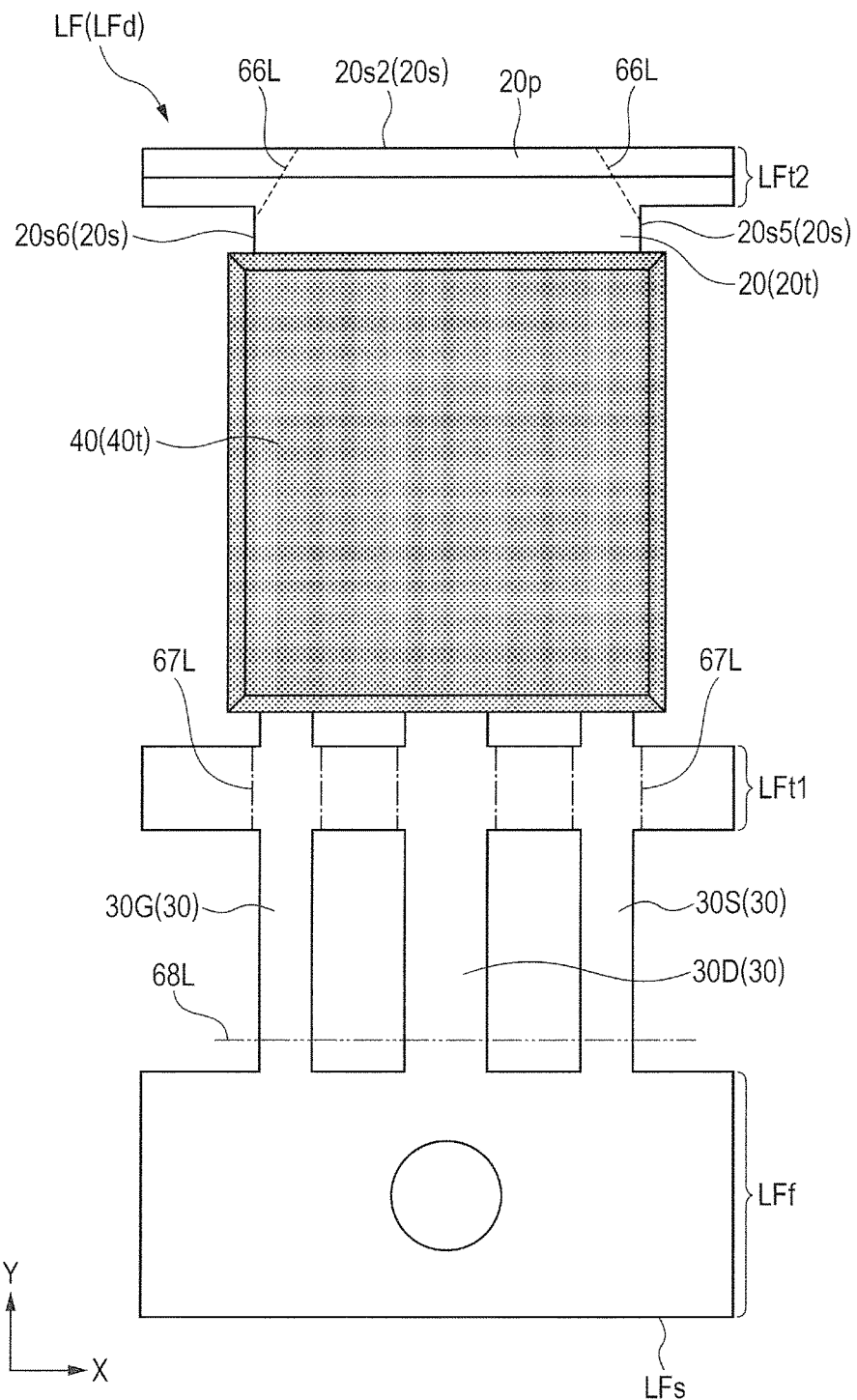
FIG. 26 is an enlarged plan view schematically showing a position where a tie bar is cut in the metal plate separation step shown in FIG. 13.

The current density also tends to be higher in the side surface LFs among the plurality of side surfaces of the frame portion LFf shown in FIGS. 22 and 24 which is located along the peripheral edge portion of the lead frame LF for the same reason as in the side surface 20s2 of the metal plate 20. In the vicinity of the corner portions located around the region of the side surface LFs which crosses the upper surface and around the region of the side surface LFs which crosses the lower surface, relatively thicker portions are formed in the metal film 22. However, in the lead separation step shown in FIG. 13, the frame portion LFf having the side surface LFs shown in FIG. 26 is separated and removed from the plurality of leads 30. Accordingly, the metal film 32 formed over the side surface LFs has no influence on the semiconductor device in the final structure.

<Metal Plate Separation Step>

Next, in the metal plate separation step shown in FIG. 13, the tie bar LFt2 shown in FIG. 22 is cut to separate the plurality of metal plates 20 connected via the tie bar LFt2 from each other. In this step, the tie bar LFt2 is cut along cut lines 66L shown as the dotted lines in FIG. 26 to separate the metal plates 22 from the tie bar LFt2. FIG. 26 is an enlarged plan view schematically showing the positions where the tie bar is cut in the metal plate separation step shown in FIG. 13. Note that, in FIG. 26, the cutting positions where the tie bar LFt2 is cut in the metal plate separation step is shown by the cut lines 66L as the dotted lines. Also, in FIG. 26, the positions where the tie bar LFt1 is cut in the next lead separation step are shown by cut lines 67L as the dot-dash lines. Also, in FIG. 26, the respective positions where the plurality of leads 30 are cut in the next lead separation step are shown by a cut line 68L as the two-dot-dash line.

In this step, as shown in FIG. 26, the tie bar LFt2 is cut along the cut lines 66L. As a method of cutting the tie bar LFt2, in the same manner as in the method described using FIG. 19, press working using a punch and a die can be used. When the tie bar LFt2 is cut along the cut lines 66L, the side surfaces 20s3 and 20s4 described using FIGS. 10 and 11 are formed. Since this step is performed after the plating step, the side surfaces 20s3 and 20s4 are exposed from the metal film 22. However, in this step, the tie bar LFt2 is cut with the top surface thereof being covered with the metal film 22 shown in FIG. 24. Accordingly, portions of the metal film 22 may also be deposited over respective portions of the side surfaces 20s3 and 20s4.

As also shown in FIG. 26, each of the plurality of cut lines 66L extends over a portion of the upper surface 20t of the metal plate 20 and over a portion of the inclined surface 20p. Consequently, each of the side surfaces 20s3 and 20s4 is continued to the upper surface 20t and to the inclined surface 20p.

<Lead Separation Step>

Next, in the lead separation step shown in FIG. 13, the tie bar LFt1 is cut along the cut lines 67L shown as the dot-dash lines in FIG. 26 and the plurality of leads 30 are cut from the frame portion LFf along the cut line 68L shown as the dotted line in FIG. 26 to be separated from each other. Also, in this step, the plurality of leads 30 are each subjected to bending to be shaped so that the leads 30 having shapes as shown in, e.g., FIG. 6 are obtained. As a method of cutting the tie bar LFt1 and a method of cutting the plurality of leads 30, in the same manner as in the method described using FIG. 19, press working using a punch and a die can be used. Also, as a method of shaping the leads 30, e.g., press working using the die described using FIG. 18 can be used.

Note that the cutting of the tie bar LFt1, the cutting of the plurality of leads 30, and the shaping of the leads 30 may be performed independently or some or all thereof may also be performed simultaneously.

<Annealing Step>

Next, in the annealing step shown in FIG. 13, heating treatment (anneal treatment) is performed on the metal films 22 and 32 (see FIG. 24) formed in the plating step described above to reduce a strain in each of the metal films 22 and 32. As exemplary conditions for the anneal treatment, conditions under which, e.g., heating is performed at 150° C. for about 1 to 2 hours can be shown. In a modification of the present embodiment, the annealing step can also be omitted. However, as described later, as a result of conducting the study, the present inventors have found that performing the anneal treatment on the metal films 22 and 32 is effective in terms of suppressing whisker formation.

Note that, in FIG. 13, the implementation which performs the annealing step after the lead separation step is shown. However, in a modification, the lead separation step may also be performed after the annealing step. In the case of performing the annealing step after the lead separation step, the strain produced in the metal film 32 (see FIG. 6) in the lead separation step can be removed by the annealing step. On the other hand, in the case of performing the lead separation step after the annealing step, the annealing step can be performed in a state where the plurality of device formation portions LFd (see FIG. 14) are connected, resulting in high handling performance. Even in the case of performing the lead separation step after the annealing step, the strain produced in the metal film 22 to result in the main cause of whisker formation (see FIG. 16) can be removed.

<Evaluation>

Figure 27:
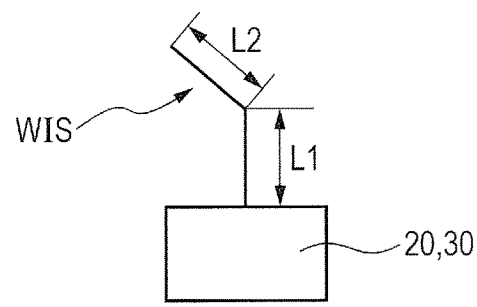
FIG. 27 is an illustrative view showing a standard for measuring the length of a whisker in the evaluation of the whisker shown in Tables 1 and 2.

A description will be given of the result of evaluating the semiconductor device in the present embodiment described above for the wettability of the solder during the mounting thereof and the length of a whisker. Table 1 shows the results of evaluating the semiconductor device PKGh1 shown in FIG. 33 and the semiconductor device PKG1 shown in FIG. 8 for the wettability of the solder during the mounting thereof and the length of a whisker. Table 2 shows the result of evaluation when conditions for pretreatment before the plating step or the timing of performing the annealing step are varied as modifications of the conditions shown in Table 1. FIG. 27 is an illustrative view showing a standard on the basis of which the length of a whisker is measured in the evaluation of whiskers shown in Tables 1 and 2.

In the semiconductor device PKG1 shown in Table 1, the inclined surface 20p having the thickness 2T1 of 1 mm and the height 2H1 of 250 μm and shown in FIG. 9 was formed. On the other hand, the semiconductor PKGh1 was formed such that the thickness thereof corresponding to the distance between the upper surface 20t and the lower surface 20b shown in FIG. 34 was 1 mm. For each of the semiconductor devices PKG1 and PKGh1, as pretreatment for the plating step, chemical polishing was performed on the respective top surfaces of the base materials of the metal plate 20 and 20h such that the average thickness of the polished portions was 0.2 μm. Specifically, Clean Etch CPB-40N (available from Mitsubishi Gas Chemical Company, Inc.) as a metal surface treatment agent was doubly (at a weight ratio) diluted with pure water and acid cleaning treatment was performed at 30° C. for 15 seconds.

On the other hand, under the conditions for the items Nos. 17 and 18, as pretreatment for the plating step, chemical polishing was performed on the top surface of the base material of the metal plate 20h of the semiconductor device PKGh1 such that the average thickness of the polished portions was 8 μm. Specifically, using an undiluted solution of Clean Etch CPB-50 (available from Mitsubishi Gas Chemical Company, Inc.) as a metal surface treatment agent, acid cleaning treatment was performed at 30° C. for 120 seconds.

For each of the semiconductor devices PKG1 and PKGh1, a plating time was adjusted such that, e.g., the thickness of the metal film 32 shown in FIG. 6 was 5.0 μm, 7.5 μm, 10.0 μm, and 12.5 μm. In addition, the respective thicknesses of the metal films 22 and 22h under the lower surface 20b of the metal plate 20 ("Lower Surface" shown in Tables 1 and 2) and the respective thicknesses of the metal films 22 and 22h covering the upper end portion ("Upper End of Side Surface" shown in Tables 1 and 2) of the side surface 20s2 (see FIGS. 9 and 34) were measured under each of the foregoing conditions.

For the measurement of the film thicknesses, an X-ray fluorescence thickness meter was used. Under each of the conditions shown in Tables 1 and 2, five products were manufactured and the thicknesses of the individual portions shown in Tables 1 and 2 were measured. The average value thereof is shown in Tables 1 and 2.

Each of the metal films 22, 22h, and 32 is made of a tin-bismuth alloy obtained by adding 2 wt % (percent by weight) of bismuth (Bi) to tin (Sn).

To examine the effect of the anneal treatment, as shown in FIG. 13, items on which the annealing step was performed after the lead separation step (items each having "Performed*[1]" in the "Anneal" column in Tables 1 and 2) and items on which the annealing step was omitted (items each having "Not Performed" in the "Anneal" column in Tables 1 and 2) were produced and compared to each other. Conditions for the anneal treatment were such that an annealing temperature was 150° C. and an annealing time was 1 hour.

Under the condition for the item No. 19 shown in Table 2, for the semiconductor device PKGh1, the annealing step was performed after the plating step shown in FIG. 13 and before the metal plate separation step shown in FIG. 13 ("Performed*[2]" in the "Anneal" column in Table 2). Note that the conditions for the anneal treatment were the same.

For the evaluation of the wettability of the solder (in the "Wettability" column in Tables 1 and 2), as pretreatment, the plurality of semiconductor devices PKG1 and the plurality of semiconductor devices PKGh1 were stored under conditions such that a temperature was 85° C. and a humidity was 85% RH for 168 hours. Then, each of the semiconductor devices PKG1 and PKGh1 subjected to the foregoing pretreatment was subjected to rosin-based flux treatment and immersed in a solder solution of a tin-silver(3 wt %)-copper (0.5 wt %) alloy heated to 230° C. for 5 seconds. Then, each of the semiconductor devices PKG1 and PKGh1 after the immersion was observed using a 10- to 20-power stereo microscope. The semiconductor device PKG1 or PKGh1 in which the solder-plated surface had an unwet portion corresponding to 5% or more of the entire area of the solder-plated surface was determined to be unacceptable. Note that, under each of the conditions, the twenty semiconductor devices PKG1 and the twenty semiconductor devices PKGh1 were manufactured. The number of the unacceptable ones of the twenty semiconductor devices PKG1 and the number of the unacceptable ones of the twenty semiconductor devices PKGh1 are shown in Tables 1 and 2.

For the evaluation of the whisker ("Whisker" column in Tables 1 and 2), each of the semiconductor devices PKG1 and PKGh1 was mounted over a mounting substrate using a solder paste made of the tin-silver(3 wt %)-copper(0.5 wt %) alloy mentioned above. Then, a temperature/humidity cycle load was applied to each of the semiconductor devices PKG1 and PKGh1 in an uncleaned state. The temperature/humidity cycle load was applied under conditions such that the cycle in which each of the semiconductor devices PKG1 and PKGh1 was stored at a temperature of 85° C. and a humidity of 85% RH for 200 hours and then stored at a room temperature and a room humidity for 24 hours was assumed to be one cycle and the five cycles were repeated.

After the foregoing temperature/humidity cycle load was applied, the whiskers were observed using a 50-power stereo microscope. The whiskers which could be recognized were subjected to length measurement using a 250- to 500-power microscope. For the length measurement of the whiskers, under each of the conditions shown in Tables 1 and 2, five products were manufactured for each of the items of the semiconductor devices PKG1 and PKGh1. The average value of the respective maximum lengths of the whiskers observed in the five products of each of the items and the maximum value of the respective lengths of the whiskers observed in the five products of each of the items are shown in Tables 1 and 2.

As schematically shown in FIG. 27, a majority of whiskers WIS were bent halfway during the growth thereof. Accordingly, the length of each of the whiskers WIS which was bent halfway was calculated as the sum of lengths L1 and L2.

TABLE 1

| Device Category | No. | Thickness of Plating Metal Film (μm) | | | | Wettability Unacceptable/ Total | Whisker (μm) | |
|---|---|---|---|---|---|---|---|---|
| | | Lead (Top Surface) | Metal Plate (Lower Surface) | Metal Plate (Upper End of Side Surface) | Anneal | | ave. | MAX |
| PKGh1 | 1 | 5.0 | 5.1 | 6.2 | Not Performed | 1/20 | 27 | 42 |
| | 2 | 5.0 | 5.1 | 6.2 | Performed*[1] | 2/20 | 16 | 18 |
| | 3 | 7.5 | 7.6 | 9.8 | Not performed | 0/20 | 55 | 102 |
| | 4 | 7.5 | 7.6 | 9.8 | Performed*[1] | 0/20 | 28 | 58 |
| | 5 | 10.0 | 10.3 | 12.9 | Not Performed | 0/20 | 104 | 248 |
| | 6 | 10.0 | 10.3 | 12.9 | Performed*[1] | 0/20 | 51 | 165 |
| | 7 | 12.5 | 12.7 | 16.3 | Not Performed | 0/20 | 208 | 672 |
| | 8 | 12.5 | 12.7 | 16.3 | Performed*[1] | 0/20 | 92 | 450 |
| PKG1 | 9 | 5.0 | 5.1 | 5.2 | Not Performed | 0/20 | 21 | 30 |
| | 10 | 5.0 | 5.1 | 5.2 | Performed*[1] | 1/20 | 14 | 12 |
| | 11 | 7.5 | 7.7 | 7.9 | Not Performed | 0/20 | 35 | 61 |
| | 12 | 7.5 | 7.7 | 7.9 | Performed*[1] | 0/20 | 19 | 30 |
| | 13 | 10.0 | 10.3 | 10.4 | Not Performed | 0/20 | 60 | 120 |
| | 14 | 10.0 | 10.3 | 10.4 | Performed*[1] | 0/20 | 33 | 72 |
| | 15 | 12.5 | 12.6 | 12.8 | Not Performed | 0/20 | 108 | 220 |
| | 16 | 12.5 | 12.6 | 12.8 | Performed*[1] | 0/20 | 53 | 158 |

*[1]The annealing step was performed after the lead separation step

TABLE 2

| Device Category | No. | Thickness of Plating Metal Film (μm) | | | Anneal | Wettability Unacceptable/ Total | Whisker (μm) | |
|---|---|---|---|---|---|---|---|---|
| | | Lead (Top Surface) | Metal Plate (Lower Surface) | Metal Plate (Upper End of Side Surface) | | | ave. | MAX |
| PKGh1 | 17 | 10.0 | 10.2 | 13.0 | Not Performed | 0/20 | 120 | 260 |
| | 18 | 10.0 | 10.2 | 13.0 | Performed*[1] | 0/20 | 67 | 144 |
| | 19 | 10.0 | 10.2 | 12.9 | Performed*[2] | 0/20 | 110 | 296 |

*[1] The annealing step was performed after the lead separation step
*[2] The annealing step was performed after the plating step and before the metal plate separation step According to the result of evaluating the wettabilities of the items Nos. 1, 2, 9, and 10 in Table 1, in terms of improving the mounting reliability of the semiconductor device, the thicknesses of the metal films 22 and 32 shown in FIG. 24 are preferably larger than 5.0 μm, more preferably not less than 7.5 μm. It can be said that, when the thicknesses of the metal films 22 and 32 are not less than 7.5 μm, the wettability of the solder is excellent.

Next, according to the measurement results in the cells in the "Thickness of Plating Metal Film" column corresponding to the items Nos. 1, 3, 5, and 7 in Table 1, when the thickness of the metal film 22h is increased, the thickness of the portion 22P1 covering the upper end of the side surface 20s2 shown in FIG. 34 accordingly increases. Also, according to the evaluation results in the cells in the "Whisker" column under these conditions, when the thickness of the metal film 22h is increased, each of the average value and the maximum value of the lengths of the whiskers accordingly increases.

The acceptable value of the length of each of the whiskers differs depending on the arrangement pitch of the conductor pattern over the substrate over which the semiconductor device PKGh1 is mounted. For example, in the case where the semiconductor device PKGh1 is used for the application which requires high reliability such as when the semiconductor device PKGh1 is used as the semiconductor device mounted in an automobile or the like, the maximum length of the whiskers is preferably not more than 200 μm.

Among the items Nos. 1, 3, 5, and 7, only the items Nos. 1 and 3 have the maximum lengths of the whiskers which are not more than 200 μm. However, since the item No. 1 is unacceptable in terms of "Wettability", only the item No. 3 satisfies the evaluation standard for "Wettability" and the evaluation standard for "Whisker". When the range which satisfies each of the evaluation standard for "Wettability" and the evaluation standard for "Whisker" is thus narrow, control in the manufacturing process is difficult.

On the other hand, from the results of evaluating the whiskers in the items Nos. 2, 4, 6, and 8 in Table 1, it can be seen that the maximum lengths of the whiskers are smaller than those in the items Nos. 1, 3, 5, and 7. That is, the effect of reducing the maximum lengths of the whiskers by performing the annealing step shown in FIG. 13 is recognized. However, under the conditions for the item No. 8, the maximum length of the whiskers is 450 μm and, for the item No. 6 also, a high value of 165 μm was recognized as the maximum whisker length, though less than 200 μm. Accordingly, even when the anneal treatment is performed on the semiconductor device PKGh1 shown in FIG. 34, it cannot be said that the range which satisfies each of the evaluation standard for "Wettability" and the evaluation standard for "Whisker" has been satisfactorily widened.

When a comparison is made between the results of evaluating the whiskers in the item No. 5 in Table 1 and the whiskers in the item No. 19 in Table 2, the effect of improving the maximum length of the whiskers in the item No. 5 cannot be recognized in the result of evaluating the whiskers in the item "No. 19". The maximum length of the whiskers in the item No. 19 is larger than that in the item No. 5. This may be conceivable because, even when a strain in the plating metal film is removed by performing the anneal treatment after the plating step, by subsequently performing press working or the like, a new strain is formed as a result of the press working. Accordingly, the timing of performing the annealing step shown in FIG. 13 is particularly preferably after the lead separation step, as shown in FIG. 13, and is preferably at least after the metal plate separation step.

When a comparison is made between the respective results of evaluating the thicknesses of the plating metal films and the whiskers in the item No. 5 in Table 1 and the item No. 17 in Table 2 and a comparison is made between the respective results of evaluating the thicknesses of the plating metal films and the whiskers in the item No. 6 in Table 1 and the item No. 18 in Table 2, neither the effect of improving the thicknesses of the plating metal films in the items Nos. 5 and 6 in Table 1 nor the effect of improving the maximum lengths of the whiskers in the items 5 and 6 in Table 1 cannot be recognized in the results of evaluating the thicknesses of the plating metal films and the maximum lengths of the whiskers in the items Nos. 17 and 18 in Table 2. From the evaluation results, it can be considered that, even when the thickness of the polished portion of the surface to be plated is increased as pretreatment for the plating step, the effect of reducing the maximum length of the whiskers cannot be obtained.

The results of measuring the thicknesses of the plating metal films and evaluating the whiskers in the items Nos. 1, 3, 5, and 7 in Table 1 are compared to the results of measuring the thicknesses of the plating metal films and evaluating the whiskers in the items Nos. 9, 11, 13, and 15 in Table 1. As can be seen from Table 1, according to the present embodiment, by providing the inclined surface 20p as shown in FIG. 9, the thickness of the portion of the metal film 22 which covers the inclined surface is about 30% smaller than the thickness of the portion 22P1 shown in FIG. 34. As the maximum length of the whiskers in the item No. 15, a high value of 220 μm was recognized, while the maximum length of the whiskers in the item No. 13 was 120 μm. Thus, the range which satisfies each of the evaluation standard for "Wettability" and the evaluation standard for "Whisker" is surely wider than that for the semiconductor device PKGh1.

When the results of evaluating the whiskers in the items Nos. 10, 12, 14, and 16 in Table 1 are compared to each other, even in the item No. 16, the maximum length of the whiskers is not more than 200 μm. Note that, since 158 μm is a numerical value close to 200 μm, 158 μm is not included in the range which satisfies each of the evaluation standard for "Wettability" and the evaluation standard for "Whisker". However, it can be said that the foregoing range has been significantly widened compared to the range in the case of the semiconductor device PKGh1.

As described above, according to the present embodiment, by forming the inclined surface 20p shown in FIG. 9, whisker growth can be suppressed. Also, by performing the anneal treatment after the lead separation step shown in FIG. 13, whisker growth can more reliably be suppressed. As a result, it is possible to improve the reliability of the semiconductor device PKG1 and the reliability of the electronic device in which the semiconductor device PKG1 is mounted.

While the invention achieved by the present inventors has been specifically described heretofore on the basis of the embodiment thereof, the present invention is not limited to the foregoing embodiment. It will be appreciated that various changes and modifications can be made in the invention within the scope not departing from the gist thereof.

Figure 28:
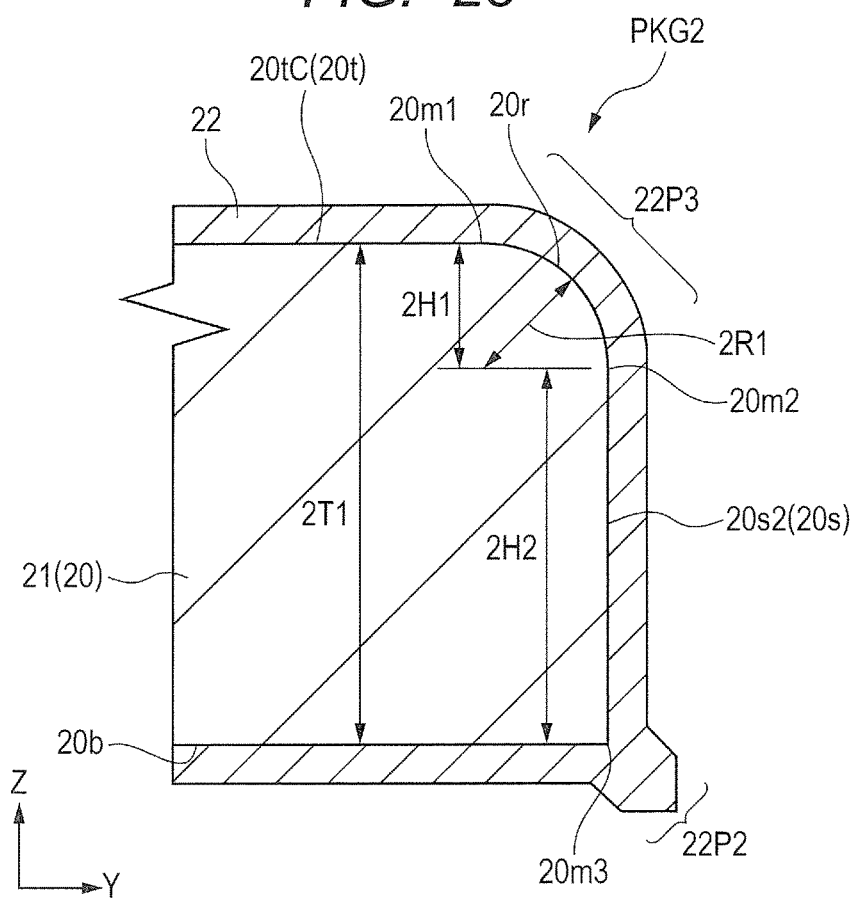
FIG. 28 is an enlarged cross-sectional view showing a state before the portion of a metal plate in a semiconductor device in a modification of the state shown in FIG. 9 is mounted over a mounting substrate.

For example, in the foregoing embodiment, as shown in FIG. 9, the description has been given using the example in which the inclined surface 20p at a given inclination angle is interposed between the side surface 20s2 and the upper surface 20t. However, as described above, a curved surface 20r may also be interposed between the side surface 20s2 and the upper surface 20t as in, e.g., a semiconductor device PKG2 shown in FIG. 28 as long as the curved surface can reduce the concentration of the current density in the plating step. FIG. 28 is an enlarged cross-sectional view showing a state before the portion of the metal plate of a semiconductor device as a modification of the state shown in FIG. 9 is mounted over a mounting substrate.

The semiconductor device PKG2 shown in FIG. 28 is different from the semiconductor device PKG1 shown in FIG. 9 in that the curved surface 20r is interposed between the side surface 20s2 and the upper surface 20t of the metal plate 20, but the inclined surface 20p shown in FIG. 9 is not interposed therebetween.

The curved surface 20r protrudes toward the outside of the base material 21 of the metal plate 20. Accordingly, at each of the side 20m1 where the upper surface 20t and the curved surface 20r cross each other and the side 20m2 where the side surface 20s2 and the curved surface 20r cross each other, respective obtuse angles are formed between the curved surface 20r and the side surface 20s2 and between the curved surface 20r and the upper surface 20t. By thus providing the curved surface 20r, it is possible to suppress the concentration of the current density in the plating step in the same manner as in the case of providing the inclined surface 20p shown in FIG. 9 described above. As a result, it is possible to suppress whisker formation resulting from the formation of the portion 22P1 shown in FIG. 34.

As described above, according to the study by the present inventors, there is a case where a small curved surface is formed at the peripheral edge portion of the side surface 20s2 due to the clearance between the punch 61P and the die 61D shown in FIG. 19. For example, in the case of pressing the punch 61P from the upper surface 20t of the metal plate 20 against the lower surface 20b thereof as shown in FIG. 19, a small curved surface may be formed at the boundary between the side surface 20s2 and the inclined surface 20p. Conversely, in the case of pressing the punch 61P from the lower surface 20b of the metal plate 20 against the upper surface 20t thereof, a small curved surface may be formed at the boundary between the lower surface 20b and the side surface 20s2.

However, according to the study by the present inventors, the radius of curvature of the curved surface thus formed due to the clearance during the press working is about several micrometers to several tens of micrometers and is less than 5% of the thickness of the metal plate 20. Therefore, it has been found that, from the curved surface formed due to the clearance during the press working, the effect of suppressing the concentration of the current density in the plating step can scarcely be expected.

Accordingly, in the case of providing the curved surface 20r in terms of suppressing the concentration of the current density in the plating step, a radius of curvature 2R1 of the curved surface 20r is preferably not less than a given value. For example, the radius of curvature 2R1 of the curved surface 20r is preferably larger than 10% of the thickness (plate thickness) 2T1 of the base material 21 of the metal plate 20 shown in FIG. 28. In this case, specifically, in a direction (Z-direction in FIG. 28) extending from one of the upper and lower surfaces 20t and 20b of the metal plate 20, the height 2H1 between the side 20m1 where the curved surface 20r and the upper surface 20t cross each other and the side 20m2 where the curved surface 20r and the side surface 20s2 cross each other is larger than 10% of the thickness 2T1 as the distance between the upper and lower surfaces 20t and 20b apart from each other.

For example, when the thickness of the base material 21 of the metal plate 20 shown in FIG. 28 is 1 mm, the radius of curvature 2R1 of the curved surface 20r in the thickness direction (Z-direction) is preferably larger than 0.1 mm. Alternatively, when the thickness of the base material 21 of the metal plate 20 shown in FIG. 28 is 500 μm, the radius of curvature 2R1 of the curved surface 20r in the thickness direction (Z-direction) is preferably larger than 50 μm. When the radius of curvature 2R1 is larger than 10% of the thickness 2T1, the effect of reducing the likelihood of the formation of the portion 22P1 shown in FIG. 34 in the plating step can be recognized.

The radius of curvature 2R1 of the curved surface 20r is more preferably not less than ¼ (not less than 25%) of the thickness 2T1 as the distance between the upper and lower surfaces 20t an 20b apart from each other. For example, when the thickness of the base material 21 of the metal plate 20 shown in FIG. 28 is 1 mm, the radius of curvature 2R1 of the curved surface 20r is not less than 0.25 mm. Alternatively, when the thickness of the base material 21 of the metal plate 20 shown in FIG. 28 is 500 μm, the radius of curvature 2R1 of the curved surface 20r is preferably not less than 125 μm. When the height 2H1 is not less than ¼ of the thickness 2T1, the portion 22P1 shown in FIG. 34 can significantly be reduced in the plating step. This can stably suppress the whisker growth described above.

Note that, in the description given above, the inclined surface 20p shown in FIG. 9 described above is formed by, e.g., press working. The curved surface 20r shown in FIG. 28 can also be formed by, e.g., press working. Alternatively, the inclined surface 20p and the curved surface 20r may also be formed by a mechanical grinding process, a chemical polishing process, or a combination thereof. In the case of forming the inclined surface 20p or the curved surface 20r each of which needs a given dimension using only a chemical mechanical method, a polishing time is required and, consequently, a curved surface which is recessed toward the center of the metal plate 20 may be formed. When the curved surface which is recessed toward the center of the metal plate 20 is formed, the angles θ1 and θ2 shown in FIG. 8 may be not more than 90 degrees. Accordingly, in terms of assuring that the angles θ1 and θ2 are obtuse, press working or a mechanical grinding process is preferred. On the other hand, in terms of reducing a working time, press working is particularly preferable. As described above, a working method used to form the curved surface 20r is referred to as the R-chamfering.

Except for the different portions described above, the semiconductor device PKG2 shown in FIG. 28 is the same as the semiconductor device PKG1 shown in FIG. 9 described above.

Among the individual components described using FIGS. 1 to 27, the portion described as the inclined surface 20p is replaced with the curved surface 20r to allow the curved surface 20r and the other components of the semiconductor device PKG1 to be used appropriately. Accordingly, a repeated description thereof is omitted.

Also, using FIG. 13, the description has been given of the example of the manufacturing method which performs the metal plate separation step after the plating step. In this case, as shown in FIG. 11, among the plurality of side surfaces 20s of the metal plate 20, the side surfaces 20s3 and 20s4 are exposed from the metal film 22. However, in terms of further improving the mounting strength of the semiconductor device PKG1, the surface of the metal plate 20 which is exposed from the sealing body 40 shown in FIG. 3 is preferably entirely covered with the metal film 22 (see FIG. 11). A description will be given below of a modification of the semiconductor device PKG1.

Figure 29:
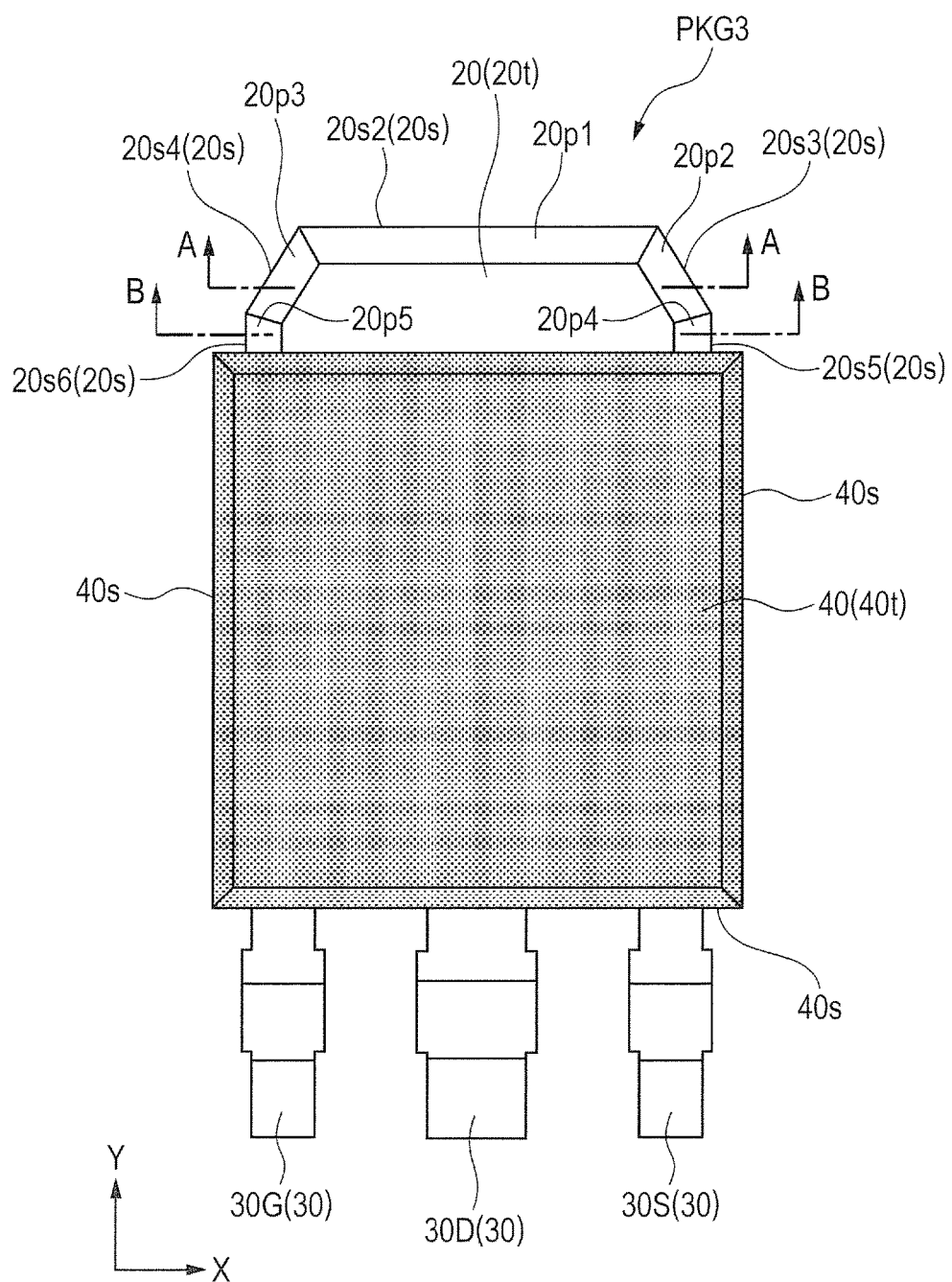
FIG. 29 is a plan view showing the semiconductor device in a modification of the semiconductor device in FIG. 3.
Figure 30:
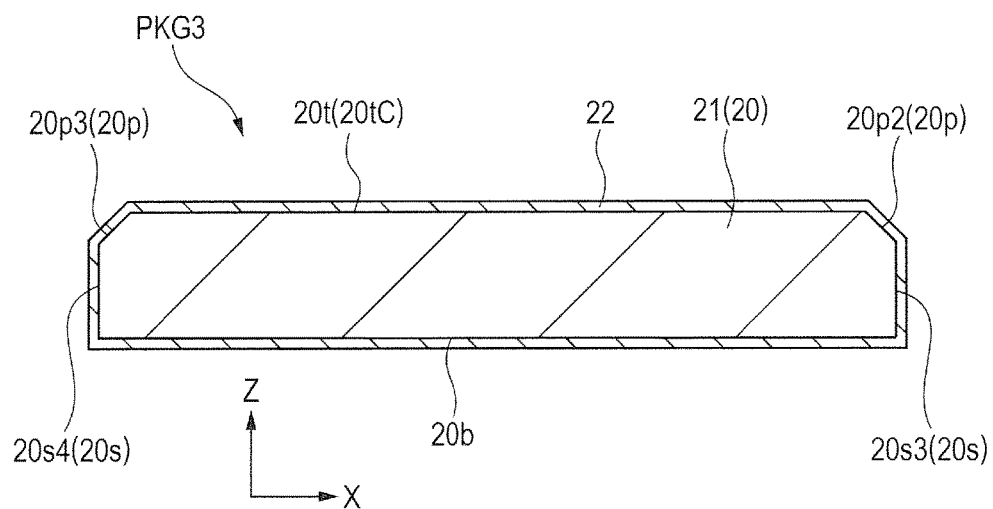
FIG. 30 is a cross-sectional view along the line A-A in FIG. 29.
Figure 31:
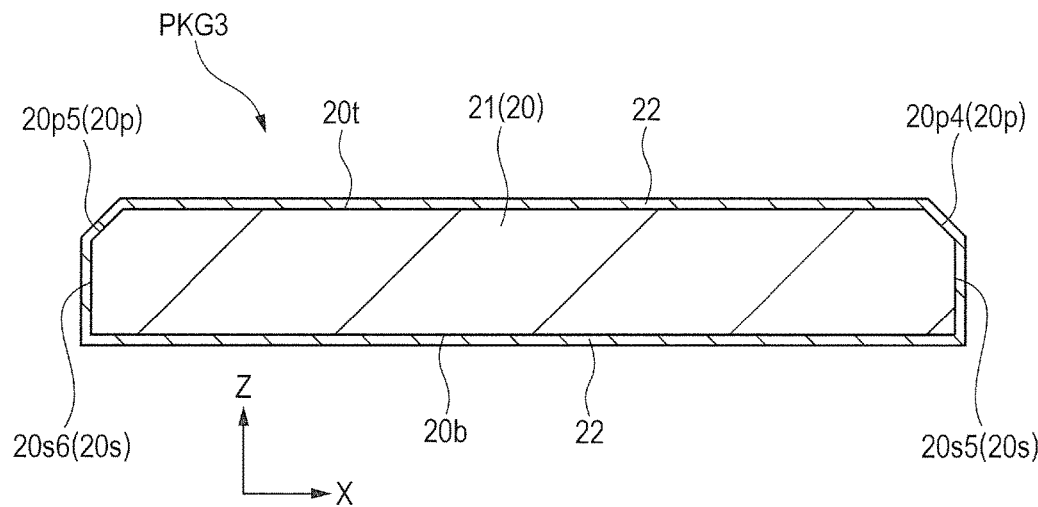
FIG. 31 is a cross-sectional view along the line B-B in FIG. 29.

FIG. 29 is a two-dimensional view showing a semiconductor device as a modification of the semiconductor device shown in FIG. 3. FIG. 30 is a cross-sectional view along the line A-A in FIG. 29. FIG. 31 is a cross-sectional view along the line B-B in FIG. 29.

A semiconductor device PKG3 shown in FIGS. 29 to 31 is different from the semiconductor device PKG1 shown in FIG. 3 in the following points. That is, the plurality of side surfaces 20s of the metal plate 20 of the semiconductor device PKG3 include the side surface 20s3 continued to one end portion of the side surface 20s2 and the side surface 20s4 continued to the other end portion of the side surface 20s. As shown in FIG. 30, each of the side surfaces 20s3 and 20s4 of the semiconductor device PKG3 is covered with the metal film 22.

Also, between the exposed portion 20tC of the upper surface 20t of the metal plate 20 which is exposed from the sealing body 40 (see FIG. 29) and the side surface 20s3, an inclined surface 20p2 which is inclined with respect to each of the upper surface 20t and the side surface 20s3 and covered with the metal film 22 is interposed. Also, between the exposed portion 20tC and the side surface 20s4, an inclined surface 20p3 which is inclined with respect to each of the upper surface 20t and the side surface 20s4 and covered with the metal film 22 is interposed. Also, between the exposed portion 20tC and the side surface 20s2 shown in FIG. 29, an inclined surface 20p1 which is inclined with respect to each of the upper surface 20t and the side surface 20s2 and covered with the metal film 22 is interposed.

The plurality of side surfaces 20s of the metal plate 20 of the semiconductor device PKG3 also include the side surface 20s5 continued to the end portion of the side surface 20s3 and the side surface 20s6 continued to the end portion of the side surface 20s4. As shown in FIG. 31, each of the side surfaces 20s5 and 20s6 of the semiconductor device PKG3 is covered with the metal film 22.

Between the exposed portion 20tC of the upper surface 20t of the metal plate 20 which is exposed from the sealing body 40 (see FIG. 29) and the side surface 20c5, an inclined surface 20p4 which is inclined with respect to each of the upper surface 20t and the side surface 20s5 and covered with the metal film 22 is interposed. Also, between the exposed portion 20tC and the side surface 20s6, an inclined surface 20p5 which is inclined with respect to each of the upper surface 20t and the side surface 20s6 and covered with the metal film 22 is interposed.

Note that each of the inclined surfaces 20p1, 20p2, 20p3, 20p4, and 20p5 shown in FIG. 29 is provided in terms of suppressing the concentration of the current density in the plating step, similarly to the inclined surface 20p described using FIG. 3. Accordingly, the respective preferred heights and inclination angles of the inclined surfaces 20p1, 20p2, 20p3, 20p4, and 20p5 are the same as the preferred height and inclination angle of the inclined surface 20p that has been already described. Therefore, a repeated description thereof is omitted. Also, as a further modification of the inclined surfaces shown in FIG. 29, some or all of the inclined surfaces 20p1, 20p2, 20p3, 20p4, and 20p5 may also be each replaced with the curved surface 20r shown in FIG. 28.

As shown in FIG. 29, in the semiconductor device PKG3, each of the portions of the metal plate 20 which are exposed from the sealing body 40 is covered with the metal film 22 shown in FIGS. 30 and 31. Consequently, the wettability of the solder to the metal plate 20 when the semiconductor device PKG3 is mounted over the mounting substrate 50 shown in FIG. 7 can further be improved compared to that when the semiconductor device PKG1 shown in FIG. 3 is mounted thereover. As a result, the mounting reliability of the semiconductor device PKG3 can further be improved compared to that of the semiconductor device PKG1.

The structure of the semiconductor device PKG3 is the same as the structure of the semiconductor device PKG1 shown in FIG. 3 except for the different points described above. Therefore, a repeated description thereof is omitted.

Figure 32:
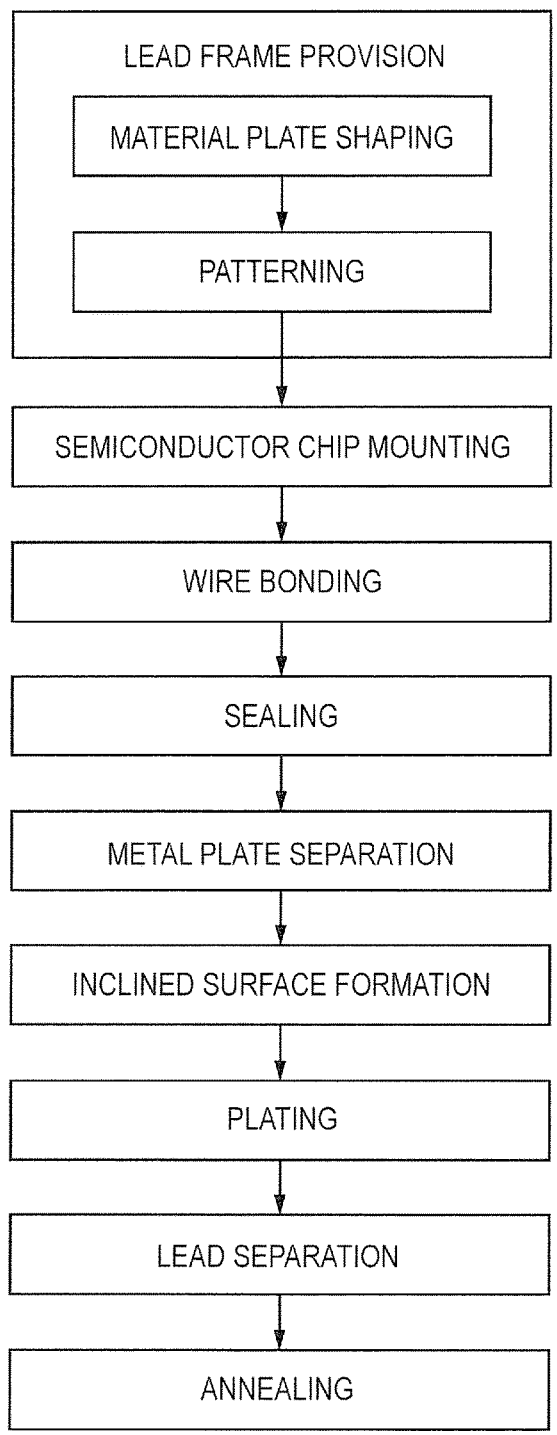
FIG. 32 is an illustrative view showing a modification of the semiconductor device shown in FIG. 13.

Next, a description will be given of a method of manufacturing the semiconductor device PKG3 with a focus on the difference from the manufacturing method shown in FIG. 13. FIG. 32 is an illustrative view showing a modification of the manufacturing method shown in FIG. 13.

The manufacturing method of the semiconductor device shown in FIG. 32 is different from the manufacturing method of the semiconductor device shown in FIG. 13 in that the metal plate separation step is performed before the plating step. That is, in the modification shown in FIG. 32, the plating step is performed in a state where the plurality of metal plates 20 formed in the lead frame are separated from each other.

In this case, in the plating step, the current density may be concentrated not only on the side surface 20s2 shown in FIG. 29, but also on the side surfaces 20s3 and 20s4. In the side surfaces 20s5 and 20s6, the possibility of the occurrence of the concentration of the current density is lower than in the side surfaces 20s3 and 20s4, but there is the possibility of the concentration of the current density. Accordingly, in the case of the present modification, as shown in FIG. 32, the inclined surface formation step is performed after the metal plate separation step and before the plating step. In the inclination surface formation step, at least the inclined surfaces 20p2 and 20p3 shown in FIG. 30 are formed. The inclined surfaces 20p4 and 20p5 shown in FIG. 31 may also be formed in advance in the lead frame provision step shown in FIG. 32 or formed in the inclined surface formation step shown in FIG. 32.

Each of the inclined surfaces 20p2 to 20p5 is formed by, e.g., press working. Alternatively, as in the modification described above, each of the inclined surfaces 20p2 to 20p5 may also be formed by a mechanical grinding process. By forming the inclined surfaces 20p2 and 20p3 shown in FIG. 30 in the inclined surface formation step shown in FIG. 32, it is possible to prevent the thickness of the metal film 22 from being increased between the upper surface 20t and the side surfaces 20s3 and 20s4. As a result, it is possible to suppress whisker growth resulting from a locally increased thickness of the metal film.

Although the description has been given above of, e.g., the various modifications, the individual modifications described above can be used in combination.

A technical idea extracted for a method of manufacturing the semiconductor device described in the foregoing embodiment can be described as follows.

(Note 1)

A method of manufacturing a semiconductor device, including the steps of:

(a) providing a lead frame having a first metal plate, a plurality of leads arranged in juxtaposition with the first metal plate, and a frame portion coupled to the first metal plate and to the leads;

(b) mounting a semiconductor chip over a first surface of the first metal plate of the lead frame and electrically coupling the semiconductor chip to the leads;

(c) sealing the entire semiconductor chip, a portion of the first metal plate, and a portion of each of the leads with a resin to form a sealing body;

(d) forming a first metal film over a portion of the lead frame which is exposed from the sealing body using an electrolytic plating method; and (e) after the step (d), cutting each of the leads to separate the leads from the frame portion, in which the first metal plate has a second surface opposite to the first surface and a plurality of side surfaces located between the first and second surfaces, in which the side surfaces of the first metal plate include:

a first side surface provided to face each of the leads in plan view and sealed in the sealing body in the step (c); and a second side surface provided opposite to the first side surface, exposed from the sealing body in the step (c), and covered with the first metal film in the step (d), in which, before the step (d), a third surface is formed between a first exposed portion of the first surface of the first metal plate which is exposed from the sealing body in the step (c) and the second side surface, and in which each of a first angle formed between the third and first surfaces and a second angle formed between the third surface and the second side surface is larger than 90 degrees.

(Note 2)

The method of manufacturing the semiconductor device in Note 1, further including the step of:

(f) after the step (e), heating the first metal film to reduce a strain in the first metal film.

(Note 3)

In the method of manufacturing the semiconductor device in Note 1, the third surface is formed by press working.

(Note 4)

In the method of manufacturing the semiconductor device in Note 1, in a first direction extending from one of the first and second surfaces of the first metal plate toward the other thereof, a first height between a first side where the third and first surfaces cross each other and a second side where the third surface and the second side surface cross each other is larger than 10% of a distance between the first and second surfaces apart from each other.

(Note 5)

In the method of manufacturing the semiconductor device in Note 1, in a first direction extending from one of the first and second surfaces of the first metal plate toward the other thereof, a first height between a first side where the third and first surfaces cross each other and a second side where the third surface and the second side surface cross each other is not less than ¼ of a distance between the first and second surfaces apart from each other.

(Note 6)

A method of manufacturing a semiconductor device, including the steps of:

(a) providing a lead frame having a plurality of first metal plates connected via a tie bar, a plurality of leads arranged in juxtaposition with each of the first metal plates, and a frame portion coupled to the first metal plates and to the leads;

(b) mounting a plurality of semiconductor chips over respective first surfaces of the first metal plates of the lead frame to electrically couple the semiconductor chips to the leads;

(c) sealing the semiconductor chips with a resin to form a plurality of sealing bodies;

(d) forming a first metal film over each of portions of the lead frame which are exposed from the sealing bodies using an electrolytic plating method;

(e) cutting the tie bar connecting the first metal plates to separate the first metal plates from each other; and (f) after the step (d), cutting the leads to separate the leads from the frame portion, in which each of the first metal plates has a second surface opposite to the first surface and a plurality of side surfaces located between the first and second surfaces, in which the side surfaces of each of the first metal plates include:

a first side surface provided to face each of the leads in plan view and sealed in any of the sealing bodies in the step (c); and a second side surface provided opposite to the first side surface, exposed from the sealing bodies in the step (c), and covered with the first metal film in the step (d), in which, before the step (d), a third surface is formed between the first surface and the second side surface of each of the first metal plates, and in which each of a first angle formed between the third and first surfaces and a second angle formed between the third surface and the second side surface is larger than 90 degrees.

(Note 7)

In the method of manufacturing the semiconductor device in Note 6, the step (e) includes the steps of:

(e1) after the step (d), cutting a portion of each of the tie bar and the first metal plates to expose a third side surface continued to one end portion of the second side surface and to one end portion of the third surface; and (e2) after the step (d), cutting another portion of each of the tie bar and the first metal plates to expose a fourth side surface continued to the other end portion of the second side surface and to the other end portion of the third surface, and each of the third and fourth side surfaces is continued to the first surface of each of the first metal plates.

(Note 8)

The method of manufacturing the semiconductor device in Note 7, further including the step of:

(g) after the step (e), heating the first metal film to reduce a strain in the first metal film.

(Note 9)

In the method of manufacturing the semiconductor device in Note 6, the step (e) includes the steps of:

(e1) before the step (d), cutting a portion of each of the tie bar and the first metal plates to expose a third side surface continued to one end portion of the second side surface and to one end portion of the third surface;

(e2) before the step (d), cutting a portion of each of the tie bar and the first metal plates to expose a fourth side surface continued to the other end portion of the second side surface and to the other end portion of the third surface;

(e3) after the step (e1) and before the step (d), forming a fourth surface between the first surface and the third side surface; and (e4) after the step (e2) and before the step (d), forming a fifth surface between the first surface and the fourth side surface, and each of a third angle formed between the fourth and first surfaces, a fourth angle formed between the fourth surface and the third side surface, a fifth angle formed between the fifth and first surfaces, and a sixth angle formed between the fifth surface and the fourth side surface is larger than 90 degrees.

(Note 10)

In the method of manufacturing the semiconductor device in Note 9, each of the third, fourth, and fifth surfaces is formed by press working.

What is claimed is:

1. A semiconductor device, comprising:
a first metal plate having a first surface, a second surface opposite to the first surface, and a plurality of side surfaces located between the first and second surfaces;
a semiconductor chip mounted over the first surface of the first metal plate;
a plurality of leads electrically coupled to the semiconductor chip;
a sealing body sealing the entire semiconductor chip, a portion of each of the leads, and a portion of the first metal plate; and
a first metal film covering a portion of the first metal plate which is exposed from the sealing body,
wherein the side surfaces of the first metal plate include:
a first side surface provided to face each of the leads in plan view and sealed in the sealing body; and
a second side surface provided opposite to the first side surface, exposed from the sealing body, and covered with the first metal film, and
wherein, between a first exposed portion of the first surface of the first metal plate which is exposed from the sealing body and covered with the first metal film and the second side surface, a first inclined surface which is inclined with respect to each of the first surface and the second side surface and covered with the first metal film is interposed.

2. The semiconductor device according to claim 1, wherein the second side surface of the first metal plate is continued to the second surface covered with the first metal film.

3. The semiconductor device according to claim 2, wherein a thickness of a first portion of the first metal film which covers the first inclined surface is smaller than a thickness of a second portion of the first metal film which covers a portion of the first metal plate where the second side surface and the second surface cross each other.

4. The semiconductor device according to claim 1, wherein, in a first direction extending from one of the first and second surfaces of the first metal plate toward the other thereof, a first height between a first side where the first inclined surface and the first surface cross each other and a second side where the first inclined surface and the second side surface cross each other is larger than 10% of a distance between the first and second surfaces apart from each other.

5. The semiconductor device according to claim 1, wherein, in a first direction extending from one of the first and second surfaces of the first metal plate toward the other thereof, a first height between a first side where the first inclined surface and the first surface cross each other and a second side where the first inclined surface and the second side surface cross each other is not less than ¼ of a distance between the first and second surfaces apart from each other.

6. The semiconductor device according to claim 1, wherein the side surfaces of the first metal plate include:
a third side surface which is continued to one end portion of each of the second side surface and the first inclined surface; and
a fourth side surface which is continued to the other end portion of each of the second side surface and the first inclined surface, and
wherein each of the third and fourth side surfaces is continued to the first surface of the first metal plate and exposed from each of the sealing body and the first metal film.

7. The semiconductor device according to claim 6, wherein the side surfaces of the first metal plate include:
a fifth side surface which is continued to an end portion of the third side surface and to the first main surface and exposed from the sealing body; and
a sixth side surface which is continued to an end portion of the fourth side surface and to the first surface and exposed from the sealing body, and
wherein each of the fifth and sixth side surfaces is located between the first and second side surfaces in plan view and covered with the first metal film.

8. The semiconductor device according to claim 1, wherein a thickness of the first metal plate is larger than a thickness of each of the leads.

9. The semiconductor device according to claim 1, wherein the first metal film contains tin and bismuth.

10. The semiconductor device according to claim 1, wherein the side surfaces of the first metal plate include:
a third side surface which is continued to one end portion of the second side surface and covered with the first metal film; and
a fourth side surface which is continued to the other end portion of the second side surface and covered with the first metal film,
wherein, between the first exposed portion and the third side surface, a second inclined surface which is inclined with respect to each of the first surface and the third side surface and covered with the first metal film is interposed, and
wherein, between the first exposed portion and the fourth side surface, a third inclined surface which is inclined with respect to each of the first surface and the fourth side surface and covered with the first metal film is interposed.

11. The semiconductor device according to claim 10,
wherein the side surfaces of the first metal plate include:
a fifth side surface which is continued to an end portion of the third side surface and covered with the first metal film; and
a sixth side surface which is continued to an end portion of the fourth side surface and covered with the first metal film,
wherein, between the first exposed portion and the fifth side surface, a fourth inclined surface which is inclined with respect to each of the first surface and the fifth side surface and covered with the first metal film is interposed, and
wherein, between the first exposed portion and the sixth side surface, a fifth inclined surface which is inclined with respect to each of the first surface and the sixth side surface and covered with the first metal film is interposed.

12. A semiconductor device, comprising:
a first metal plate having a first surface, a second surface opposite to the first surface, and a plurality of side surfaces located between the first and second surfaces;
a semiconductor chip mounted over the first surface of the first metal plate;
a plurality of leads electrically coupled to the semiconductor chip;
a sealing body sealing the entire semiconductor chip, a portion of each of the leads, and a portion of the first metal plate; and
a first metal film covering a portion of the first metal plate which is exposed from the sealing body,
wherein the side surfaces of the first metal plate include:
a first side surface provided to face each of the leads in plan view and sealed in the sealing body; and
a second side surface provided opposite to the first side surface, exposed from the sealing body, and covered with the first metal film,
wherein, between a first exposed portion of the first surface of the first metal plate which is exposed from the sealing body and covered with the first metal film and the second side surface, a first curved surface covered with the first metal film is interposed, and
wherein the first curved surface protrudes toward an outer surface of the first metal film.

13. The semiconductor device according to claim 12,
wherein the second side surface of the first metal plate is continued to the second surface covered with the first metal film.

14. The semiconductor device according to claim 13,
wherein a thickness of a first portion of the first metal film which covers the first curved surface is smaller than a thickness of a second portion of the first metal film which covers a portion of the first metal plate where the second side surface and the second surface cross each other.

15. The semiconductor device according to claim 12,
wherein, in a first direction extending from one of the first and second surfaces of the first metal plate toward the other thereof, a radius of curvature of the first curved surface is larger than 10% of a distance between the first and second surfaces apart from each other.

16. The semiconductor device according to claim 12,
wherein, in a first direction extending from one of the first and second surfaces of the first metal plate toward the other thereof, a radius of curvature of the first curved surface is not less than ¼ of a distance between the first and second surfaces apart from each other.

17. A semiconductor device, comprising:
a first metal plate having a first surface, a second surface opposite to the first surface, and a plurality of side surfaces located between the first and second surfaces;
a semiconductor chip mounted over the first surface of the first metal plate;
a plurality of leads electrically coupled to the semiconductor chip;
a sealing body sealing the entire semiconductor chip, a portion of each of the leads, and a portion of the first metal plate; and
a first metal film covering a portion of the first metal plate which is exposed from the sealing body,
wherein the side surfaces of the first metal plate include:
a first side surface provided to face each of the leads in plan view and sealed in the sealing body; and
a second side surface provided opposite to the first side surface, exposed from the sealing body, and covered with the first metal film,
wherein, between a first exposed portion of the first surface of the first metal plate which is exposed from the sealing body and covered with the first metal film and the second side surface, a third surface covered with the first metal film is interposed, and
wherein each of a first angle formed between the third and first surfaces and a second angle formed between the third surface and the second side surface is larger than 90 degrees.

18. The semiconductor device according to claim 17,
wherein the second side surface of the first metal plate is continued to the second surface covered with the first metal film.

19. The semiconductor device according to claim 18,
wherein a thickness of a first portion of the first metal film which covers the third surface is smaller than a thickness of a second portion of the first metal film which covers a portion of the first metal plate where the second side surface and the second surface cross each other.

* * * * *